United States Patent
Takeshima et al.

(10) Patent No.: US 6,437,672 B1
(45) Date of Patent: Aug. 20, 2002

(54) SUPERCONDUCTING MAGNETIC DEVICE

(75) Inventors: Hirotaka Takeshima, Ryugasaki; Takao Hommei; Hajime Kawano, both of Hitachinaka; Hiroshi Tazaki; Takeshi Yatsuo, both of Kashiwa; Shigenori Kuroda; Hajime Tanabe, both of Tokyo, all of (JP)

(73) Assignees: Hitachi Medical Corporation; Mitsubishi Denki Kabushiki Kaisha, both of Tokyo (JP)

( * ) Notice: Subject to any disclaimer, the term of this patent is extended or adjusted under 35 U.S.C. 154(b) by 0 days.

(21) Appl. No.: 09/101,048

(22) PCT Filed: Oct. 29, 1997

(86) PCT No.: PCT/JP97/03934

§ 371 (c)(1),
(2), (4) Date: Jun. 29, 1998

(87) PCT Pub. No.: WO98/19317

PCT Pub. Date: May 7, 1998

(30) Foreign Application Priority Data

Oct. 30, 1996 (JP) .............................. 8-303965
Oct. 30, 1996 (JP) .............................. 8-303966
Dec. 26, 1996 (JP) .............................. 8-356387

(51) Int. Cl.[7] .............................................. H01F 6/00
(52) U.S. Cl. ....................... 335/216; 335/296; 335/297; 335/301; 324/319; 324/320

(58) Field of Search ........................ 335/216, 296–306; 324/318–320; 600/410, 421, 422

(56) References Cited

U.S. PATENT DOCUMENTS

| 4,673,882 A | * | 6/1987 | Buford | 324/320 |
| 4,943,774 A | * | 7/1990 | Breneman et al. | 324/318 |
| 5,361,054 A | * | 11/1994 | Knuttel | 335/216 |
| 5,412,363 A | * | 5/1995 | Breneman et al. | 335/216 |

FOREIGN PATENT DOCUMENTS

JP 08050170 A * 2/1996

* cited by examiner

Primary Examiner—Ramon M. Barrera
(74) Attorney, Agent, or Firm—Antonelli, Terry, Stout & Kraus, LLP

(57) ABSTRACT

A superconducting magnet apparatus. By forming one or more holes in each of platelike ferromagnetic substances forming a magnetic shield for focusing the magnetic flux generated by superconducting coils, the flow of lines of magnetic flux is adjusted. Thereby, a static magnetic field in a measurement space is corrected. By disposing coupling tubes for supporting two cooling vessels housing superconducting coils on the rear side with respect to a central axis (Z axis) of the measurement space of the vertical direction, access to the subject is facilitated. In addition, the magnetic shield has an opening portion wider than the superconducting magnet on its side face. After the magnetic shield has been assembled, the superconducting magnet can be inserted from the opening portion.

31 Claims, 37 Drawing Sheets

FIG.20A
FIG.20B
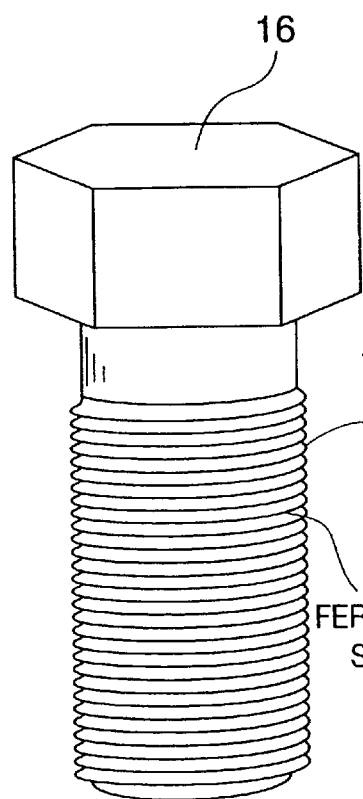
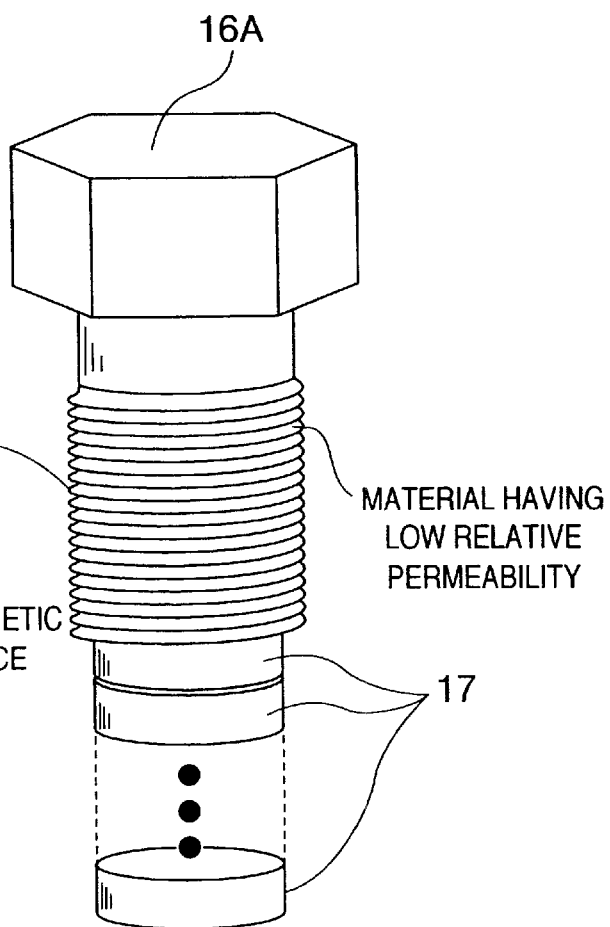

SUPERCONDUCTING MAGNETIC DEVICE

TECHNICAL FIELD

The present invention relates to a static magnetic field generating apparatus used in a magnetic resonance imaging apparatus (hereafter referred to as MRI apparatus) and the like, and in particular to a magnetic field correction means for improving the field homogeneity of the static magnetic field generated by a static magnetic field generating apparatus.

Furthermore, the present invention relates to a superconducting magnet apparatus having a wide opening to provide a subject with feeling of openness and facilitate access to the subject.

Furthermore, the present invention relates to a superconducting magnet apparatus which can be constructed with ease and high precision after it has been carried in a site of use such as a hospital or a clinic.

BACKGROUND ART

In the case of MRI apparatuses, characteristics of the static magnetic field are the most important characteristics exert directly upon the image distortion, image blurredness, and signal-to-noise ratio, and the characteristics of the static magnetic field are the most important characteristics determining the fundamental performance in the MRI apparatus. Therefore, the static magnetic field in an imaging space (also called measurement space) is required to have high homogeneity and high stability of several ppm order. In order to generate a highly homogeneous and highly stable static magnetic field, a static magnetic field generating apparatus is used.

In the static magnetic field generating apparatus, there occurs a problem that a lot of magnetic fields leak outside the apparatus because a high static magnetic field is generated in the imaging space.

In order to reduce the leakage magnetic field, paths of lines of magnetic flux (magnetic path) generated from a magnetic field generating source are formed and the lines of magnetic flux are converged to the magnetic paths. By doing so, it is attempted to reduce the leakage of the magentic field to the outside of the apparatus.

An example of a conventional static magnetic field generating apparatus is shown in FIG. 21. FIG. 21 is an oblique view of the static magnetic field generating apparatus as a whole. In a static magnetic field generating apparatus 1 shown in FIG. 21, a high static magnetic field is generated in an imaging space 2 by static magnetic generating sources 3 disposed above and below the imaging space 2 so as to have the imaging space 2 between. Each of the static magnetic field generating sources 3 is formed by a superconducting coil 4 and a cooling vessel 5 for cooling the superconducting coil to a superconducting state. Magnetic circuits are formed so that lines Bz of magnetic flux generated in the vertical direction by the upper and lower superconducting coils 4 will be caught by platelike ferromagnetic substances 6 disposed above and below the static magnetic field generating sources 3 and returned to the superconducting coils 4 by using pillarlike ferromagnetic substances 7 disposed at the sides of the static magnetic field generating sources 3 as return paths. The pillarlike ferromagnetic substances 7 not only serve as the return paths of the lines of magnetic flux but also function to mechanically support structural components disposed above and below the imaging space 2. As materials of the platelike ferromagnetic substances 6 and the pillarlike ferromagnetic substances 7, iron is typically used from the viewpoint of the mechanical strength and cost price.

In the conventional static magnetic field generating apparatus of the horizontal magnetic field scheme, the magnetic circuits take the shape of a solenoid and the return paths are disposed symmetrically. Therefore, magnetic moments of the pillarlike portions are also uniform in the circumferential direction. In the case of the magnetic circuits having the return paths formed by the pillarlike ferromagnetic substances 7, however, distribution of the lines of magnetic flux in directions having the pillarlike ferromagnetic substance 7 differs from that in directions having no pillarlike ferromagnetic substance 7. Therefore, the magnetic field distribution in the circumferential direction varies. As a result, the static magnetic field in the imaging space 2 becomes inhomogeneous because of this variation of the magnetic field distribution in the circumferential direction. From the stage of design, therefore, correction of the inhomogeneous magnetic field components is considered. In the example of the conventional technique shown in FIG. 21, ferromagnetic substance pieces 8 are disposed on the surface of each of the cooling vessels 5 to conduct the magnetic field correction.

As a method for evaluating the magnetic field homogeneity, there is well known a method of determining a measuring point on a spherical surface to be evaluated in the static magnetic field, expanding the value of the magnetic field at the measuring point with the Legendre functions $P_n m(\cos \theta)$ as shown in equation (1).

$$B_Z = \sum_{n=0}^{\infty} \sum_{m=0}^{n} r^n P_n^m(\cos\theta) |A(m, n)\cos m\phi + B(m, n)\sin m\phi| \qquad (1)$$

where (r, θ, φ) means a spherical coordinate system, r a distance from the coordinate center, θ an angle formed with respect to the Z axis, and φ a rotation angle taken with center on the Z axis. Bz is a Z direction component magnetic flux density.

The smaller the value of the term A(m, n) in the equation (1) becomes as compared with the value of the static magnetic field term A(0, 0), the better the magnetic field homogeneity becomes. Hereafter, "the ratio of the coefficient of each expansion term to the term A(0, 0)" is referred to as expansion coefficient ratio.

Components generated from the equation (1) can be broadly classified into "axisymmetrical components" and "unaxisymmetrical components." The axisymmetrical components are magnetic field components which are symmetrical with respect to the Z axis (the static magnetic field direction). The axisymmetrical components depend on only the coordinates of (r, θ). Mathematically, the axisymmetrical components are terms of the Legendre functions with m=0. The unaxisymmetrical components depend on all coordinates of (r, θ, φ). The unaxisymmetrical components are terms of the Legendre functions with m≠0.

Typically as means for correcting the magnetic field homogeneity of the static magnetic field, ferromagnetic substance pieces (hereafter referred to as iron pieces because of use of iron) 8 are disposed on an opposed surface of opposed cooling vessels. The positions of the iron pieces 8 are determined so as to cancel the inhomogeneous magnetic field components. The greater the inhomogeneous magnetic field components are, therefore, the more amount of the iron pieces 8, i.e., the wider region for accommodating the iron pieces 8 is needed. As a result, the region (clear bore) for accommodating gradient magnetic coils (GCs) and a high frequency coil (RF coil) cannot be utilized effectively.

As a countermeasure against this, it is also conceivable to increase the region accommodating the iron pieces 8 by widening the distance between the opposed cooling vessels 5. If the distance between the opposed cooling vessels 5 is widened, however, the distance between opposed superconducting coils 4 is also increased. If the distance between opposed superconducting coils 4 is increased, magnetomotive force for generating a desired static magnetic field intensity increases in proportion to the third to fifth power of the distance. The increase in the magnetomotive force causes a complicated mechanical structure and an increased cost, resulting in a serious problem.

As heretofore described, the conventional magnetic field generating apparatus had a problem that an attempt to correct the inhomogeneous magnetic field in the static magnetic field caused an increased region for correction, an increased size of external shape of the apparatus, and an increased manufacturing cost.

An object of the present invention is to provide such a static magnetic field generating apparatus that the total weight of the iron pieces for correcting the static magnetic field and the region accommodating the iron pieces are confined to the minimum and the magnetic field homogeneity is favorable.

Furthermore, in the present invention, the contrivance for facilitating access to the subject is also made.

In the conventionally used static magnetic generating apparatus of the horizontal magnetic field scheme taking the shape of a cylinder, a measurement space accommodating the subject for imaging is narrow and is surrounded in circumference, and consequently the subject is provided with the feeling of blockade. Sometimes, therefore, the subject refused to enter the apparatus. Furthermore, it was also difficult for an inspector to access the subject from the outside of the apparatus.

As a technique for avoiding the above described problem, a superconducting magnet apparatus having a configuration shown in FIGS. 22 and 23 is publicly known. The magnet of an example of the conventional technique is disclosed in U.S. Pat. No. 5,194,810. The magnetic field in the vertical direction is generated by superconducting coils 4 disposed in coolant vessels disposed above and below. As for the coolant vessels, outside vacuum vessels 31 are shown in FIGS. 22 and 23. Inside this superconducting coil 4, magnetic field homogenizing means 32 formed by a ferromagnetic substance is provided in order to obtain favorable magnetic field homogeneity. In addition, iron plates 33 and iron yokes 34 are provided as the return paths for the magnetic flux generated by the upper and lower superconducting coils 4. Furthermore, the iron yokes 34 not only serve as the paths of the magnetic flux but also function to support the upper and lower structural substances.

In this example, the subject has no feeling of blockade because of openness on four sides. The inspector can also access the subject easily. Furthermore, since the iron yokes 34 provide the return paths of the magnetic flux, the magnetic flux does not spread far away and the magnetic field leakage can be reduced.

On the other hand, iron used as the magnetic field homogenizing means 32 has a hysteresis characteristic with respect to the magnetic field. Therefore, the pulsative magnetic field generated by the gradient magnetic field coils (not illustrated) disposed near the magnetic field homogenizing means 32 exerts an influence upon the magnetic field distribution of the magnetic field homogenizing means 32. Since this influences even the magnetic field distribution inside the homogeneous magnetic field generation region 2, there is a possibility of high precision signal measurement being hindered. Against this, means such as use of a material having low electric conductivity for the magnetic field homogenizing means 32 has been adopted. In the case where the intensity of the pulsative magnetic field is intense, however, a sufficient effect cannot be obtained.

Furthermore, the magnetization characteristic (B-H characteristic) has dependency upon the temperature. If the temperature of iron varies, therefore, it becomes a factor of a variation of the magnetic field homogeneity which is an important factor for the MRI apparatus. In the structure of FIG. 23, it is typical to install the gradient magnetic field coils near the magnetic field homogenizing means 32. Since the magnetic field homogenizing means 32 is heated by heat generated by driving the gradient magnetic field coils, its temperature is apt to vary.

As an example of a configuration eliminating the problems of the above described example of the conventional technique, a structure shown in FIGS. 24 and 25 has been proposed. This structure has been proposed in JP-A-8-19503 (PCT/JP94/00039). FIG. 24 is an oblique view of a superconducting magnetic apparatus as a whole. FIG. 25 is a longitudinal section view thereof. Supposing a NbTi wire material usually often used as a coil wire material, a coolant vessel 35 storing liquid helium is provided in order to cool the superconducting coil 4. Above and below a homogeneous magnetic field generation region 2 located in the center of the apparatus, circular superconducting coils 4 are disposed symmetrically in the vertical direction. According to them, cylindrical cooling vessels 36 each containing a cooling vessel 35 and a vacuum vessel 31 are disposed symmetrically in the vertical direction, and are held by coupling tubes 37 located between them so as to keep a predetermined distance between them.

In this example of the conventional technique, there is provided such a structure as to effectively reduce the leakage magnetic field generated outside the apparatus by the above described superconducting coils 4 by using ferromagnetic substances arranged in the peripheral part of the apparatus. In other words, the periphery of each of the cooling vessels 36 is surrounded by an iron container 40 formed by a circular iron plate 38 and an iron cylinder 39 as shown in FIG. 25. The upper and lower iron container 40 are connected by iron columns 41. Thereby, a magnetic path for the magnetic flux generated outside the apparatus is formed. Therefore, it is possible to prevent the leakage magnetic field from spreading far away.

On the other hand, in this structure, the iron columns 41 and the coupling tubes 37 are present in the transverse direction with respect to the homogeneous magnetic field generation region 2 serving as the measurement space. Therefore, there is a problem that the access to the subject from the outside of the apparatus is difficult. Furthermore, there is a problem that the subject feels oppression because the subject is in the magnet and the view in the transverse direction is obstructed.

As for the configuration of an MRI apparatus facilitating the inspector's access to the subject from the flank of the magnet, there is a configuration disclosed in JP-A-8-50170. In this magnet, permanent magnets 50 are disposed above and below a homogeneous magnetic field generation region 2 as shown in FIG. 26. In order to support the permanent magnets 50 and form a magnetic path 51 serving as the return path of the magnetic flux generated by the permanent magnets 50, platelike first yokes 52 and columnar second yokes 53 are provided. The columnar second yokes 53 are disposed on the rear side with respect to the homogeneous magnetic field generation region 2. As a result, an opened measurement space (homogeneous magnetic field generation region) 2 is formed frontward. In this configuration, the subject is released from the feeling of oppression and the inspector's access to the subject from the outside of the apparatus is facilitated.

In this magnet, however, the permanent magnets 50 are used. This results in a problem that it is difficult to increase the magnetic field intensity in the homogeneous magnetic field generation region 2, and, in the case of high magnetic field, it is also difficult to decrease the magnetic field leakage outside the apparatus.

As described above, it was impossible to access the subject from the flank of the magnet in the conventional static magnetic field generating apparatus in which the magnetic field in the vertical direction was applied to the subject and magnetic shielding was effected. Therefore, giving treatment to the subject and coping with the IVMR (Interventional MR) vigorously developed in recent years were also difficult.

An MRI apparatus using permanent magnets facilitating the access to the subject has been proposed. In this MRI apparatus, however, it is difficult to achieve a high magnetic field and it is necessary to further improve the magnetic field intensity to realize a high picture quality.

Therefore, an object of the present invention is to provide a static magnetic generating apparatus capable of solving the above described problems, making it possible to access the subject from the flank of the magnet, lightening the feeling of oppression of the subject, and applying a magnetic field of high intensity to the subject in the vertical direction.

Furthermore, in the present invention, such a contrivance as to facilitate the carrying in and installation of superconducting magnets has been made.

FIG. 22 shows an example of a superconducting magnet apparatus for MRI apparatus using a magnetic shield made of iron. As the magnetic field intensity is increased, however, the superconducting magnet apparatus for MRI apparatus having such a structure tends to become large in size and weight. In order to supply a superconducting magnet apparatus to a hospital or the like, therefore, it is necessary to first disassemble the apparatus in the factory so far as it can be disassembled and assemble the apparatus on the spot. Or it is necessary to, for example, enlarge or rebuild a building so as to be suitable for assembly and installation of the superconducting magnet apparatus, or dividing the superconducting magnet apparatus into components to such a degree that the components can pass the entrance and passages of the building, carrying the components in the building, and then assembling the apparatus in a shield room. From the viewpoint of the cost, the latter cited divided carrying in and assembly becomes more favorable. In the case where the divided carrying in and assembly method has been adopted, easiness of the carrying in, easiness of the assembly, and high assembly precision are demanded.

Considering the carrying in and assemble method for the above described conventional apparatuses supposing this demand, First of all, the space between the iron yokes 34 is narrower than the diameter of the superconducting magnet. After the magnetic shield has been assembled, therefore, it is impossible to insert the superconducting magnets from the transverse direction. At the time of assembly of the apparatus, therefore, there are conceivable methods such as (a) a method of assembling the lower iron plate 33, placing the superconducting magnets thereon, and then putting the iron yokes 34 and the upper iron plate 33 together, or (b) a method of putting the lower iron plate 33 and the iron yokes 34, inserting the superconducting magnets from the top, and placing the upper iron plate 33.

Furthermore, in this example of the conventional technique, the annular magnetic field homogenizing means 32 is fixed to such a face of the iron plate 33 of the magnetic shield as to be opposed to the measurement space 2 for the purpose of correcting the magnitude field distribution in the measurement space 2. After inserting the superconducting magnets in the magnetic shield and fixing the superconducting magnets, therefore, these magnetic field homogenizing means 32 must be fixed, resulting in a very poor work efficiency.

For carrying the large-sized and heavy superconducting magnet apparatus for MRI apparatus in the place of use such as a hospital, it is necessary to manufacture the apparatus divisionally and assemble the apparatus on the spot as described with reference to the aforementioned conventional technique. Even if the magnetic shield is divided into several parts in the divisional carrying in and on-the-spot assembling method, however, it was necessary to assemble the magnetic shield, incorporate the superconducting magnets in the magnetic shield, and thereafter put the upper iron plate 33 or the iron yokes 34. Assembly using this method is not an easy work for the magnetic shield made large in size. In parallel to assembling of the superconducting magnets each having a weak strength, the heavy magnetic shield must be assembled. Furthermore, in the case where the superconducting magnet is divided and assembled on the spot, the reproducibility of the magnetic field adjustment in the factory is not maintained and fine adjustments were needed on the spot.

In order to solve such problems, an object of the present invention is to provide such a superconducting magnet apparatus that the yoke portions of the magnetic shield are divided into small components and after the magnetic shield is assembled on the spot the superconducting magnets can be easily incorporated therein.

DISCLOSURE OF INVENTION

In order to achieve the above described object of improving the magnetic field homogeneity of the static magnetic field, a static magnetic field generating apparatus including static magnetic field generating sources for generating a static magnetic field of a first direction in a finite region, a pair of magnetic flux converging means disposed so as to nearly perpendicular to the first direction to converge the lines of magnetic flux generated by the static magnetic field generating sources, and at least one magnetic flux passing means for magnetically coupling the pair of magnetic flux converging means and forming a magnetic path letting flow the lines of magnetic flux has such a configuration according to the present invention that magnetic field correcting means for effecting a magnetic field correction of the static magnetic field of the finite region is provided in a portion of the magnetic flux converging means, and the magnetic field correcting means has one or more portions filled with a material of a low relative permeability and/or one or more air gap holes.

In this configuration, portions filled with a material of a low relative permeability and/or air gap holes serving as the magnetic field correcting means are provided in a part of the magnetic flux converging means. Thereby, the flow of the lines of magnetic flux in the magnetic flux converging means is changed. As a result, the static magnetic field in the finite region serving as the imaging space is subject to the magnetic field correction.

Furthermore, in the static magnetic field generating apparatus of the present invention, the portions filled with the material of the low relative permeability or air gap holes are circular, and are disposed nearly in a central portion of the magnetic flux converging means nearly along the first direction.

In this configuration, the magnetic field correcting means are circular. This brings about effects of fine workability, cost reduction, and a large correction effect.

Furthermore, in the static magnetic field generating apparatus of the present invention, the portions filled with the material of the low relative permeability or air gap holes are elliptical or rectangular, and are disposed nearly in a central portion of the magnetic flux converging means nearly along the first direction. Furthermore, the magnetic flux passing means are disposed on the left side and the right side with respect to the central axis running parallel with the first direction of the static magnetic field generating sources, and a longitudinal direction of the elliptical or rectangular portions or air gap holes is nearly made parallel to a direction of presence of the magnetic flux passing means.

In this configuration, the magnetic field correcting means are elliptical or rectangular, and their longitudinal direction is parallel to the side of presence of the magnetic flux passing means. Therefore, the change of flow of the lines of magnetic flow is large, and the magnetic correction effect is large.

Furthermore, in the static magnetic field generating apparatus of the present invention, a plurality of portions filled with the material of the low relative permeability and/or air gap holes are disposed in positions radially located away from a central axis, the central axis passing through a center of the static magnetic field and being parallel to the first direction. Furthermore, the portions filled with the material of the low relative permeability and/or air gap holes are fan-shaped or circular, or disposed in positions symmetrical with respect to the central axis.

In this configuration, the magnetic field correcting means are disposed in positions radially located away from the central axis. Therefore, it is effective in local magnetic field correction. Furthermore, providing a plurality of magnetic field correcting means in symmetrical positions makes possible a large magnetic field correction.

Furthermore, in the static magnetic field generating apparatus of the present invention, one or more out of the air gap holes are tapped holes, and bolts each formed entirely or partially by a ferromagnetic substance are inserted into one or more of the tapped holes.

In this configuration, a bolt made of a ferromagnetic substance is inserted into each of the tapped holes serving as the magnetic field correcting means. The magnetic field correction is conducted by adjusting the quantity of the ferromagnetic substance present in the tapped hole portion. Fine adjustment of the magnetic field thus becomes possible. If the quantity of the ferromagnetic substance is increased, the correction quantity of the magnetic field becomes large. If the quantity of the ferromagnetic substance is decreased, the correction quantity of the magnetic field becomes small.

Furthermore, in the static magnetic field generating apparatus of the present invention, the portions filled with the material of the low relative permeability and/or air gaps are subject to working for changing the area of the section, such as taper working or step working, in the depth direction.

In this configuration, the taper working or step working is conducted. As compared with the case of simple holes or the like, therefore, magnetic field correction having a larger adjustment width can be effected.

Furthermore, in the static magnetic field generating apparatus of the present invention, the diameter of the circular portions, the major diameter and minor diameter of the elliptical or rectangular portions, the number, positions, and size of the portions filled with the material of the low relative permeability and/or the air gap holes, the number and positions of the tapped holes, the quantity of a ferromagnetic substance inserted into the tapped holes, and the area of the section of the taper working portion or step working portion are determined so as to be related to the flow of lines of magnetic flux in the magnetic flux converging means.

The change of the above described parameters of the magnetic field correcting means causes a change of the flow of the lines of magnetic flux in the magnetic flux converging means and consequently the magnetic field correction of the static magnetic field is conducted. In view of this fact, the above described parameters are determined, in this configuration, so as to be related to the flow of lines of magnetic flux in the magnetic flux converging means.

Furthermore, the static magnetic field generating apparatus of the present invention uses a superconductor as current carrying means, and uses a cooling vessel containing a coolant for cooling the superconductor to a superconducting state and maintaining the superconductor in the superconducting state, and includes a refrigerator for cooling the coolant. Furthermore, the refrigerator is disposed in the portion filled with the material of the low relative permeability or in an air gap hole.

In this configuration, a static magnetic field of high intensity and high homogeneity is implemented by using static magnetic field generating sources of a superconducting system. In addition, the magnetic correcting means is used efficiently as a place for attaching the refrigerator.

A magnetic resonance imaging apparatus of the present invention uses the above described static magnetic field generating apparatus of the present invention.

According to the present invention, the magnetic field correction of the static magnetic field in the imaging space can be conducted on the platelike ferromagnetic substance as heretofore described. Therefore, it is possible to decrease sharply the quantity and disposition area of the iron pieces disposed near the imaging space to correct the magnetic field and keep them at the minimum. In addition, the homogeneity of the magnetic field can also be improved. As a result, a static magnetic field generating apparatus having a wide imaging space and a favorable magnetic field homogeneity can be provided.

In order to achieve the above described object of facilitating the access to the subject, a superconducting magnet apparatus including static magnetic field generating sources for letting flow a current to generate a homogeneous magnetic field of a vertical direction in a finite region, the static magnetic field generating sources being formed by a material having superconducting characteristics, cooling means for cooling the static magnetic field generating sources to such a temperature that superconducting characteristics are exhibited and keeping the static magnetic field generating sources at the temperature, and support means for supporting the static magnetic field generating sources, wherein the static magnetic field generating sources are formed by two sets of magnetic field generating means having nearly same shape disposed in positions located at nearly equal distances from a center of the homogeneous magnetic field generation region along the vertical direction with the homogeneous magnetic field generation region between, has such a configuration in accordance with the present invention that the support means are disposed on the rear side with respect to the central axis of the vertical direction passing the center of the homogeneous magnetic field generation region.

In this configuration, the magnetic field generating sources are disposed so as to be opposed to each other in the vertical direction, and the support means for supporting the magnetic field generating sources are disposed on the rear side with respect to the central axis of the homogeneous magnetic field generation region. Therefore, a high magnetic field can be generated in the homogeneous magnetic field generation region. In addition, the front and flanks of the homogeneous magnetic field generation region serving as the measurement space are open. Therefore, the inspector can easily access the subject from a side of the apparatus.

Furthermore, the static magnetic field generating apparatus of the present invention includes first ferromagnetic substances respectively surrounding peripheries of the magnetic field generating sources, and second ferromagnetic substances for magnetically connecting the first ferromagnetic substances. The second ferromagnetic substances have both ends located in nearly the same positions as those of the first ferromagnetic substances. The second ferromagnetic substances are disposed so as to be located on the rear side with respect to the central axis of the vertical direction together with the support means.

In this configuration, the first ferromagnetic substances are disposed around the magnetic field generating sources, and the first ferromagnetic substances are magnetically coupled by the second ferromagnetic substances. Thereby, an external magnetic path (return path) of the magnetic flux generated by the magnetic field generating sources is formed. The leakage magnetic field in the outside of the apparatus is thus reduced. Furthermore, the second ferromagnetic substances are disposed on the rear side with respect to the central axis of the homogeneous magnetic field generation region in the same way as the support means of the magnetic field generating sources. Therefore, the inspector can easily access the subject from a side of the apparatus.

Furthermore, in a preferred aspect of a superconducting magnet apparatus according to the present invention, the support means have a nearly circular section shape, and the support means are disposed so that at least one support means will be present on each of left and right sides with respect to the central axis of the vertical direction. Furthermore, the support means are disposed so that two or more support means will be located on each of left and right sides with respect to the central axis of the vertical direction, and the distance between support means included in the support means and disposed on the rear side with respect to the central axis is shorter than the distance between support means included in the support means and disposed on the front side with respect to the central axis.

Furthermore, in a preferred aspect of a superconducting magnet apparatus according to the present invention, the support means have a nearly rectangular or elliptical section shape, and the support means are disposed so that at least one support means will be present on each of left and right sides with respect to the central axis of the vertical direction.

Furthermore, in a preferred aspect of a superconducting magnet apparatus according to the present invention, a viewing angle viewing the support means when viewed from the central axis of the vertical direction is smaller than a viewing angle viewing the second ferromagnetic substance when viewed from the central axis of the vertical direction. More preferably, a viewing angle viewing the support means located on the left side or the right side as a whole when viewed from the central axis of the vertical direction is 60 degrees or less.

Furthermore, in a preferred aspect of a superconducting magnet apparatus according to the present invention, the shortest distance between the support means disposed on the left side with respect to the central axis of the vertical direction and the support means disposed on the right side with respect to the central axis of the vertical direction is at least 600 mm.

Furthermore, in a preferred aspect of a superconducting magnet apparatus according to the present invention, the second ferromagnetic substances are disposed in nearly the same positions in the peripheral direction as the support means with respect to the central axis of the vertical direction. Furthermore, faces of the second ferromagnetic substances opposed to the support means are formed so as to be nearly flat. Furthermore, the flat face of each of the second ferromagnetic substances is nearly perpendicular to the line coupling the central axis of the vertical direction to the central axis of the second ferromagnetic substance. Furthermore, at least one auxiliary iron member is added to the flat faces formed on the second ferromagnetic substances.

Furthermore, in a preferred aspect of a superconducting magnet apparatus according to the present invention, the support means and the second ferromagnetic substances are disposed so that a line touching a periphery of support means included in the support means disposed on the left side and on the right side with respect to the central axis of the vertical direction and located on the most front side at one point will be located in a position more rear than a line touching a periphery of a second ferromagnetic substance included in the ferromagnetic substances disposed in the same way and located on the most front side at one point.

Furthermore, in a preferred aspect of a superconducting magnet apparatus according to the present invention, two faces included in peripheral faces of each of the second ferromagnetic substances are formed so as to be nearly parallel to two tangential lines drawn from the central axis of the vertical direction to the peripheral faces of the second ferromagnetic substance.

Furthermore, in a preferred aspect of a superconducting magnet apparatus according to the present invention, covers each containing the support means and the second ferromagnetic substance are provided.

Furthermore, in the present invention, a static magnetic field generating apparatus having the above described configuration is used as a static magnetic field generating apparatus of an MRI apparatus.

By forming a static magnetic field generating apparatus as described above, it becomes possible as heretofore described to provide a static magnetic field generating apparatus which allows accessing the subject accommodated in the measurement space from a side of the apparatus, which mitigates the feeling of oppression of the subject, and which applies a high magnetic field to the subject in the vertical direction.

In order to achieve the above described object of achieving carrying in and installation, a superconducting magnet apparatus of the present invention including a combination of a superconducting magnet and a magnetic shield, the superconducting magnet including a static magnetic field generating source for generating a homogeneous magnetic field of a vertical direction in a finite region, the static magnetic field generating source being formed by a material having superconducting characteristics, cooling means for housing the static magnetic field generating source, cooling the static magnetic field generating source to such a temperature that superconducting characteristics are exhibited and keeping the static magnetic field generating source at the temperature, support means for supporting the static magnetic field generating sources, the magnetic shield being formed by platelike ferromagnetic substances disposed above and below the superconducting magnet so as to surround the periphery of the superconducting magnet, and a plurality of columnar ferromagnetic substances for magnetically coupling and supporting the platelike ferromagnetic substances, has such a structure that the magnetic shield has at least one opening portion wider than the superconducting magnet. After assembling the magnetic shield, therefore, the superconducting magnet can be inserted into the magnetic shield and incorporated therein.

In this configuration, a superconducting magnet apparatus is formed by a superconducting magnet and a magnetic shield. After the magnetic shield has been assembled, the superconducting magnet can be inserted into the magnetic shield and incorporated therein. In the case where the superconducting magnet apparatus is to be supplied to a hospital or the like, therefore, it is possible to assemble and adjust the superconducting magnet apparatus in a factory, then disassemble the superconducting magnet apparatus into the superconducting magnet and the components of the magnetic shield, carry them to the site, thereafter assemble the magnetic shield, insert the superconducting magnet into the magnetic shield, and assemble and adjust the entire apparatus. As a result, divisional carrying in and on-the-spot assembling become possible, and the cost can also be reduced.

Furthermore, in a superconducting apparatus of the present invention, the columnar ferromagnetic substances are disposed so as not to overlie an insertion locus of the superconducting magnet obtained when inserting the superconducting magnet into the magnetic shield. In this configuration, there is no columnar ferromagnetic substance on the path for inserting the superconducting magnet into the magnetic shield. As a result, the superconducting magnet can be smoothly inserted.

Furthermore, in a superconducting apparatus of the present invention, the space between at least two columnar ferromagnetic substances included in the above described columnar ferromagnetic substances is equal to at least such a dimension that the superconducting magnet can be inserted into the magnetic shield. In this configuration, the superconducting magnet can be inserted into the magnetic shield through a space between two columnar ferromagnetic substances of the magnetic shield.

Furthermore, in a superconducting apparatus of the present invention, guide means for inserting the superconducting magnet into the magnetic shield is provided on contact faces of the superconducting magnet and the magnetic shield in the insertion direction of the superconducting magnet. In this configuration, the guide means for inserting the superconducting magnet into the magnetic shield is provided on contact faces of the superconducting magnet and the magnetic shield. By using the guide means, therefore, the superconducting magnet can be inserted into a proper position in the magnetic shield.

In an aspect of the guide means, convex/concave faces fitting in with those of another contact face are provided parallel to the insertion direction of the superconducting magnet. Furthermore, in another aspect of the guide means, one or more grooves are provided on one or both of the contact faces of the superconducting magnet and the magnetic shield so as to be parallel to the insertion direction of the superconducting magnet.

Furthermore, in a superconducting magnet apparatus of the present invention, the superconducting magnet is inserted into the magnetic shield, and thereafter each of the grooves is filled up by a solid or liquid substance containing a ferromagnetic substance. In this configuration, each of the grooves which were used as the guide means for insertion of the superconducting magnet is filled up by a solid or liquid substance containing a ferromagnetic substance. As a result, the close adherence between the superconducting magnet and the magnetic shield is improved, and the correction of the magnetic field distribution in the measurement space can be conducted.

Furthermore, in a superconducting magnet apparatus of the present invention, one or more gap portions are provided in a contact portion between the superconducting magnet and the magnetic shield, and a solid or liquid substance containing a ferromagnetic substance is disposed in the gap portions. In the case of this configuration as well, there is obtained an effect similar to that obtained in the case where each of the grooves is filled up by a solid or liquid substance containing a ferromagnetic substance.

Furthermore, in a superconducting magnet apparatus of the present invention, a ferromagnetic piece for magnetic field distribution correction is added to a portion of the superconducting magnet touching the magnetic shield so as to be integral with the superconducting magnet, and the superconducting magnet with the ferromagnetic piece added thereto is inserted into the magnetic shield. In this configuration, the ferromagnetic piece for magnetic field distribution correction can be added to the superconducting magnet beforehand, and a resultant integrated superconducting magnet can be incorporated into the magnetic shield. As a result, the on-the-spot assembling and adjustment for magnetic field distribution correction are facilitated.

Furthermore, in the present invention, the superconducting magnet apparatus having the above described configuration is used as the superconducting magnet apparatus of a MRI apparatus.

As heretofore described, it becomes possible according to the present invention to reduce the labor required for assembling and adjustment work at the time of supply of a superconducting magnet apparatus for MRI apparatus, reduce the manufacturing cost owing to the simplified structure, and provide a superconducting magnet apparatus for MRI apparatus improved in magnetic field homogeneity by utilizing the gap between the superconducting magnet and the magnetic shield.

BRIEF DESCRIPTION OF DRAWINGS

FIGS. 20A and 20B are diagrams showing examples of a bolt applied to the embodiment of FIG. 18;

BEST MODES FOR CARRYING OUT THE INVENTION

Hereafter, embodiments of the present invention will be described concretely by referring to accompanying drawing.

Figure 1:
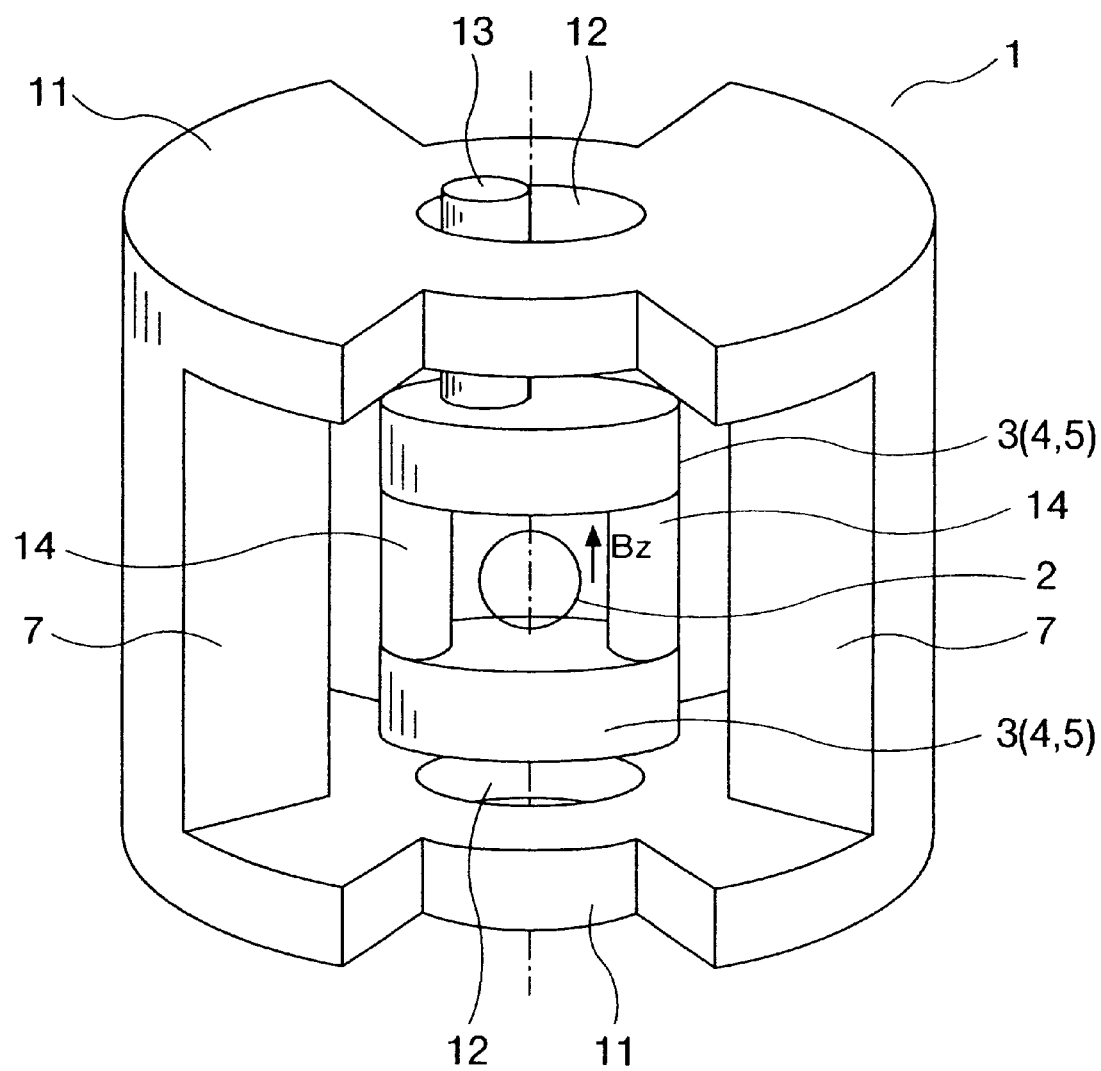
FIG. 1 is an entire oblique view of an embodiment of a static magnetic field generating apparatus according to the present invention.
Figure 2:
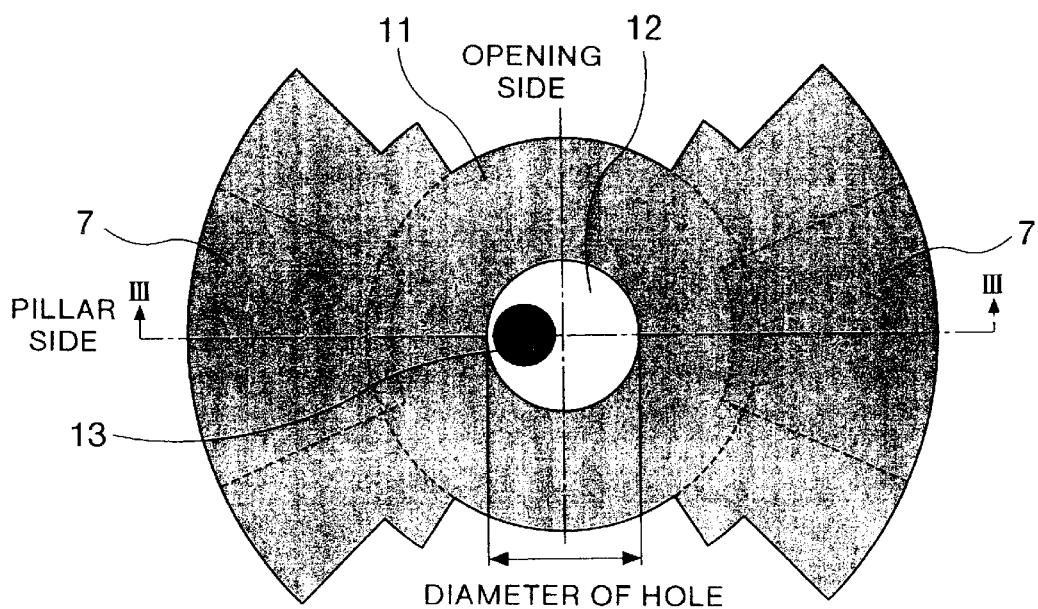
FIG. 2 is a top view of the embodiment of FIG. 1.
Figure 3:
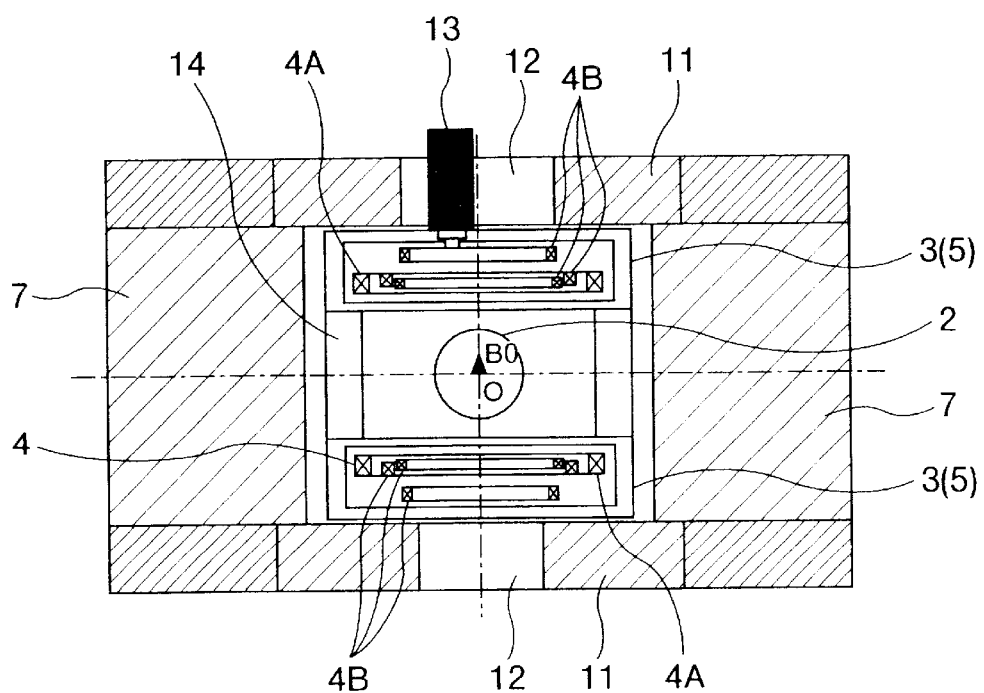
FIG. 3 is a longitudinal section view of the embodiment of FIG. 1.

An embodiment of a static magnetic field generating apparatus generating a homogeneous static magnetic field is shown in FIGS. 1 to 3. FIG. 1 is its entire oblique view. FIG. 2 is its top view. FIG. 3 is its longitudinal section view. A static magnetic field generating apparatus (superconducting magnetic apparatus) 1 of the present embodiment has superconducting magnets of the vertical magnet field system. First of all, static magnetic field generating sources (superconducting magnets) 3 incorporating superconducting coils 4 for generating a static magnetic field in an imaging space 2 are disposed above and below the imaging space 2 so as to be opposed to each other. Each of the superconducting coils 4 is held in a cooling vessel 5, and cooled to such a temperature that a predetermined superconducting characteristic is obtained. The superconducting coil 4 is typically formed by a combination of a plurality of coils, and held in the cooling vessel 5 by a support. For brevity, however, the support is omitted in the drawing. As the material of the superconducting coils 4, a NbTi wire material is used in many cases. Therefore, the cooling vessel 5 includes a coolant vessel for storing liquid helium serving as coolant. Besides, the cooling vessel 5 includes a vacuum vessel incorporating the entire coolant vessel in order to prevent the convection of heat, and a thermal shield (not illustrated) for preventing the radiation of heat. The superconducting coil 4 is used in such a state that it is housed in this cooling vessel 5.

The superconducting coils 4 each formed by a plurality of circular coils are disposed symmetrically in the vertical direction with an imaging space 2 serving as a homogeneous magnetic field generation region located in the central part of the apparatus between. As for the cooling vessels 5 housing the superconducting coils 4 as well, the cooling vessels 5 each taking the shape of a cylinder are disposed so as to be symmetric in the vertical direction. The upper and lower cooling vessels 5 are supported so as to keep a predetermined distance by coupling tubes 14 located between them. The coupling tubes 14 function to mechanically support the upper and lower cooling vessels 5. As occasion demands, however, the coupling tubes 14 are provided with the function of thermally coupling the upper and lower coolant vessels. By doing so, it becomes unnecessary to install one upper refrigerator 13 and one lower refrigerator 13 and it becomes possible to make do with one refrigerator 13 per system. Furthermore, it is not necessary to limit the number of the coupling tubes 14 to two as illustrated, but the number of the coupling tubes may be increased to a larger number such as three or four. In order to obtain the feeling of opening, one cantilever coupling tube 14 may be used.

The static field generating sources 3 are fixed to a surrounding magnetic shield substance by supports (not illustrated).

In FIG. 3, the superconducting coil 4 is formed by a set of four coils. Its function is to generate a static magnetic field having high intension and high homogeneity in the imaging space 2 located in the center of the apparatus. A main static magnetic field is generated by a superconducting coil having a largest coil section (hereafter referred to as main coil) 4A. Disposition and magnetomotive force of coils are set so that the homogeneity of the magnetic field may be obtained by superconducting coils having smaller coil sections (hereafter referred to as adjustment coils) 4B. As for the sense of current of the adjustment coils 4B, the sense of current of each adjustment coil may be determined according to the inhomogeneous components of the magnetic field generated by the main coil 4A, and it need not be limited to a fixed direction. Furthermore, the number of coils included in the superconducting coil 4 is not limited to four as illustrated, but is determined so as to become optimum in trade-off between the inhomogeneous components of the magnetic field and the manufacturing cost. As the diameter of the main coil 4A becomes larger, the inhomogeneous magnetic field components are reduced and consequently the number or magnetomotive force of the adjustment coils 4B can be reduced.

In the same way as the case of the examples of the conventional technique, the leakage magnetic field occurring outside the apparatus is effectively reduced by platelike ferromagnetic substances 11 and pillarlike ferromagnetic substances 7. In addition, in the present embodiment, a circular hole 12 is formed through the central part of the platelike ferromagnetic substance 11 in the vertical direction. This hole 12 is provided for the magnetic field correction of the static magnetic field in the imaging space 2. By providing this hole 12, the magnetic flux density distribution in the platelike ferromagnetic substance 11 changes, and consequently the magnetic field distribution in the imaging space 2 changes. By changing the diameter of this hole 12, therefore, the magnetic field distribution of the static magnetic field in the imaging space 2 can be adjusted.

As described hereafter, this hole 12 functions in the same way as the adjustment coils 4B included in the superconducting coil 4 so as to let flow a current opposite to that of the main coil 4A. In order to confirm the function of this hole 12, the present inventors bored a circular hole 12 in the center of each of the platelike ferromagnetic substances 11, and effected an analysis in the case where the hole diameter was changed in the range of 364 to 900 mm.

As for the method of evaluating the inhomogeneous magnetic field in the static magnetic field, it was decided to assume a sphere having a radius of 22.5 cm as the imaging space, calculate the magnetic field intensity at evaluation points on the surface of this sphere and inside the sphere (where surfaces of 12 layers are set), expanding a result by using the Legendle functions (see the equation (1)), and deriving an evaluated value.

As expansion coefficient ratios $C(m, n)$ ($=A(m, n)/A(0, 0)$ or $B(m, n)/A(0, 0)$) to be evaluated, those of the following terms were selected.

Figure 5A:
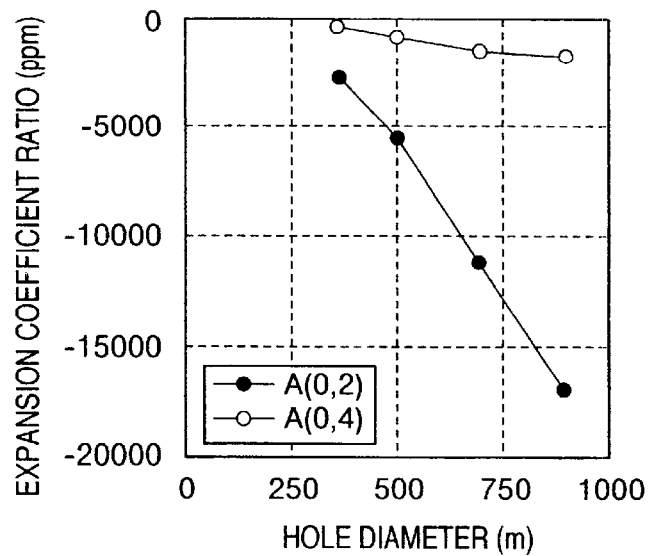
FIGS. 5A, 5B and 5C are diagrams showing a magnetic field correction effect obtained by circular holes of the embodiment of FIG. 1.
Figure 5B:
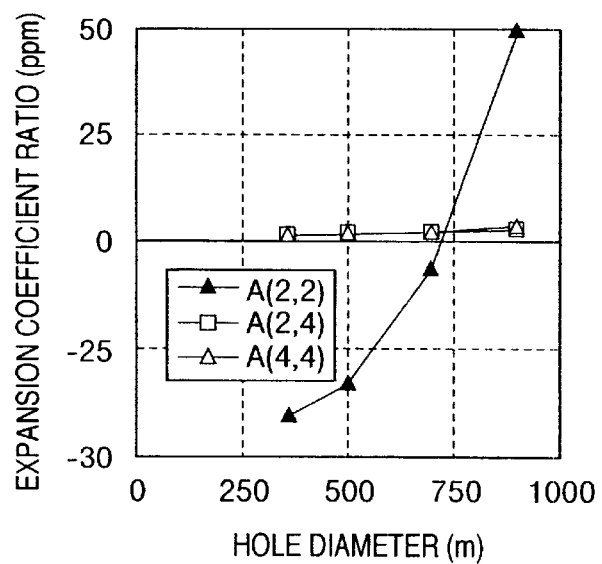
Figure 5C:
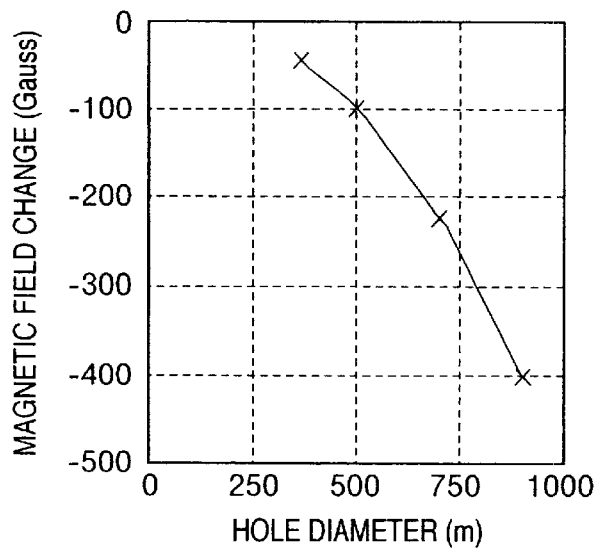

Axisymmetrical components:
$A(0, 2)$ term and $A(0, 4)$ term
Unaxisymmetrical components:
$A(2, 2)$ term, $A(2, 4)$ term, and $A(4, 4)$ term
Static magnetic field components:
$A(0, 0)$ term In order to clarify the effect of the holes 12, difference values for a model having no holes 12 were plotted as graphs as shown in FIGS. 5A to 5C. FIGS. 5A, 5B and 5C show the axisymmetrical component, unaxisymmetrical component, and static magnetic component, respectively. In FIGS. 5A to 5C, the axisymmetrical component and the unaxisymmetrical component are shown by taking ppm as the unit, and the static magnetic field component is shown by taking gauss as the unit.

Figure 6A:
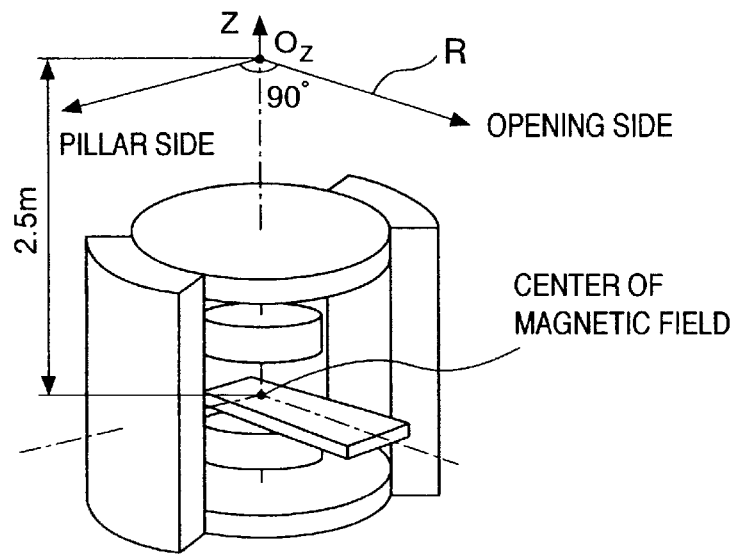
FIG. 6A is a diagram showing a measurement condition of a leakage magnetic field in the embodiment of FIG. 1.
Figure 6B:
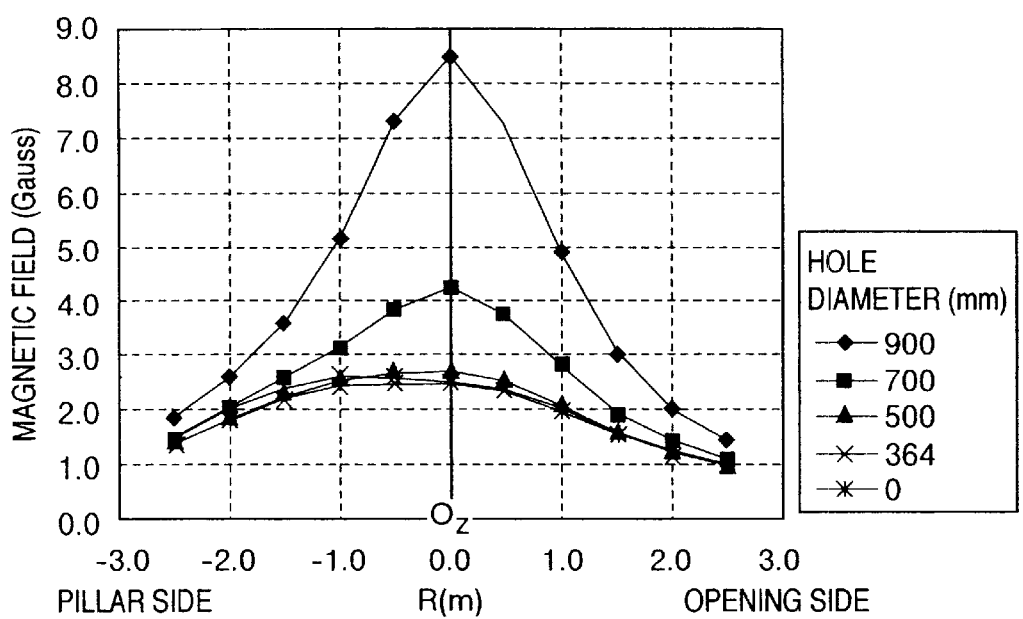
FIG. 6B is a diagram showing a measurement result of the leakage magnetic field in the embodiment of FIG. 1.

Evaluation of the change of the leakage magnetic field caused by a change in hole diameter is shown in FIGS. 6A and 6B. Evaluation of the leakage magnetic field is conducted typically in the position of 5 gauss line. Since the change of the leakage magnetic field was slight in the evaluation we had lately, however, evaluation was conducted by using the magnetic field intensity in a position of Z=2.5 m from the magnetic field center as shown in FIG. 6A. Results are shown in FIG. 6B.

The evaluation results are summarized as follows.

With regard to the axisymmetrical component of FIG. 5A:

By providing a hole 12 having a diameter of 364 mm in the center of each of the platelike ferromagnetic substances 11, the $A(0, 2)$ term decreases by approximately 2,500 ppm. If the hole diameter is further increased, the $A(0, 2)$ term sharply decreases at a rate of −26.7 ppm/mm nearly in proportion to the hole diameter. on the other hand, the $A(0, 4)$ term is ¹⁄₁₀ or less in attenuation as compared with the $A(0, 2)$ term, and changes only approximately −2.2 ppm/ mm. From the foregoing description, it will be understood that the A(0, 2) term of the axisymmetrical component can be effectively corrected by using the holes 12 and appropriately selecting the diameter thereof.

With regard to the unaxisymmetrical component of FIG. 5B:

By changing the diameter of the holes 12 from 364 mm to 900 mm, the A(2, 2) term increases by approximately 90 ppm. On the other hand, the A(2, 4) term and the A(4, 4) term change by only 2 ppm. It will be appreciated that the change value of the unaxisymmetrical component caused by a change of the hole diameter is small, and it is smaller than that of the axisymmetrical component by an order of at least two digits.

With regard to the static magnetic field component of FIG. 5C:

By providing the holes 12 having a diameter of 364 mm, the magnetic field intensity (approximately 0.75 Tesla) in the center of the static magnetic field fell by approximately 40 gauss. If the hole diameter is made further larger, the rate of the drop of the magnetic field intensity increases. In the case of the holes 12 having a diameter of 900 mm, a drop of approximately 400 gauss occurs. In the case where the static magnetic field intensity is raised by approximately 100 gauss, it can be coped with by raising the current of the superconducting coils 4. Therefore, it is preferable to set the hole diameter to 500 mm or less. On the other hand, in the case where the static magnetic field intensity is raised by at least 100 gauss, the amount of the lines of the magnetic flux changes and a phenomenon such as magnetic saturation might occur. Therefore, it is desirable to review the magnetic circuit and conduct redesign as occasion demands.

With regard to the leakage magnetic field component of FIG. 6B:

If the diameter of the holes 12 is made large, the line of the magnetic flux which should be caught in the central part of the platelike ferromagnetic substance 11 leaks in the Z axis direction, and consequently the leakage magnetic field in The Z axis direction increases. If the diameter of the holes 12 is 500 mm or less, the leakage magnetic field is approximately 2.5 gauss at most and changes little. If the diameter is made at least 700 mm, however, the leakage magnetic field suddenly increases.

As heretofore described, the A(0,2) term of the axisymmetrical component of the static magnetic field can be controlled in the order of 1,000 ppm in the case of the present embodiment, by changing the diameter of the holes 12 provided in the center of the platelike ferromagnetic substances 11. If the hole diameter is limited to approximately 500 mm, an effective magnetic field correction can be conducted without increasing the leakage magnetic field significantly and with exerting little influence upon the static magnetic field intensity.

Furthermore, in a static magnetic field generating apparatus having such a structure that each of the holes 12 is provided in the center of the platelike ferromagnetic substance 11, the total magnetomotive force of the superconducting coil 4 of the static magnetic field generating source 3 can be reduced as compared with the conventional technique when the static magnetic field intensity of the imaging space 2 is the same as that of the conventional technique. The reason will hereafter be described. In the superconducting coil 4 shown in FIG. 3, the main coil 4A generates a positive A(0, 2) term. Typically, adjustment coils 4B each letting flow a current of opposite sense inside the main coil 4A are provided so as to cancel the positive A(0, 2) term generated by the main coil 4A. On the other hand, such a function as to cancel the positive A(0, 2) term is obtained in the case of the present embodiment by providing the holes 12 through the platelike ferromagnetic substances 11. This means that providing the holes 12 through the platelike ferromagnetic substances 11 corresponds to providing the adjustment coils 4B letting flow currents opposite in sense to the current of the main coil 4A, generates a negative A(0, 2) term, and is capable of eliminating the inhomogeneous magnetic field components of the A(0, 2) term.

As a result, the magnetomotive force of the adjustment coils 4B generating the negative A(0, 2) term can be lowered. Accordingly, the total magnetomotive force of the superconducting coil 4 can also be lowered. By lowering the magnetomotive force of the adjustment coils 4B, the dimension of the coils can be reduced, and consequently the static magnetic field generating sources 3 can be made small in size. As a result, the installation space of the static magnetic field generating apparatus also becomes small.

Furthermore, in the case of the static magnetic field generating apparatus using the superconducting coils 4 as the static magnetic field generating sources 3 as in the present embodiment, a refrigerator 13 is mounted outside the cooling vessel 5. If this refrigerator 13 is disposed below the platelike ferromagnetic substance 11, a useless region is caused by the space occupied by the refrigerator 13, and the size of the static magnetic field generating apparatus becomes large.

In the present embodiment, therefore, the refrigerator 13 is disposed in the hole 12 formed through the platelike ferromagnetic substance 11. In the stage of design, the position and diameter of the hole 12 are determined so as to make the magnetic field homogeneity in the imaging space 2 favorable, and thereafter the refrigerator 13 is made to entirely or partially enter the hole 12. Thereby, it becomes possible to conduct an effective space arrangement, prevent the apparatus from becoming large, and make the magnetic field homogeneity of the static magnetic field favorable.

Figure 4:
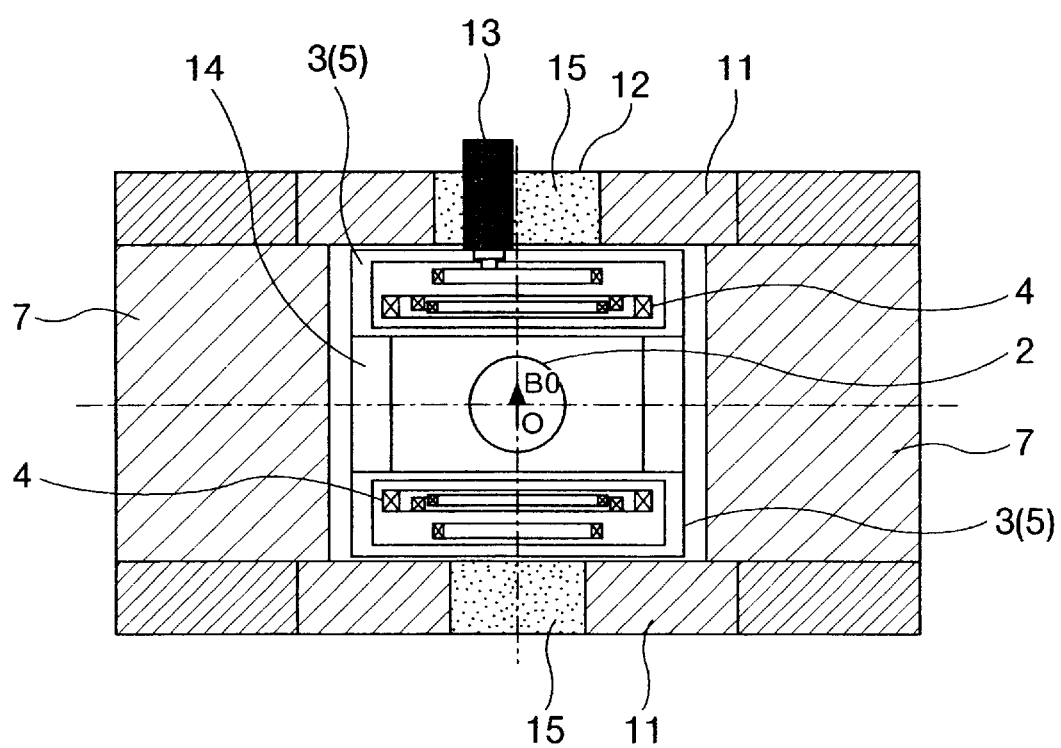
FIG. 4 is a diagram showing an example obtained by modifying a part of the embodiment of FIG. 1.

FIG. 4 is a variation of the embodiment of FIG. 1. In this variation, a circular hole 12 is formed through each of platelike ferromagnetic substances 11, and this hole 12 is filled with a material 15 having a low relative permeability. Here, the portion 15 filled with the material having a low relative permeability functions in the same way as the air gap hole 12. Therefore, an effect which is the same as that in the embodiment of FIG. 1 can be achieved. With regard to the magnetic field correction effect, therefore, the air gap hole 12 can be classed with the portion 15 filled with the material having a low relative permeability. In the present variation, a refrigerator 13 is furthermore embedded in the portion 15 filled with the material having a low relative permeability. By adopting such a structure, fixing the refrigerator 13 can be conducted easily. In this variation, a circular plate 15 having a small relative permeability to which the refrigerator 13 is attached may be inserted into the hole 12.

Figure 7:
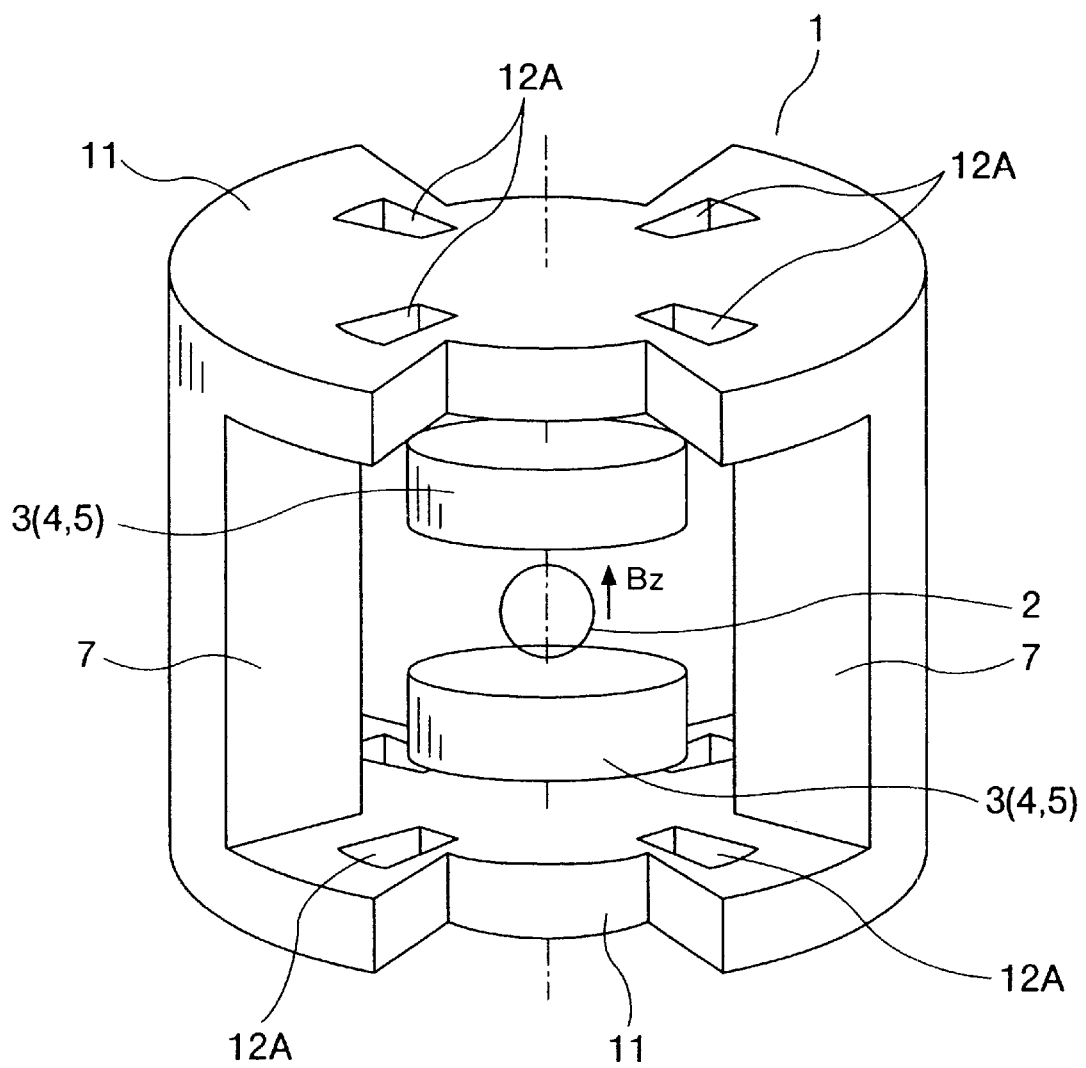
FIG. 7 is an entire oblique view of another embodiment of a static magnetic field generating apparatus according to the present invention.
Figure 8:
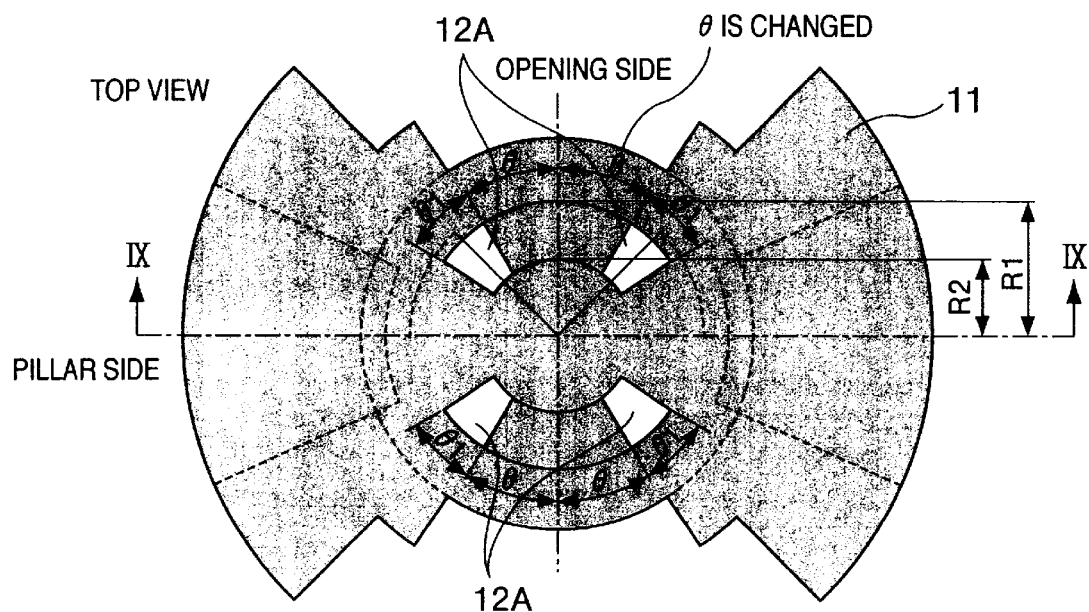
FIG. 8 is a top view of the embodiment of FIG. 7.
Figure 9:
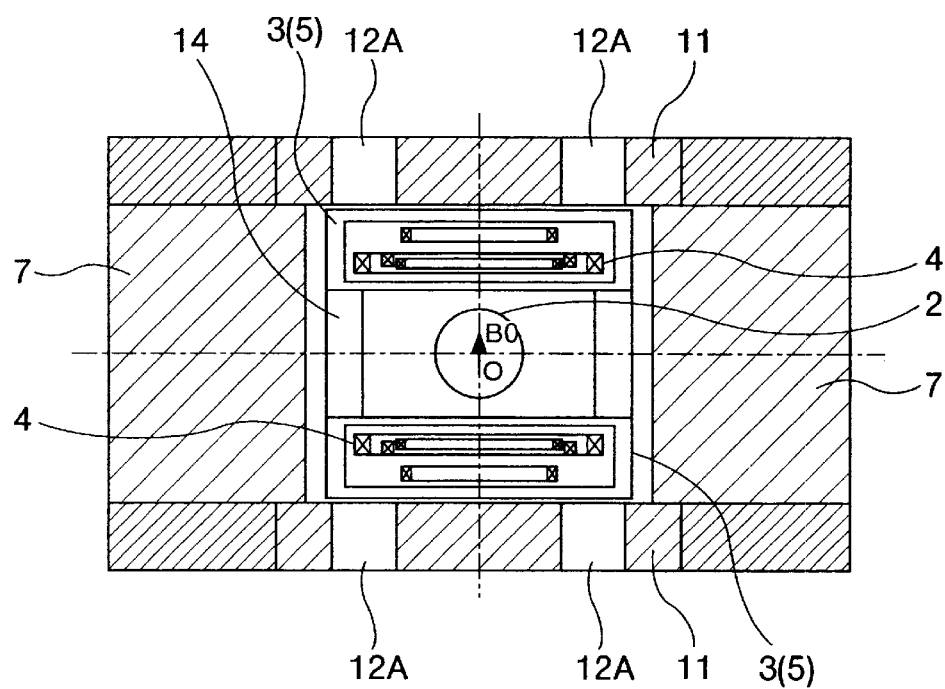
FIG. 9 is a longitudinal section view of the embodiment of FIG. 7.

Another embodiment of a static magnetic field generating apparatus according to the present invention is shown in FIGS. 7 to 9. FIG. 7 is an entire oblique view. FIG. 8 is a top view. FIG. 9 is a longitudinal section view. In the present embodiment, four fan-shaped holes 12A are formed in positions of the platelike ferromagnetic substances 11 which are symmetric about the central axis, and other portions are the same as those of the embodiment of FIG. 1. In the present embodiment, the magnetic field correction of the static magnetic field in the imaging space 2 can be conducted by changing the size and position of the fan-shaped holes 12A. In FIG. 8, an example of the size and position of the fan-shaped holes 12A is shown. The position of the fan-shaped hole 12A is represented by an inner diameter R2 and an angle θ from an axis line of the opening side. The size of the hole 12A is represented by an inner diameter R2, an outer diameter R1, and an angle θ1. In the illustrated example, R1=546 mm, R2=425 mm, and θ1=11.25°.

Effects of the fan-shaped holes 12A will now be described.

Figure 10A:
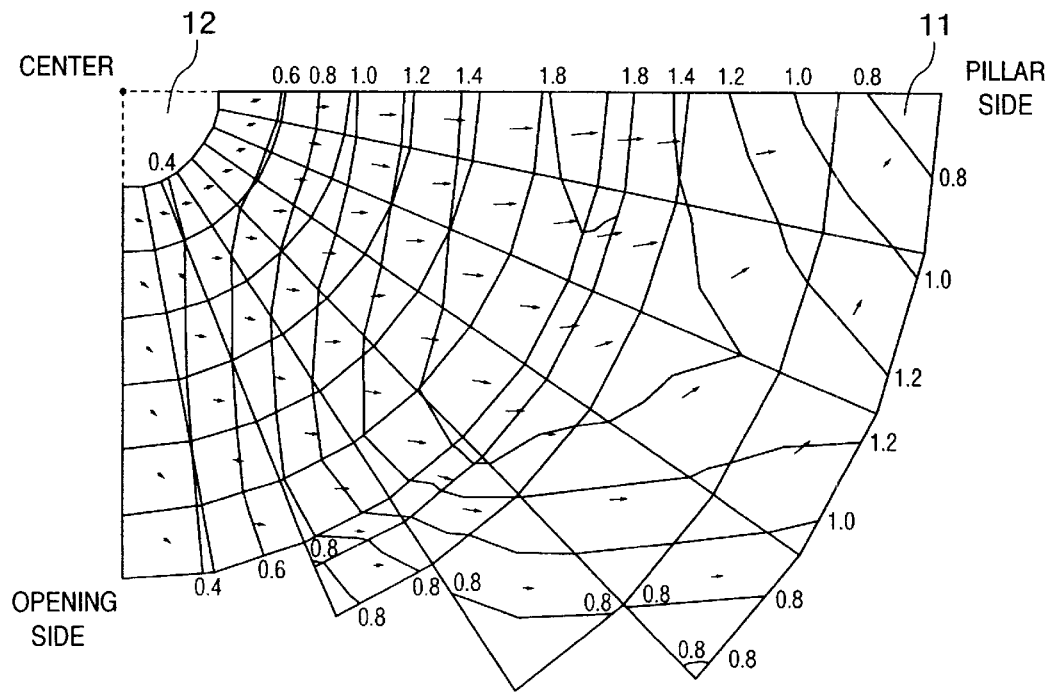
FIGS. 10A and 10B are diagrams showing examples of a magnetic field analysis in the case where a hole is bored through a platelike ferromagnetic substance.
Figure 10B:
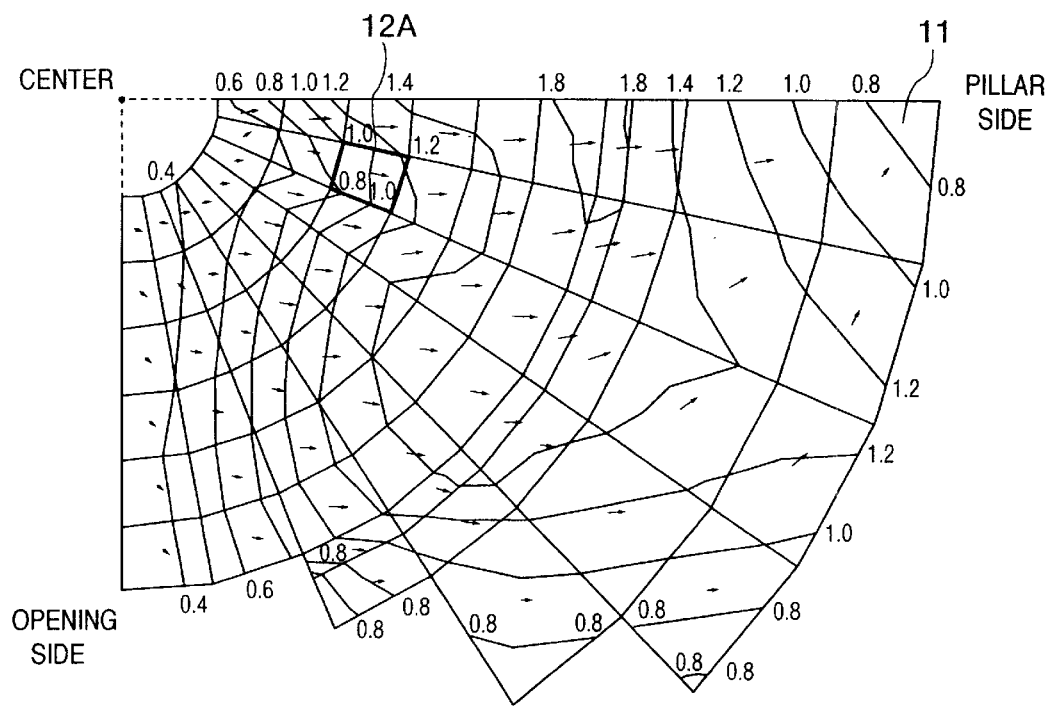
Figure 11A:
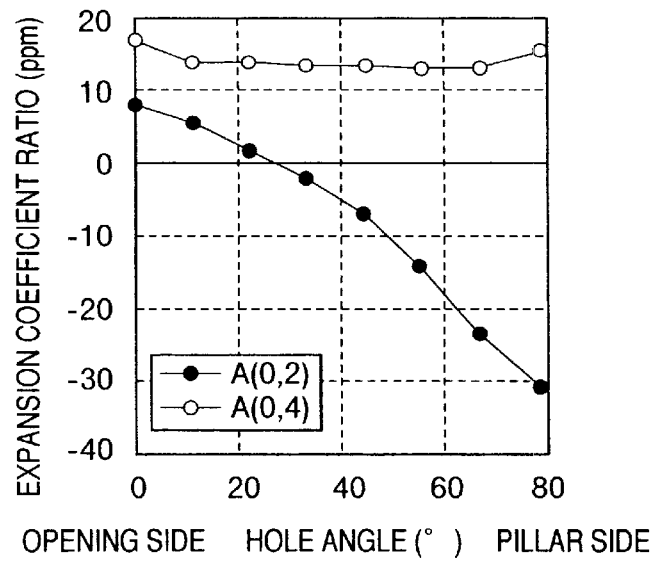
FIGS. 11A, 11B and 11C are diagrams showing a magnetic field correction effect obtained by fan-shaped holes of the embodiment of FIG. 7.
Figure 11B:
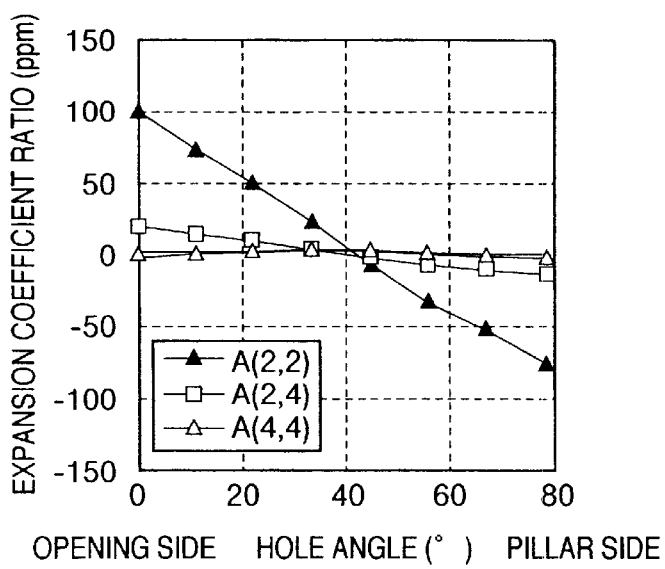
Figure 11C:
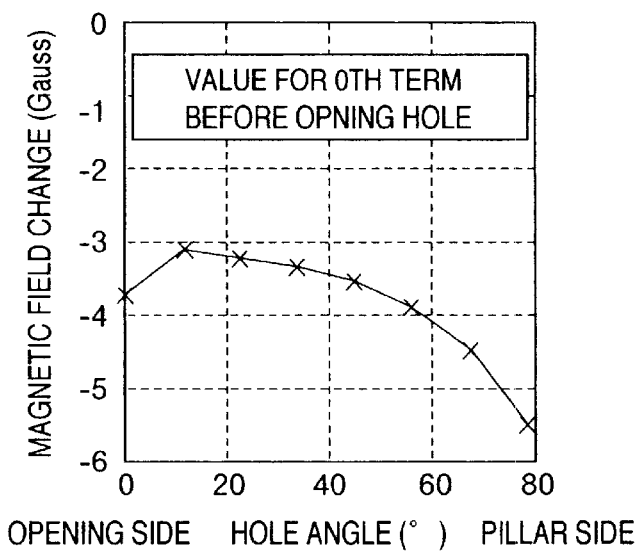

First of all, FIGS. 10A and 10B show examples of a magnetic field analysis in the case where the holes 12 are formed through the platelike ferromagnetic substances 11. FIG. 10A corresponds to a model having a circular hole 12 formed only in the center. FIG. 10B corresponds to a model having a circular hole 12 formed in the center and a fan-shaped hole 12A. FIGS. 10A and 10B show contour lines of the magnetic flux density and the directions of the lines of magnetic flux in a quarter of the platelike ferromagnetic substance 11 having a symmetric shape, in the case where iron materials are used as the platelike ferromagnetic substances 11 and pillarlike ferromagnetic substances 7. In FIG. 10B, warps of the directions of the lines of magnetic flux around the fan-shaped hole 12A provided in the radial direction are caused by the effect of the fan-shaped hole 12A which is not provided in FIG. 10A. Evaluation results obtained by quantifying the effect of the hole 12A are shown in FIGS. 11A, 11B, 11C and 12. In order to clarify the effect of the hole 12A, difference values with regard to the model having no hole 12A are shown in FIGS. 11A to 11C as graphs. FIGS. 11A, 11B, and 11C show the axisymmetrical component, unaxisymmetrical component, and static magnetic field component, respectively. In FIGS. 11A to 11C, the axisymmetrical component and the unaxisymmetrical component are indicated by taking ppm as the unit, and the static magnetic field component is indicated by taking gauss as the unit.

Figure 12:
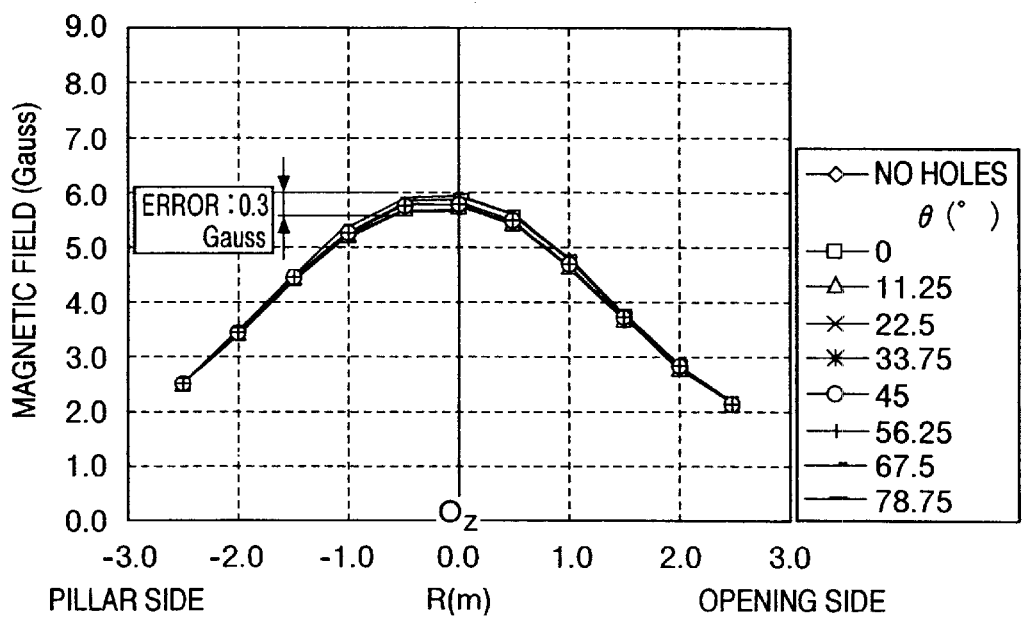
FIG. 12 is a diagram showing a measurement result of a leakage magnetic field in the embodiment of FIG. 7.

As for the evaluation of the leakage magnetic field varying according to the hole dimension and hole position, the evaluation was conducted by using the magnetic field intensity in a position of Z=2.5 m from the magnetic field center in the same way as FIG. 6A, and the results are shown in FIG. 12.

With regard to the axisymmetrical component of FIG. 11A:

If the hole position is changed from the opening side to the pillar side, the A(0, 2) term decreases from +8 ppm to −30 ppm. Even if the hole position is changed, the A(0, 4) term changes a little, i.e., by only 2.5 ppm. If the hole position is set near θ=25°, there is obtained such an effect that only the A(0, 4) term can be adjusted without changing the A(0, 2) term.

With regard to the unaxisymmetrical component of FIG. 11B:

If the hole position is changed from the opening side to the pillar side, then the A(2, 2) term decreases from +100 ppm to −78 ppm, and its change value is 178 ppm and the greatest. Since this term has symmetry with respect to the X and Y coordinates, it becomes 0 in the vicinity of 45° located midway. The A(2, 4) term changed by approximately 34 ppm, and the A(4, 4) term changed by approximately 7 ppm.

Comparing this result with the case of the circular hole of the first embodiment, not only the change value of the A(2, 2) term is large but also the change value of the axisymmetrical term is also large in the embodiment of FIG. 1. For controlling the A(2, 2) term, therefore, the present embodiment is easier to use.

In the above described evaluation for the present embodiment, the distance R2 from the central axis to the fan-shaped hole 12A is fixed. Also by changing this distance R2, however, the generation ratio of the unaxisymmetrical component can be changed. If in this case the distance R2 is made large, it exerts a significant influence upon the axisymmetrical component as well. In the case where only the unaxisymmetrical component is corrected, therefore, a minute correction is made possible by making the distance R2 small.

With regard to the static magnetic field component of FIG. 11C:

When the hole position is changed from the opening side to the pillar side, the change value is in the range of −3 gauss to −6 gauss. Since this value is very small, the influence exerted upon the leakage magnetic field is also small.

With regard to the leakage magnetic field of FIG. 12:

Even if the hole position is changed from the pillar side to the opening side, the leakage magnetic field changes by approximately 0.3 gauss, and the influence exerted upon the leakage magnetic field is much smaller than that of the first embodiment. If the hole 12A is made larger, the leakage magnetic field increases in the case of the present embodiment as well. Especially in the vicinity of the portion where the platelike ferromagnetic substance 11 is connected to the pillarlike ferromagnetic substance 7, the lines of magnetic flux concentrate. If the hole 12A is formed in the vicinity thereof, therefore, the influence exerted upon the leakage magnetic field becomes large. In such a case, therefore, it is preferable that the size of the hole 12A should be made smaller.

Figure 13:
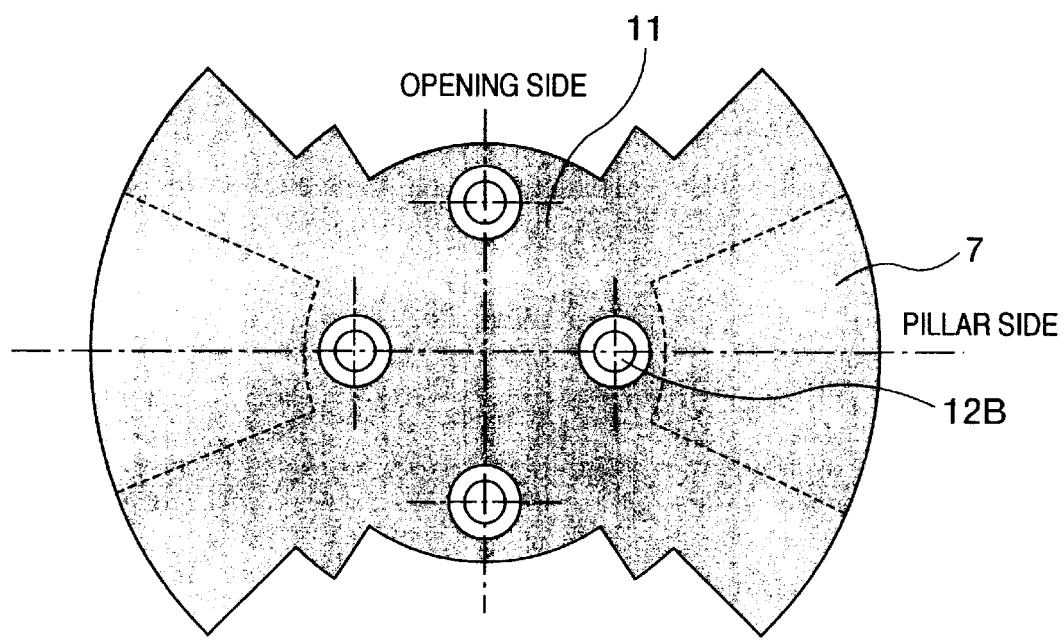
FIG. 13 is a top view of a variation of the embodiment of FIG. 7.
Figure 14:
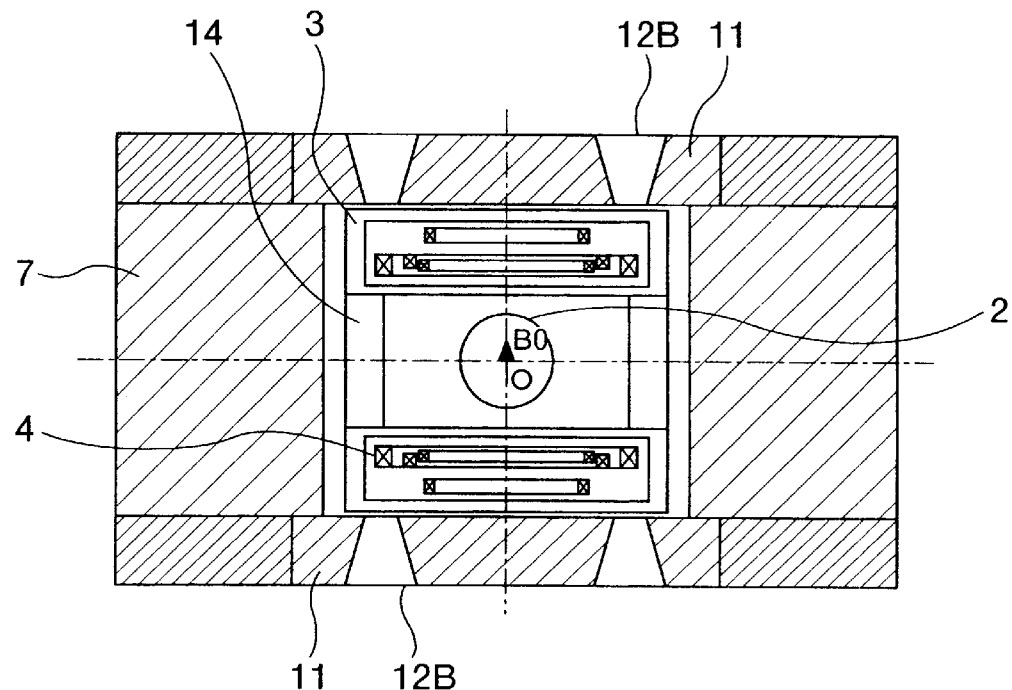
FIG. 14 is a longitudinal section view of the embodiment of FIG. 13.
Figure 15:
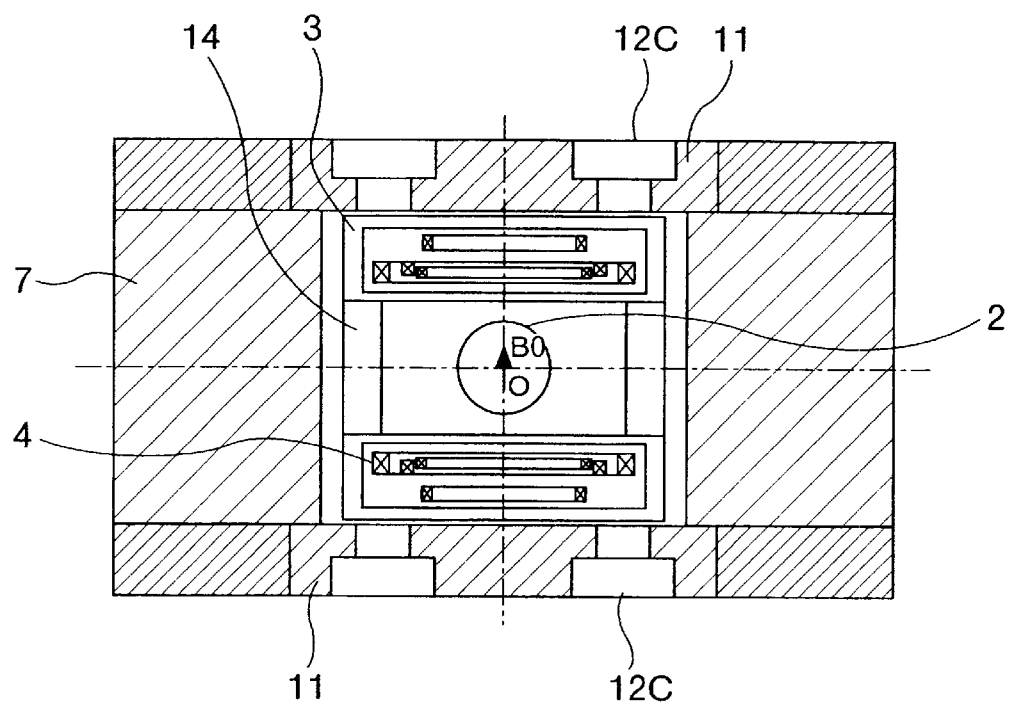
FIG. 15 is a longitudinal section view of another variation of the embodiment of FIG. 7.

In the description of the present embodiment heretofore given, the holes 12A formed through the platelike ferromagnetic substance 11 are four fan-shaped holes. However, the shape and the number of the holes 12A are not restricted thereto. The shape of the holes may be a circle, triangle, quadrilateral, or polygon. Or the holes may be tapered holes 12B as shown in FIGS. 13 and 14, or stepped holes 12C as shown in FIG. 15. It is a matter of course that the hole size may also be changed. From the viewpoint of workability, circular holes are preferable. By providing the holes with the shape of the tapered holes 12B shown in FIG. 14 or the stepped holes 12C shown in FIG. 15, it becomes possible to control the flow of lines of magnetic flux and conduct a more complicated magnetic field correction.

The number of holes may be greater than four or less than four. It is desirable to set this number according to the expansion coefficient term to be corrected.

Furthermore, the above described holes 12A to 12C may be filled with a material having a low relative permeability to embed the holes. It is effective to the case where the presence of holes is inconvenient.

As for the position of the holes, the holes may be located on axis lines of the opening side and pillar side as shown in FIG. 13. In the case where the number of the holes is increased, the holes may be provided in the same radial direction as other holes, or may be provided in different directions. As for the size of the holes as well, the holes have the same size in the embodiment of FIG. 7. However, holes having different dimensions may be disposed. The hole direction is usually in the vertical direction. As occasion demands for adjusting the flow of lines of magnetic flux, however, each of the holes may be formed in a slant direction.

Furthermore, it is possible to implement a combination of the embodiment of FIG. 1 and the embodiment of FIG. 7. In other words, the magnetic field correction can be effected by providing a circular hole in the central part and a plurality of fan-shaped holes in the radial direction.

Figure 16:
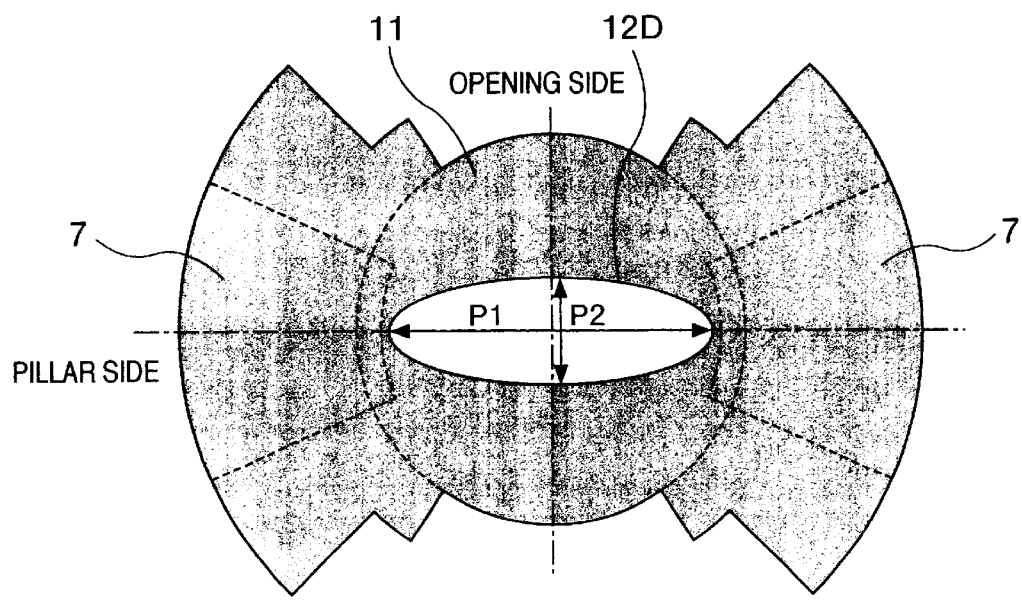
FIG. 16 is a top view of another embodiment of a static magnetic field generating apparatus according to the present invention.
Figure 17:
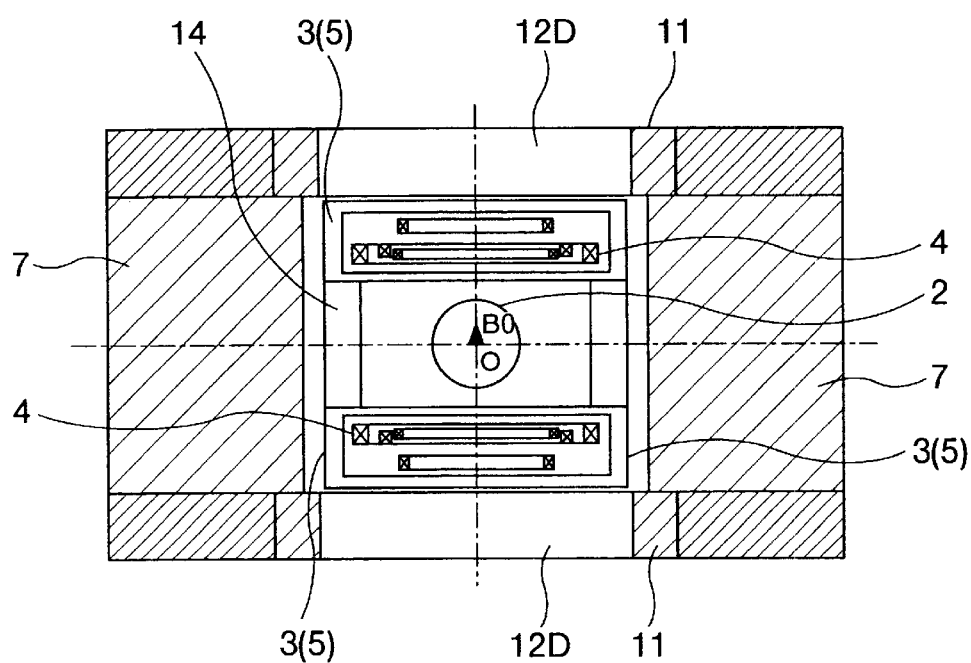
FIG. 17 is a longitudinal section view of the embodiment of FIG. 16.

Another embodiment of a static magnetic field generating apparatus according to the present invention is shown in FIGS. 16 and 17. FIG. 16 is a top view, and FIG. 17 is a longitudinal section view. Its entire oblique view is nearly the same as FIG. 1, and consequently it is omitted. In the present embodiment, an elliptical hole 12D is formed through the platelike ferromagnetic substance 11 in the vertical direction. This elliptical hole 12D has its major axis P1 on the pillar side, and its minor axis P2 on the opening side. In the present embodiment, the magnetic field correction of the static magnetic field can be conducted by changing the lengths of the major axis P1 and the minor axis P2 and a relative ratio between them. A correction in a range wider than that in the case of the circular hole 12 can be effected. This is because the lines of magnetic flux flow asymmetrically in the pillar side direction and the opening side direction and consequently the influence upon the unaxisymmetrical component can be made large.

For obtaining an effect similar to that of the present embodiment, the shape of the holes may be a rectangle or a polygon close to an ellipse. Furthermore, the present embodiment can be combined with the embodiment of FIG. 7.

It is a matter of course that in the present embodiment as well the elliptical hole 12D may be filled with a material having a low relative permeability to embed the hole or a refrigerator may be disposed in the hole 12D.

Figure 18:
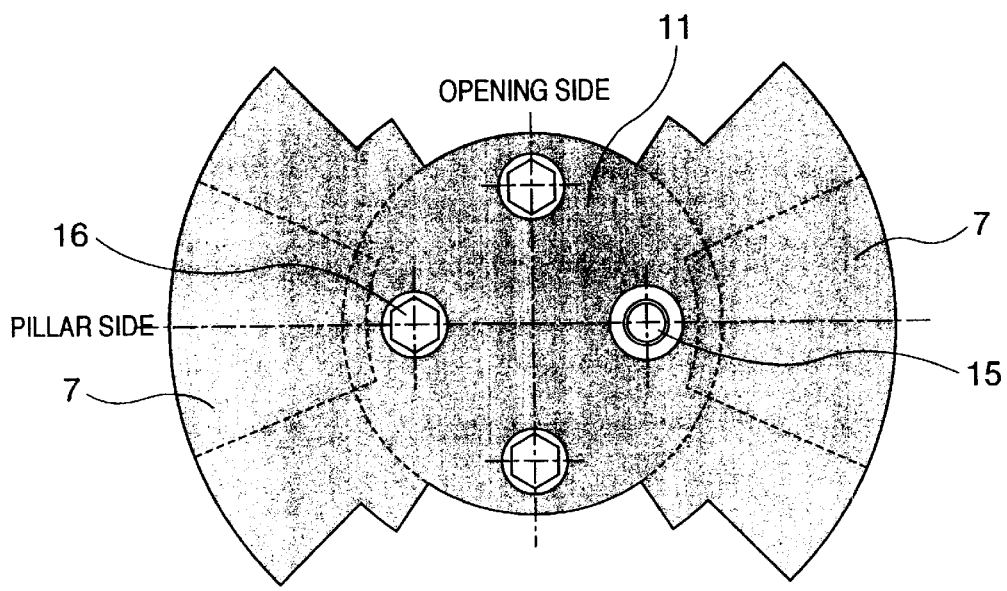
FIG. 18 is a top view of another embodiment of a static magnetic field generating apparatus according to the present invention.
Figure 19:
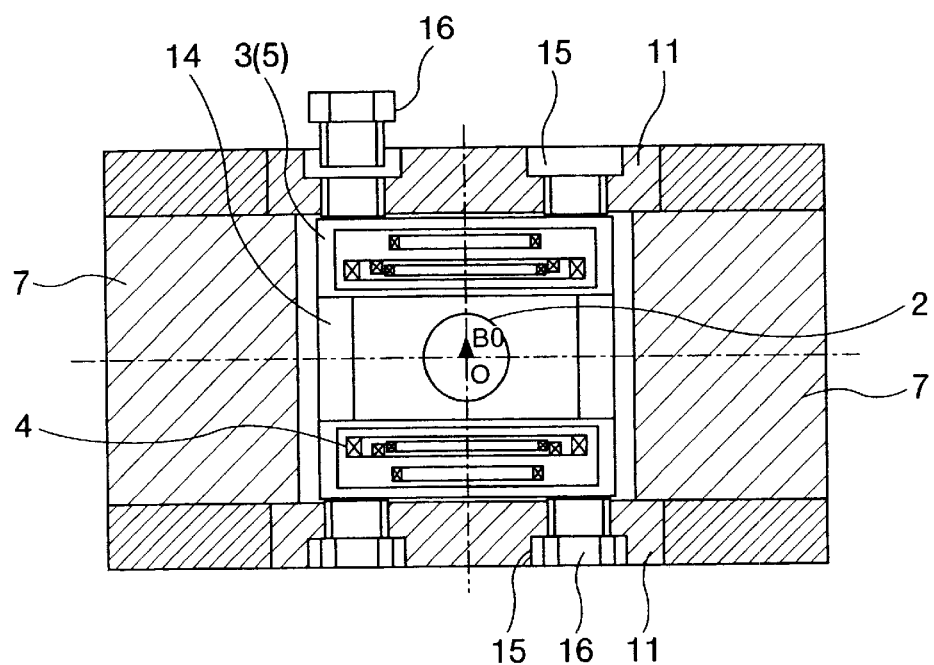
FIG. 19 is a longitudinal section view of the embodiment of FIG. 18.
Figure 21:
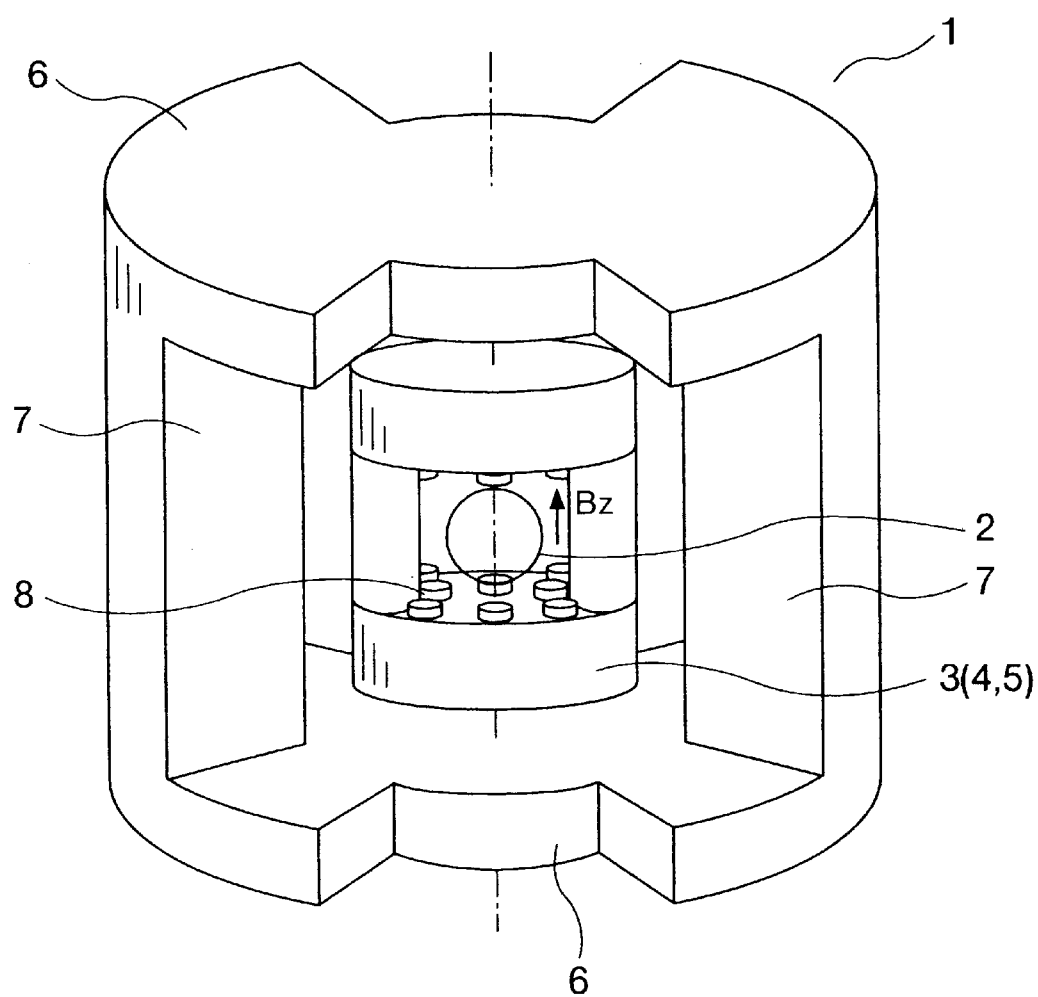
FIG. 21 is a diagram showing an example of a conventional magnetic field generating apparatus.
Figure 22:
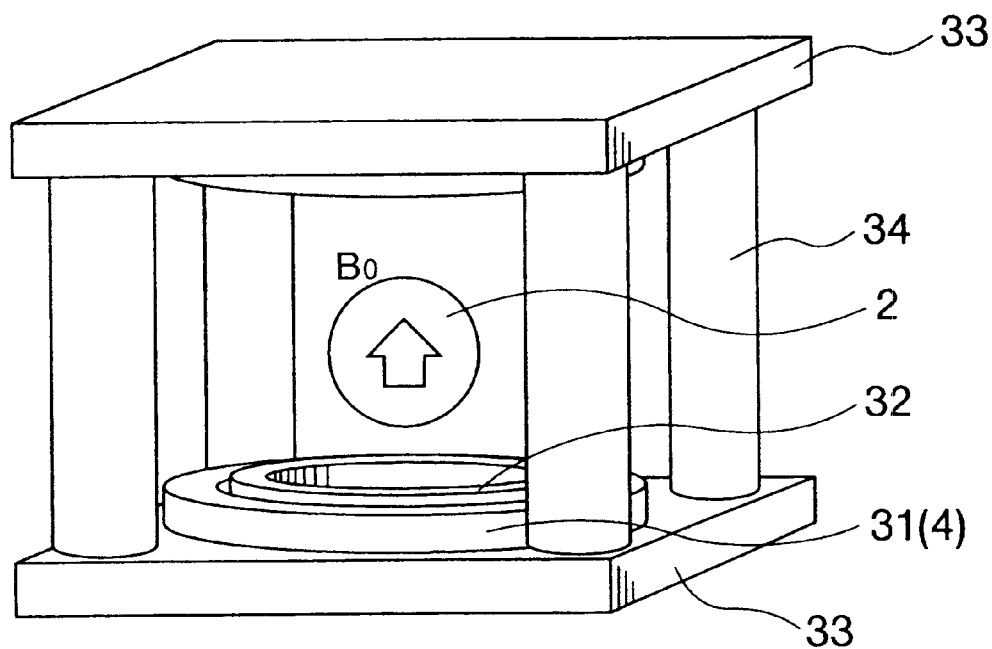
FIG. 22 is a diagram showing another example of a conventional magnetic field generating apparatus.
Figure 23:
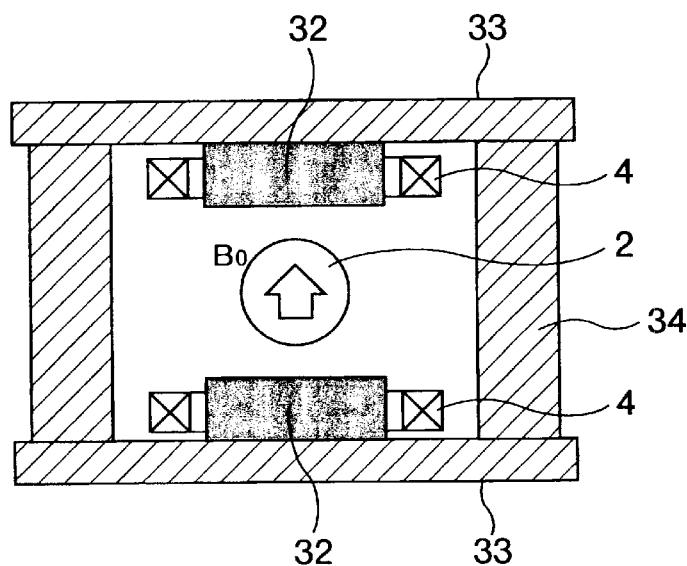
FIG. 23 is a longitudinal section view of the example of the conventional apparatus shown in FIG. 22.

Another embodiment of a static field generating apparatus according to the present invention is shown in FIGS. 18 to 20A and 20B. FIG. 18 is a top view, and FIG. 19 is a longitudinal section view. FIGS. 20A and 20B are entire oblique views of a bolt which is one of components. In the same way as the case of FIG. 16, the entire oblique view of the apparatus has been omitted. In the present embodiment, tapped holes 15 are formed through the platelike ferromagnetic substance 11. In each of the tapped holes 15, a bolt 16 of a ferromagnetic substance is screwed from the outside of the platelike ferromagnetic substance 11. By adjusting the length of screwing in, the magnetic field correction of the static magnetic field is conducted. Therefore, the magnetic field correction in the present embodiment can be conducted by adjusting the number of the tapped holes, positions and sizes of the tapped holes, and the screwing in length of the bolts. FIGS. 20A and 20B show examples of a bolt applied to the present embodiment. A bolt 16 of FIG. 20A is entirely formed by a ferromagnetic substance. A bolt 16A of FIG. 20B has been obtained by making a portion ranging from its screw head to its threading part with a non-magnetic material or a material having a low relative permeability and attaching a ferromagnetic substance piece 17 such as an iron piece to its tip. In the case where the same material as that of the platelike ferromagnetic substance 11 is used as the material of the bolt 16, sometimes mechanical engagement occurs when the bolt is screwed in, and the bolt cannot be taken in and out. In such a case, it is desirable to use the bolt 16A differing in material of the threading part.

In the case where the bolt 16A is used, the ferromagnetic substance piece 17 is attached to its tip. The length of this ferromagnetic substance piece 17 is adjusted according to the magnitude of the magnetic field to be corrected. As for this ferromagnetic substance piece 17, it is also preferable that small pieces each having a short length are prepared and a plurality of small pieces are attached in piles according to the required length.

In the present embodiment, the ferromagnetic substance bolt 16 having the same material as the platelike ferromagnetic substance 11 is taken in and out with respect to the platelike ferromagnetic substance 11, and the flow of line of magnetic flux is adjusted by the length of its screwing in.

Therefore, fine adjustment of the static magnetic field is possible. On the other hand, the hole in the embodiments of FIGS. 1, 7 and 16 aims at large magnetic field correction, and it is necessary to set the hole position in the stage of design. By combining the embodiment of FIGS. 1, 7 or 16 with the embodiment of FIG. 18, therefore, it is possible to conduct a large magnetic field correction by providing the hole(s) and a small magnetic field correction by providing the screw adjusting mechanism of the present embodiment. Especially in the case where an asymmetric magnetic field is generated by a manufacturing error, there is obtained by the present embodiment such an effect that a fine magnetic field correction can be conducted even afterwards.

Embodiments of the present invention facilitating access to the subject will now be described by referring to the drawing.

Figure 25:
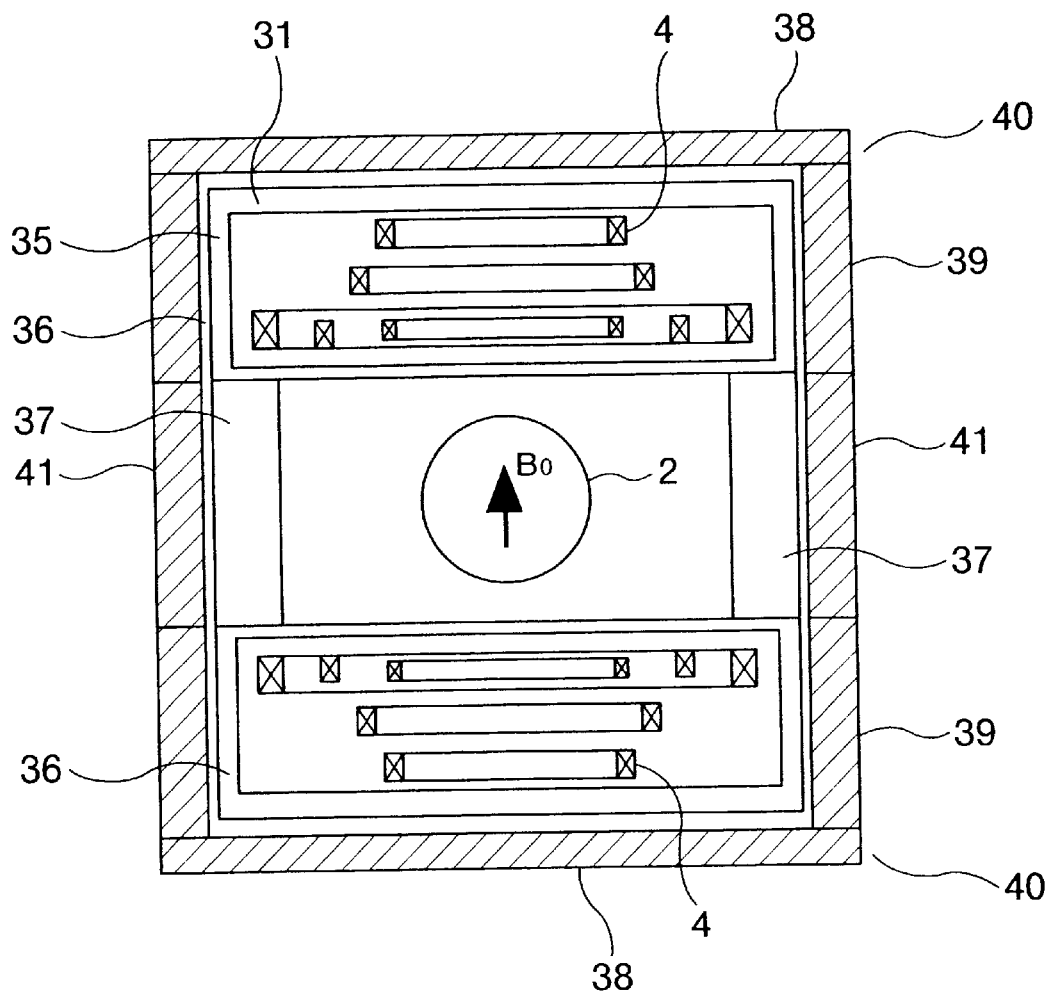
FIG. 25 is a longitudinal section view of the example of the conventional apparatus shown in FIG. 24.
Figure 26:
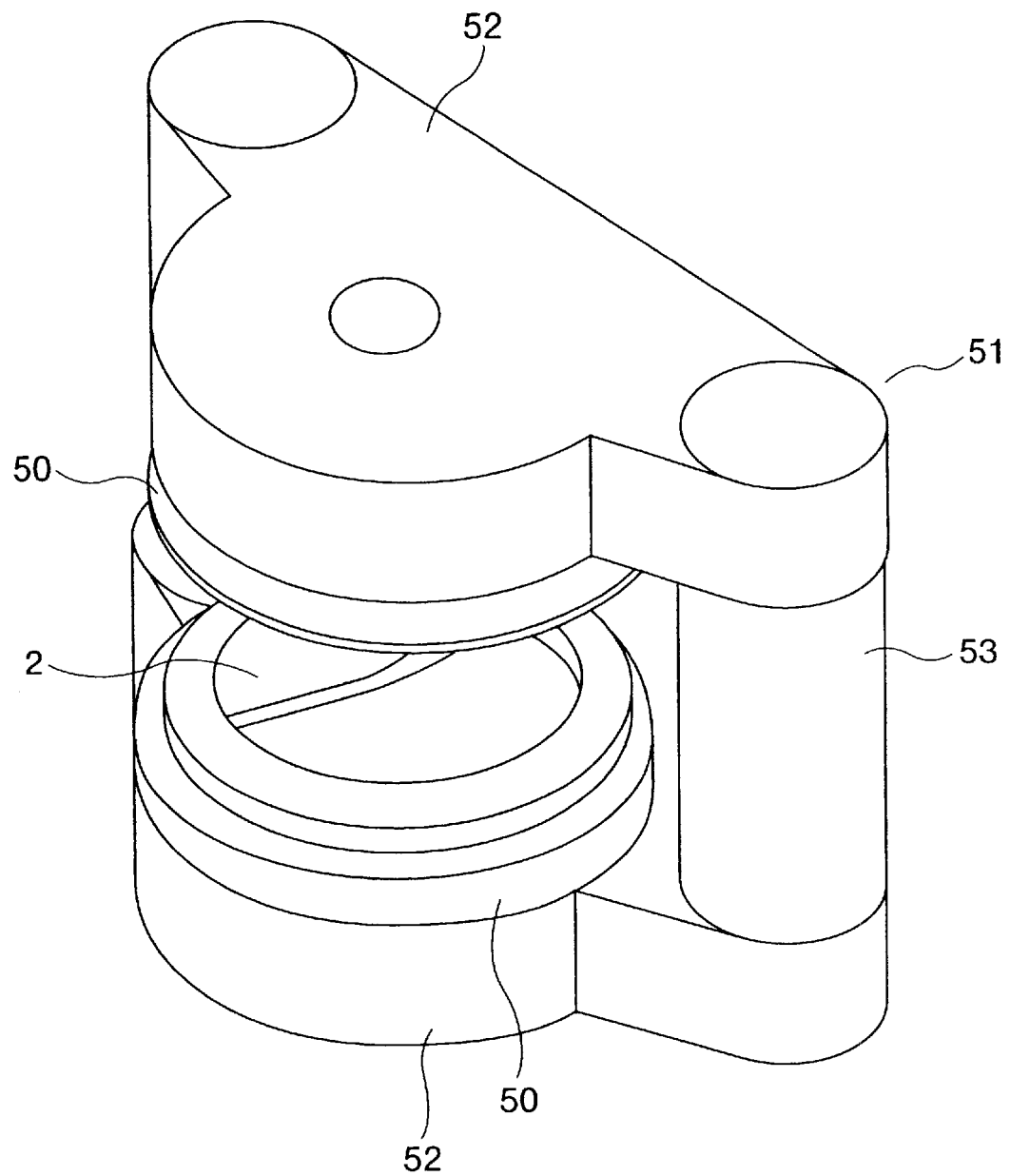
FIG. 26 is a diagram showing an example of a conventional magnetic field generating apparatus using permanent magnets.
Figure 27:
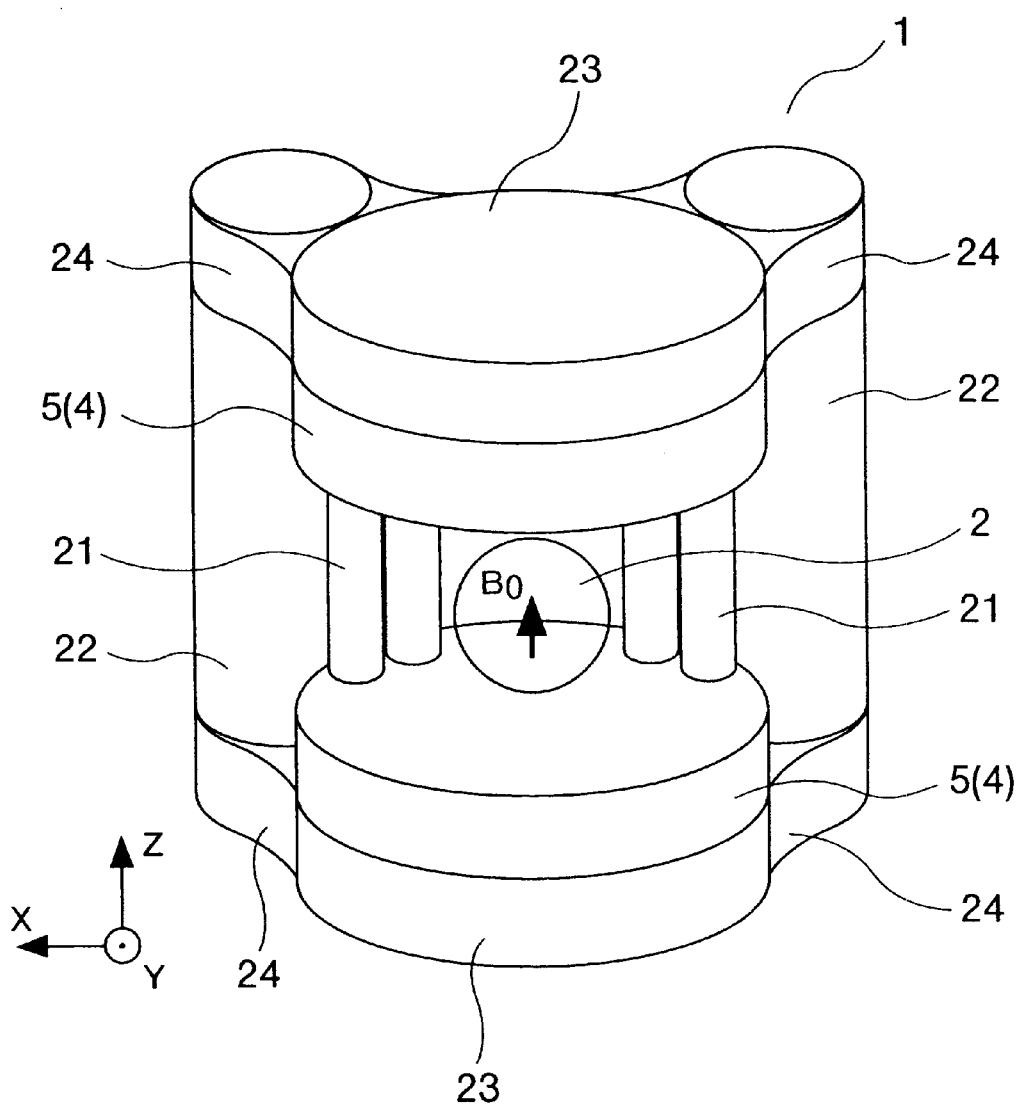
FIG. 27 is an entire oblique view of an embodiment of a static magnetic field generating apparatus facilitating access to a subject according to the present invention.
Figure 28:
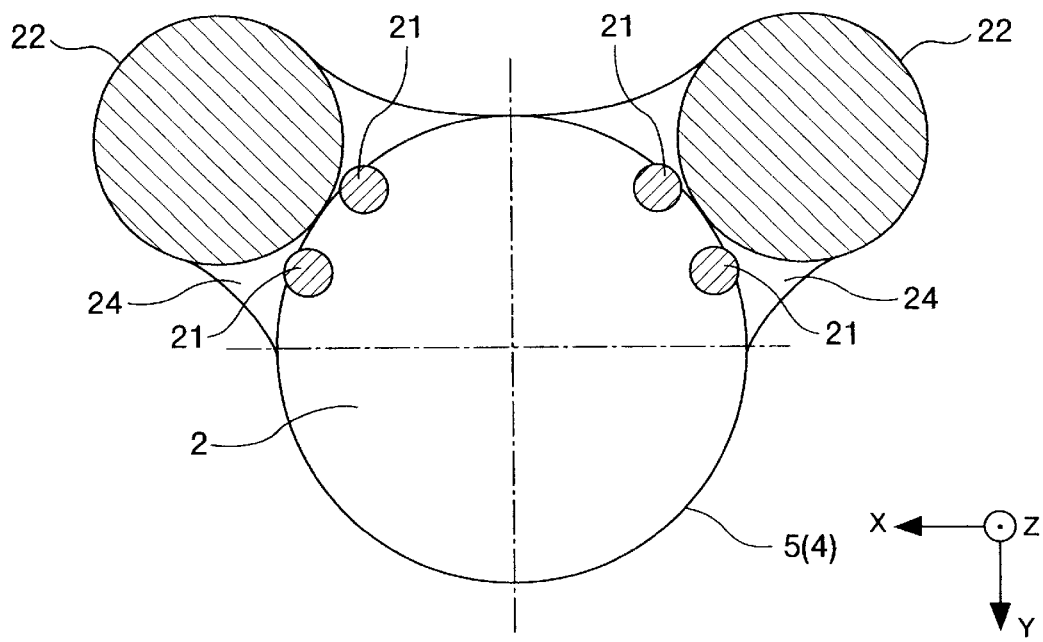
FIG. 28 is a cross-sectional view of the embodiment of FIG. 27 in its measurement space.
Figure 29:
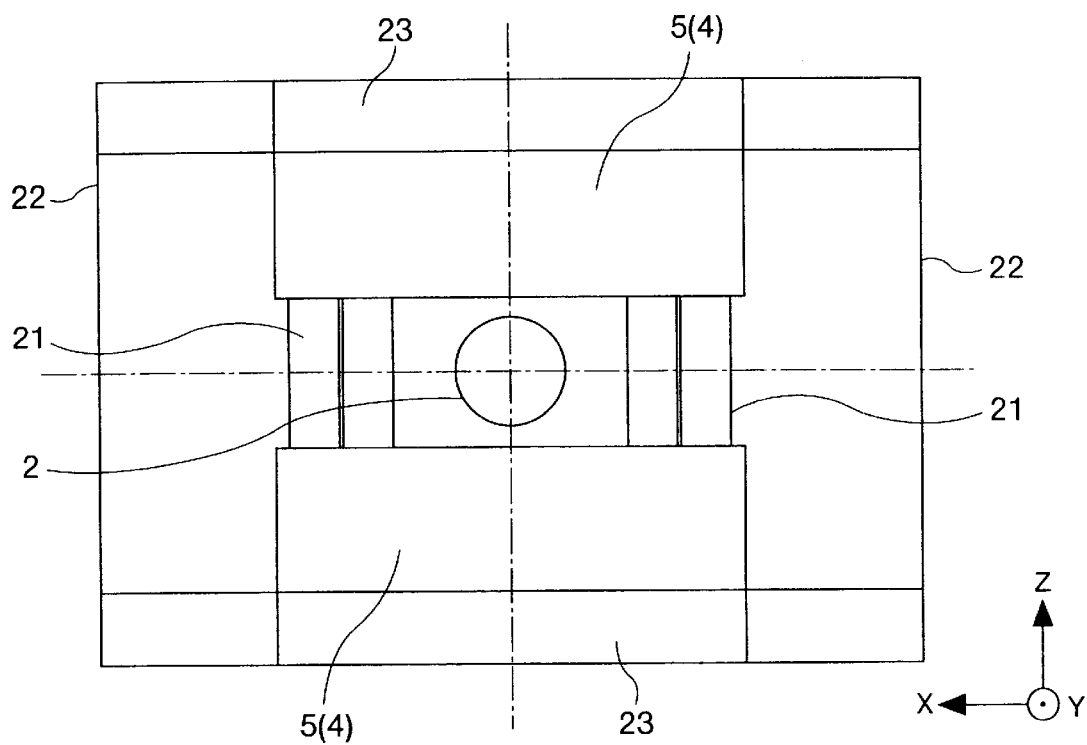
FIG. 29 is a front view of the embodiment of FIG. 27.

An embodiment of a superconducting magnet according to the present invention is shown in FIGS. 27 through 29. FIG. 27 is an entire oblique view. FIG. 28 is a longitudinal section view in a measurement space of FIG. 27. FIG. 29 is a front view of FIG. 27. In FIG. 27, cooling vessels 5 housing superconducting coils 4 serving as magnetic field generating sources are disposed above and below a measurement space (homogeneous magnetic field generation region) 2 symmetrically in the vertical direction so as to be opposed to each other. The configuration of the superconducting coils 4 serving as the magnetic field generating sources are basically the same as those of the conventional technique shown in FIG. 25. The superconducting coils 4 function to generate a homogeneous magnetic field of high intensity in the measurement space 2 in the vertical direction. The cooling vessels 5 housing the circular superconducting coils 4 also each take a circular shape and are disposed symmetrically in the vertical direction. Each of the cooling vessels 5 includes a vacuum vessel and a coolant vessel, and cools the superconducting coil 4 to the superconducting state and keeps the superconducting coil 4 in the superconducting state. By coupling tubes 21 disposed between them, the two cooling vessels 5 are supported so as to keep a predetermined distance between them. The coupling tubes 21 function to mechanically support upper and lower coupling vessels 5. As occasion demands, however, the coupling tubes 21 may be provided with a function of thermally coupling the upper and lower coolant vessels together. (As for the coolant, liquid helium or the like is used.) The structure of the coupling tube 21 in this case has a coolant vessel in its central part, and a thermal shield and a vacuum vessel disposed around the coolant vessel. By doing so, it becomes unnecessary to provide one refrigerator for each of the upper and lower cooling vessels 5, and it becomes possible to make do with one refrigerator for the system. As for disposition of the coupling tubes 21, two coupling tubes are disposed on each of the left side and right side of the measurement space 2 as illustrated. However, the number of the coupling tubes is not restricted to this. On each side, one coupling tube may be disposed, or three or more coupling tubes may be disposed. Furthermore, bilateral asymmetry may be used, i.e., the number of coupling tubes on the left side may different from the number of coupling tubes on the right side. From the viewpoint of support of the cooling vessel 5, however, bilateral symmetry is preferable in consideration of force balance.

On the other hand, a magnetic shield made of iron is provided on the periphery of the cooling vessels 5 in order to reduce the leakage magnetic field caused outside the apparatus by the magnetic flux which is generated by the superconducting coils 4 serving as the magnetic field generating sources. To be concrete, circular iron plates 23 are disposed respectively above the upper cooling vessel 5 and below the lower cooling vessel 5 so as to surround the upper and lower cooling vessels 5. Furthermore, the upper and lower iron plates 23 are magnetically coupled together by cylindrical iron columns 22. Furthermore, auxiliary iron materials 24 are provided between portions of the iron plates 23 and portions of the iron columns 22 in order to enhance the magnetic coupling and suppress the leakage magnetic field. As shown in FIG. 28, the auxiliary iron materials 24 connects the peripheries of the iron plates 23 to peripheries of the iron columns 22 so as to form smooth shapes. Since thereby the magnetic flux flows smoothly between the iron plates 23 and the iron columns 22, magnetic saturation is not apt to occur. By thus surrounding the periphery of the magnetic field generating sources by ferromagnetic substances such as iron, a magnetic path (return path) is formed for the magnetic flux generated outside the apparatus, and consequently it is possible to prevent the leakage magnetic field from spreading far away. As for the ferromagnetic substance used in the present embodiment, a material other than iron may also be selected so long as it magnetically exhibits ferromagnetism. With due regard to the magnetic characteristics, cost, and mechanical strength, use of iron is generally preferable.

For ensuing description, a three-dimensional rectangular coordinate system having the center of the measurement space (homogeneous magnetic field generation region) 2 as its origin will now be defined. This coordinate system has a Z axis in the vertical direction and has a Y axis and an X axis as shown in FIG. 28.

Figure 24:
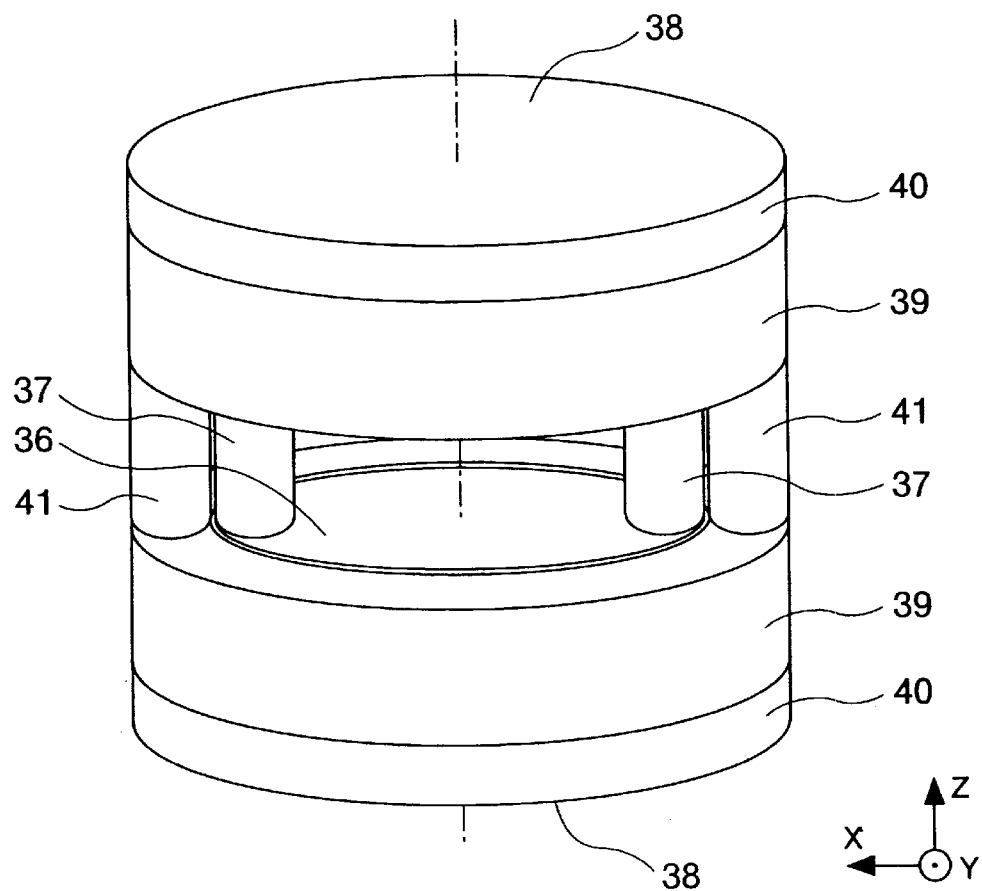
FIG. 24 is a diagram showing another example of a conventional magnetic field generating apparatus.

In the case where the superconducting magnet apparatus of FIG. 27 is applied to a MRI apparatus, the subject placed on an inspection table is typically inserted into the measurement space 2 of the superconducting magnet apparatus 1 along the Y axis direction. In the conventional superconducting magnet apparatus as shown in FIG. 24, however, the coupling tubes 37 and iron columns 41 for connecting the upper and lower cooling vessels 36 together are disposed on the X axis, and consequently the inspector cannot access the subject from a side of the apparatus.

On the other hand, in the present embodiment, the coupling tubes 21 and the iron columns 22 of the cooling vessels 5 are not disposed on the X axis, but on the rear side (on the back side) with respect to the Z axis which is the central axis of the measurement space 2 in the vertical direction. In other words, the cooling vessels 5 are supported by the coupling tubes 21 on the rear side with respect to the Z axis, and the iron columns 22 are magnetically coupled with the iron plates 23 on the rear side with respect to the Z axis. On the X axis, therefore, neither the coupling tubes 21 nor the iron columns 22 are present. From the flank side of the apparatus, therefore, the inspector can freely access the subject inserted from the outside of the apparatus into the measurement space 2. As a result, the inspector can take various actions including IVMR more easily. When viewed from the inspector let in the measurement space 2 of the superconducting magnet apparatus, a field of view in the transverse direction spreads, resulting in increased feeling of openness. This brings about such an effect that the subject can receive the inspection without anxiety.

Besides their own weights of the superconducting coils 4, large electromagnetic force exerts between the upper and lower superconducting coils in the present embodiment by letting a current for magnetic field generation flow. For supporting large force, it is effective to make the coupling tubes 21 thick, provide a plurality of coupling tubes 21, increase the distance between the superconducting coils. As described before, the coupling tubes 21 are capable of not only functioning to support the cooling vessels 5, but also housing therein mechanisms for thermally coupling the upper and lower cooling vessels 5. Therefore, it is not necessary to separately provide a refrigerator for each of the upper and lower cooling vessels 5, resulting in an effect in the cost reduction.

By taking easiness of manufacturing into consideration, the outer shape of each of the coupling tubes 21 is typically made circular. Furthermore, by disposing the coupling tubes 21 in positions located at equal distances from the central axis (Z axis) of the homogeneous magnetic field generation region 2 in the vertical direction as shown in FIG. 28, connection portions of the cooling vessels 5 and the coupling tubes 21 can have the same structure, and consequently the manufacturing process can be facilitated. In FIG. 28, two coupling tubes 21 are disposed on each side, and four coupling tubes 21 in all are disposed. So far as the performance such as the strength permits, disposing one coupling tube on each side expands the space portion accommodating the subject and it can increase the feeling of opening of the subject. Furthermore, such a structure that the number of the coupling tubes 21 on the left side is different from that on the right side, such as a structure having two coupling tubes 21 on one side and one coupling tube on the other side, may also be used. In this case, the feeling of opening on the side reduced in the number of coupling tubes can be increased.

Figure 30:
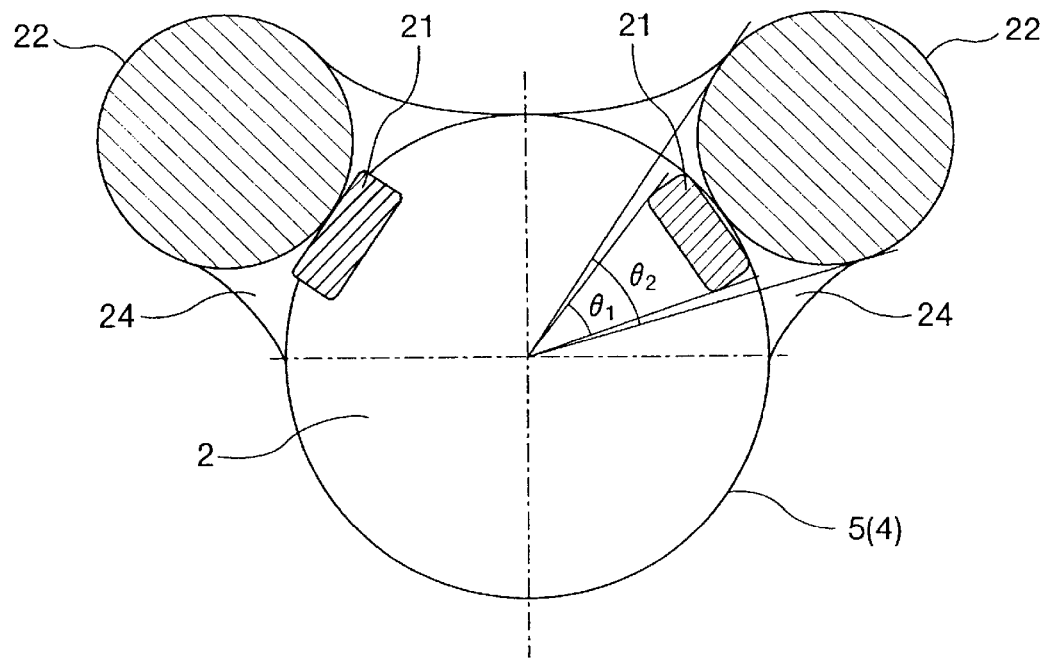
FIG. 30 is a cross-sectional view of another embodiment of a static magnetic field generating apparatus according to the present invention in its measurement space.

An embodiment of the present invention is shown in FIG. 30. FIG. 30 is a cross-sectional view in the measurement space. In the present embodiment, each of the coupling tubes 21 has a nearly rectangular external shape. By making the length of a longer side of the external shape of each coupling tube 21 nearly equal to the interval of the two coupling tubes 21 in the case of FIG. 27, mechanical strength nearly equal to that of the embodiment of FIG. 27 can be obtained.

By adopting this structure, the number of components forming the coupling tube 21 and the labor of the work for connection with the upper and lower cooling vessels 5 can be reduced. As a result, the manufacturing cost can be reduced.

As the external shape of the coupling tubes 21, a shape such as an ellipse may be adopted besides the rectangle. What is essential is to achieve the object of reducing the number of components without lowering the mechanical strength by making the length of the cooling vessel 5 along the circumference direction long. Furthermore, by providing the periphery of the coupling tube 21 with a shape taken along the periphery of the cooling vessel 5, it is possible to make the joining portions between the coupling tubes 21 and the upper and lower cooling vessels 5 coincide with each other and thereby facilitate joining work between them.

Denoting viewing angles viewing a coupling tube 21 and an iron column 22 when viewed from the central axis (Z axis) of the measurement space 2 in the vertical direction by $\theta_1$ and $\theta_2$, respectively, it is preferable to dispose the coupling tube 21 and iron column 22 so as to satisfy the relation $\theta_1 < \theta_2$ and let the angle $\theta_1$ inside $\theta_2$ as shown in FIG. 30. In such a configuration, it is possible to ensure a wide field of vision for the subject accommodated in the measurement space 2, and consequently the feeling of oppression of the subject can be mitigated.

As the viewing angle $\theta_1$ viewing a coupling tube 21 is increased, the mechanical stability for supporting the electromagnetic force and the like applied to the superconducting coils 4 increases, but the feeling of oppression of the subject increases. By taking both of them into consideration, it is preferable to make $\theta_1$ approximately 60 degrees or less.

Figure 31:
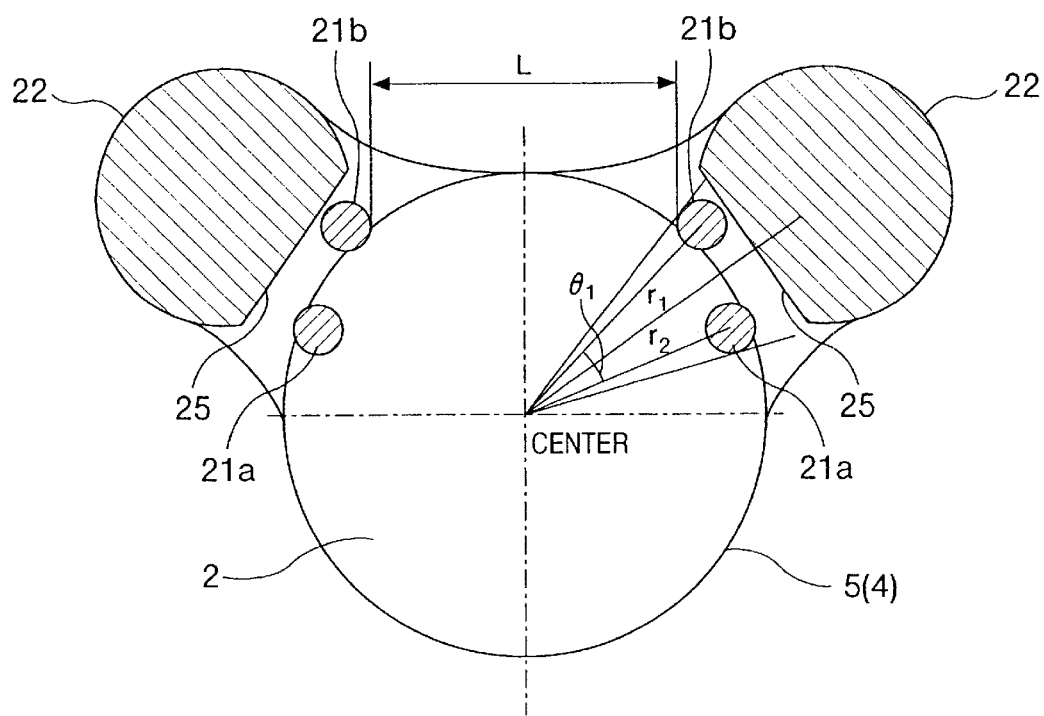
FIG. 31 is a cross-sectional view of another embodiment of a static magnetic field generating apparatus according to the present invention in its measurement space.

Another embodiment of the present invention is shown in FIG. 31. FIG. 31 is a cross-sectional view in the measurement space. Due to the force applied to the superconducting coils 4, a moment load acts upon between the upper and lower cooling vessels 5 with a coupling tube 21 (hereafter, front side coupling tubes are denoted by 21a and rear side coupling tubes are denoted by 21b) serving as its fulcrum. In the arrangement as shown in FIG. 31, the moment load is great on the front side and small on the rear side. By disposing the rear side coupling tubes 21b on the more back side as far as possible, therefore, the structure can be strengthened. In such a configuration, the viewing angle $\theta_1$ viewing the front side coupling tube 21a and the rear side coupling tube 21b becomes large, and the distance L between the left and right rear side coupling tubes 21b is shortened. Therefore, the viewing angle viewing the opening portion located on the rear side becomes smaller, and the feeling of opening of the subject is impaired. In the present embodiment, therefore, a distance $r_1$ between the central axis (Z axis) of a measurement space 2 and the rear side coupling tube 21b is made larger than the distance $r_2$ between the central axis (Z axis) and the front coupling tube 21a, and the rear side coupling tube 21b is disposed on a more rear side without substantially increasing the viewing angle $\theta_1$ viewing the coupling tubes 21a and 21b when viewed from the central axis. As a result, the structure can be strengthened without impairing the feeling of openness of the subject.

Furthermore, in the present embodiment, a flat face 25 is provided on the side of the iron column 22 opposed to the cooling vessel 5, and a perpendicular drawn from the central axis (Z axis) of the measurement space 2 to the flat face 25 intersects nearly in the center of the flat face 25. In such a configuration, the distance between the measurement space 2 and the iron column 22 is increased, and the influence of the iron column 22 on the magnetic field homogeneity of the measurement space 2 can be suppressed to a low value. In the case of the iron column 22 having a circular section, an attempt to increase the distance between a measurement space 2 and the iron column 22 results in a large external shape dimension of the apparatus as a whole. By applying the present embodiment, therefore, it is possible to implement a small-sized apparatus.

Figure 32:
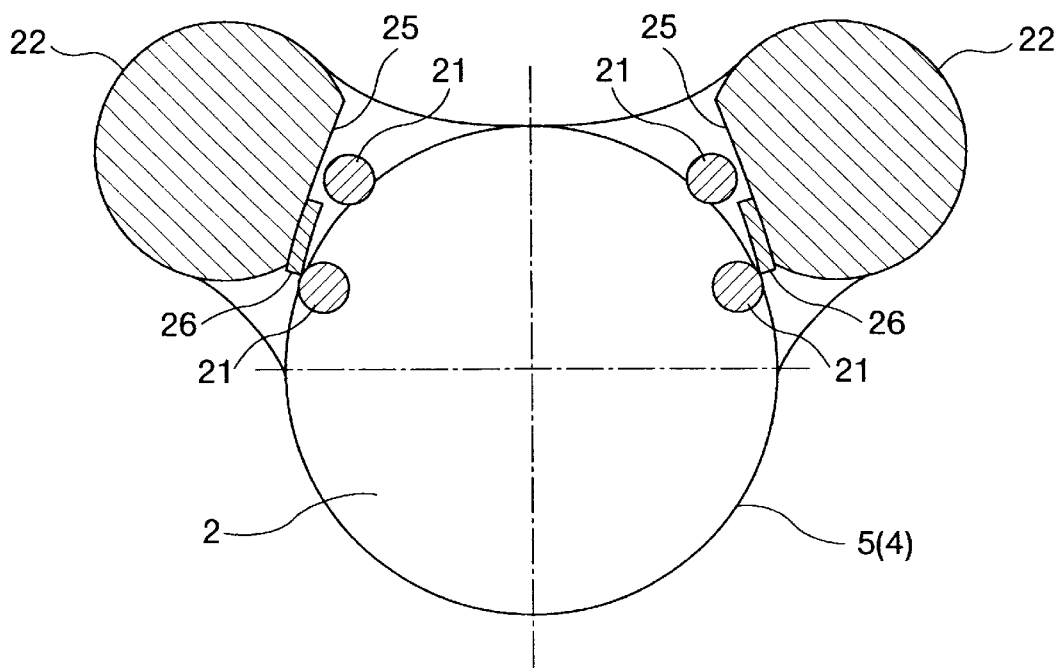
FIG. 32 is a cross-sectional view of another embodiment of a static magnetic field generating apparatus according to the present invention in its measurement space.

Another embodiment of the present invention is shown in FIG. 32. FIG. 32 is a cross-sectional view in the measurement space. In the present embodiment, an auxiliary iron plate 26 is added in an appropriate position to the flat face 25 of the iron column 22 described with reference to the embodiment of FIG. 31, and thereby the magnetic resistance in that portion is reduced. The magnetic flux generated by the superconducting coil 4 in the cooling vessel 5 forms a closed loop through an external magnetic path formed by iron. If it is assumed that the total quantity of the passing magnetic flux is the same, however, the amount of iron can be decreased in the case where iron is disposed near the coupling tubes 21. By disposing the auxiliary iron plate 26 in a position close to the cooling vessel 5 as in the present embodiment, therefore, the weight of the entire superconducting magnet apparatus can be reduced. Furthermore, as illustrated, the auxiliary iron plate 26 can be freely attached in an unoccupied place of the flat face 25 in a projection form so as to be in close vicinity to the cooling vessel 5. As compared with the case where the iron column 22 itself undergoes the step work, therefore, the manufacturing process is facilitated and the manufacturing cost can be reduced.

Figure 33:
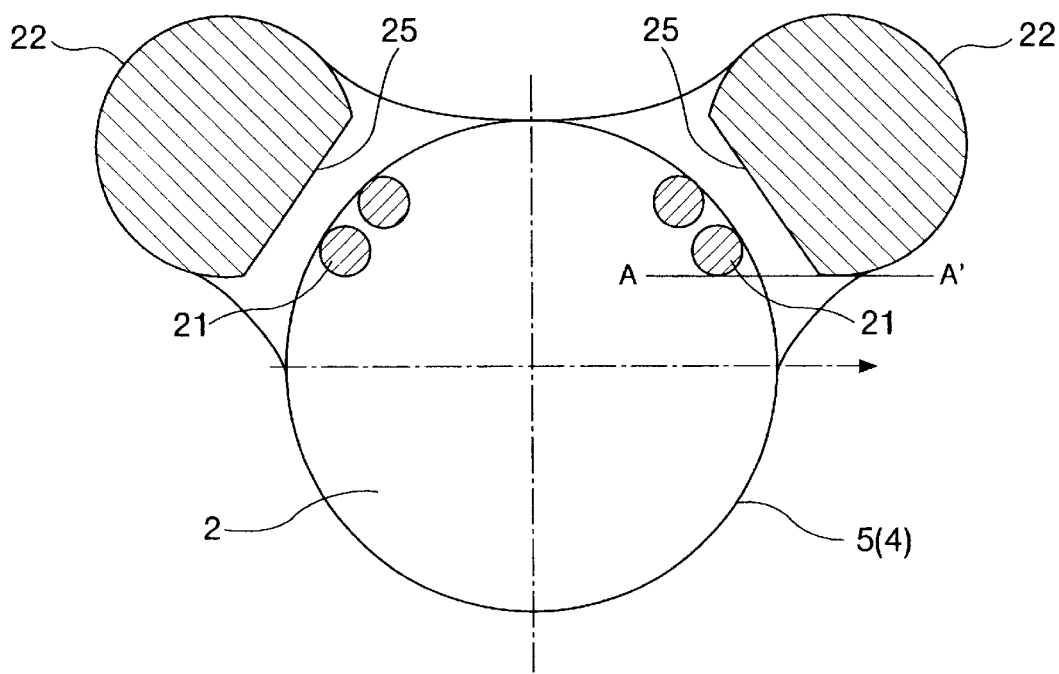
FIG. 33 is a cross-sectional view of another embodiment of a static magnetic field generating apparatus according to the present invention in its measurement space.

Another embodiment of the present invention is shown in FIG. 33. FIG. 33 is a cross-sectional view in the measurement space. In the present embodiment, a virtual straight line A–A' parallel to the X axis is drawn so as to touch a front face of the circumference of the iron column 22 at one point, and the coupling tubes 21 are disposed on the rear side with respect to the line A–A'. In such a configuration, a wider space is obtained in the transverse direction for the subject accommodated in the measurement space 2. As a result, the inspector's access to the subject in the transverse direction is facilitated, and the feeling of opening of the subject can be increased.

As for the external shape of each of the iron columns 22 magnetically coupling the upper and lower iron plates 23, a circular shape, or a shape obtained by deleting a part of a circular shape to form a flat face was adopted in the embodiments heretofore described. This is mainly because the iron columns 22 each having a circular external shape can be manufactured easily.

Figure 34:
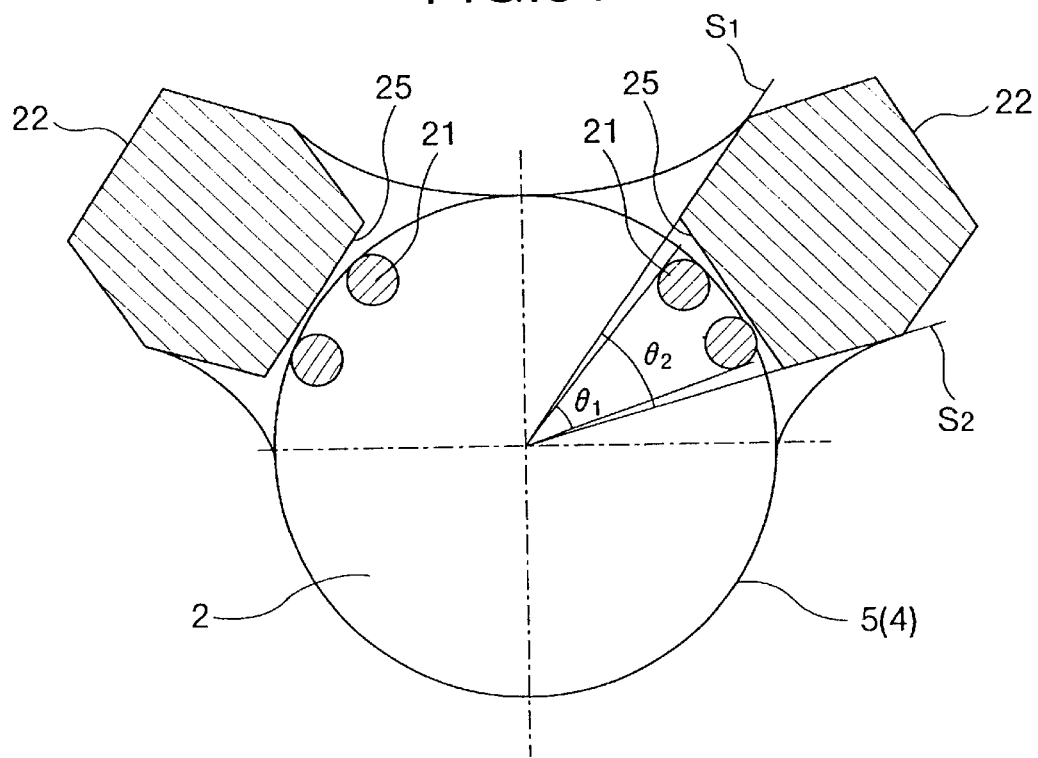
FIG. 34 is a cross-sectional view of another embodiment of a static magnetic field generating apparatus according to the present invention in its measurement space.

On the other hand, in another embodiment of the present invention shown in FIG. 34, faces $S_1$ and $S_2$ adjacent to a flat face 25 of each of the iron pillars 22 which are opposed to the cooling vessel 5 are flattened. In FIG. 34, each of the flat faces $S_1$ and $S_2$ coincide with a part of a tangential line drawn from the central axis (Z axis) of the measurement space 2 of the iron pillars 22 in the vertical direction to the periphery of each of the iron pillars. The angle formed by the flat faces $S_1$ and $S_2$ coincides with a viewing angle $\theta_2$ viewing the iron pillars 22 when viewed from the central axis (z axis). By providing each of the iron pillars 22 with such an external shape, the area of the section of each of the iron pillars 22 can be made wide even if the wideness of the field of vision of the subject accommodated in the measurement space 2 is the same as that of the circular iron column 22. Since the magnetic flux passes through the iron pillars 22 more easily, the leakage of the magnetic field to the outside of the apparatus can be reduced. On the contrary, if the quantity of the leakage of the magnetic field is made nearly equal (i.e., the area of the section of each of the iron pillars 22 is made nearly equal) in the case of the present embodiment, the length of the iron pillars 22 in the thickness direction (in the diameter direction of the apparatus) can be shortened, and the external shape dimensions of the apparatus can be decreased.

Figure 35:
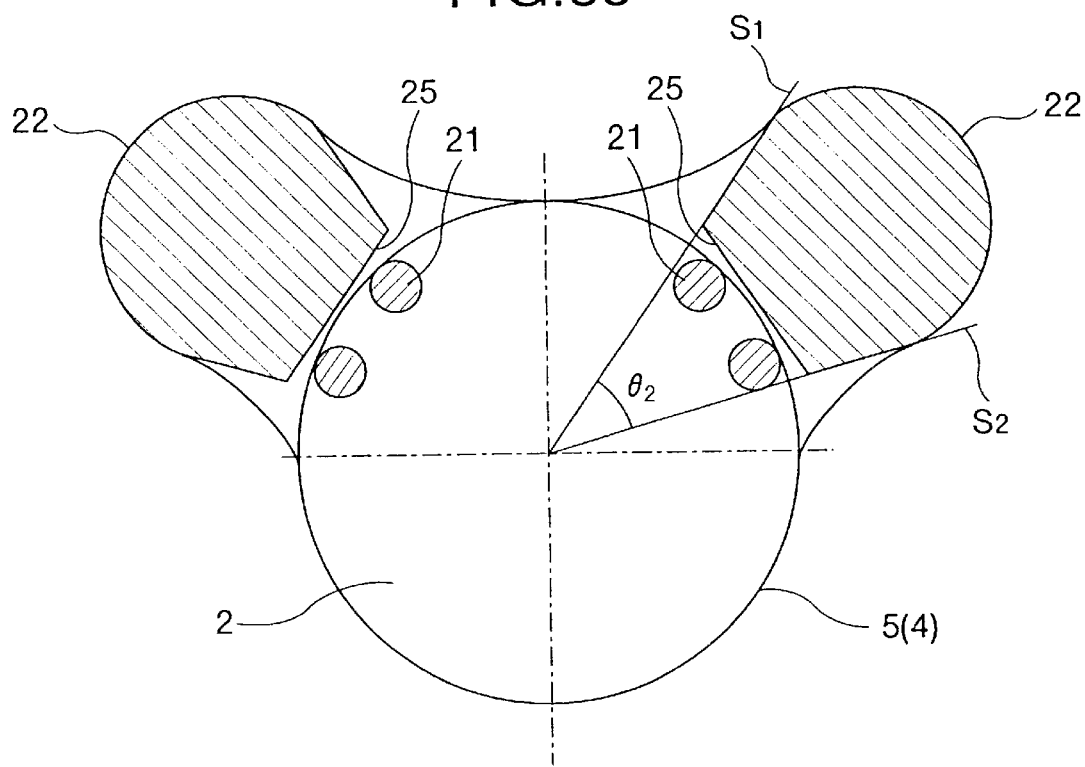
FIG. 35 is a cross-section al view of another embodiment of a static magnetic field generating apparatus according to the present invention in its measurement space.

Furthermore, by making the viewing angle $\theta_2$ viewing the flat faces $S_1$ and $S_2$ of each of the iron pillars 22 nearly coincide with a viewing angle $\theta_1$ viewing the coupling tubes 21 as a whole, the iron pillars 22 do not obstruct the field of vision of the subject accommodated in the measurement space 5, and consequently the external shape of each of the iron pillars 22 can also be made small. Judging from this point of view, the sectional shape of the iron pillars 22 is not restricted to a polygon as shown in FIG. 34. Besides FIG. 34, various shapes such as a shape having a circular arc as its outside periphery as shown in FIG. 35 can be selected from the viewpoint of the easiness of manufacturing and size reduction of the external shape of the apparatus.

Figure 36:
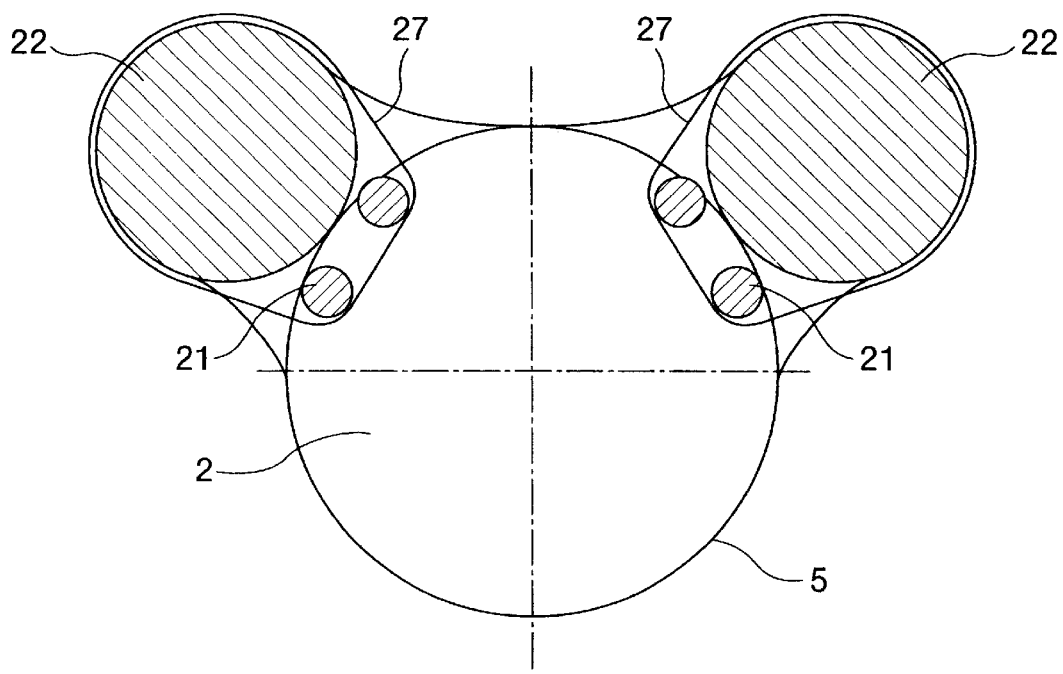
FIG. 36 is a cross-sectional view of another embodiment of a static magnetic field generating apparatus according to the present invention in its measurement space.
Figure 37:
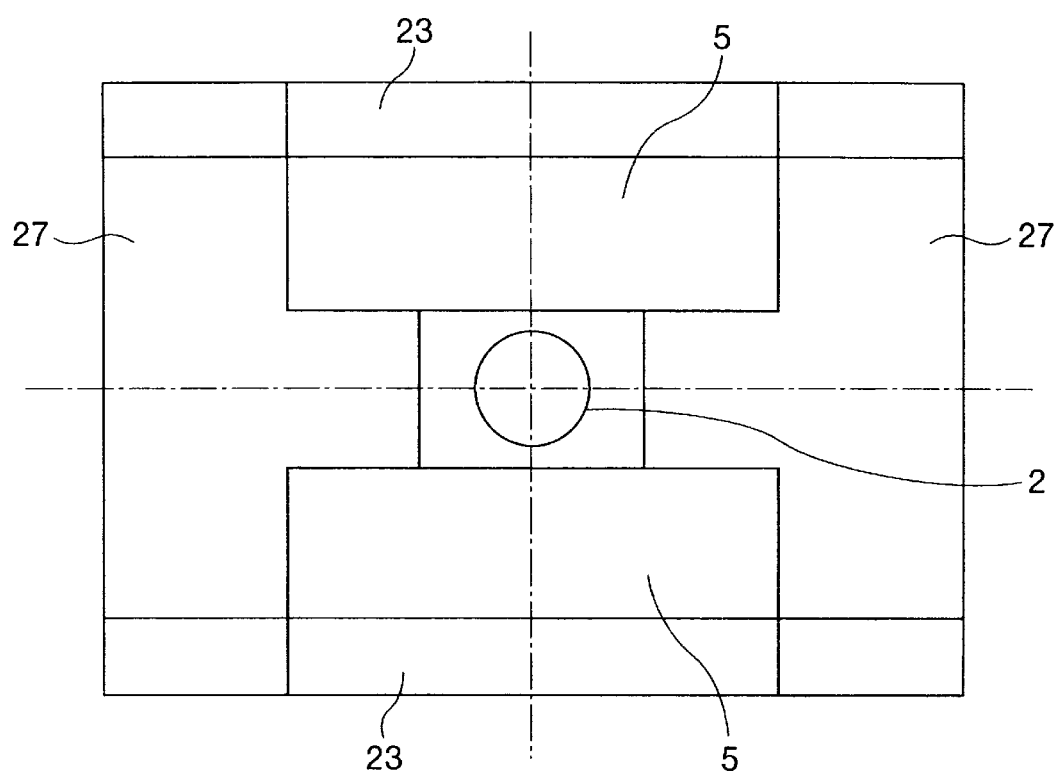
FIG. 37 is a front view of the embodiment of FIG. 36.

Another embodiment of the present invention is shown in FIGS. 36 and 37. In the present embodiment, a region containing coupling tubes 21 and an iron column 22 is surrounded by one cover 27, and thereby a plurality of columns are lumped together in appearance. Because of resultant simplified design, the feeling of opening of the apparatus can be increased. Furthermore, since the detailed structures are covered by the cover 27 and are not exposed, cleaning of dirt caused by scattering of a medicine, blood, or the like is facilitated.

In the description heretofore given, such a structure that the periphery of superconducting coils serving as the magnetic field generating sources is surrounded by iron which is a ferromagnetic substance as the means for reducing the leakage magnetic field has been used. In the case where there is no limit for the leakage magnetic field, or even if there is a limit it is loose, it is not necessary to dispose iron columns and iron plates as the iron shield. In such a case, the configuration of the principal part of the superconducting magnet apparatus contains in FIG. 27 only the cooling vessels 5 housing the superconducting coils 4 disposed above and below the measurement space 2 so as to be opposed to each other, and the coupling tubes 21 connecting and supporting the cooling vessels 5. For the combination of the cooling vessels 5 and the coupling tubes 21 as well, the embodiments described above can be applied in the same way.

Embodiments of the present invention facilitating carrying in and installing the superconducting magnets will now be described by referring to accompanying drawing.

Figure 38A:
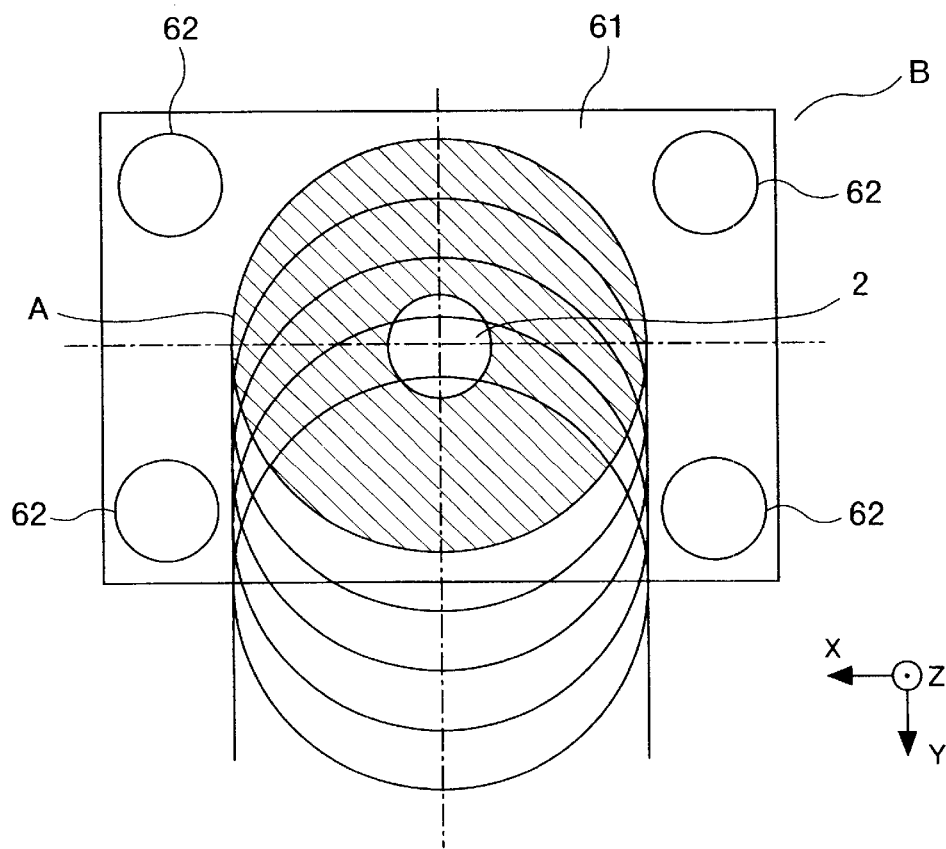
FIGS. 38A and 38B are diagrams showing an embodiment of a static magnetic field generating apparatus facilitating carrying in and installation according to the present invention.
Figure 38B:
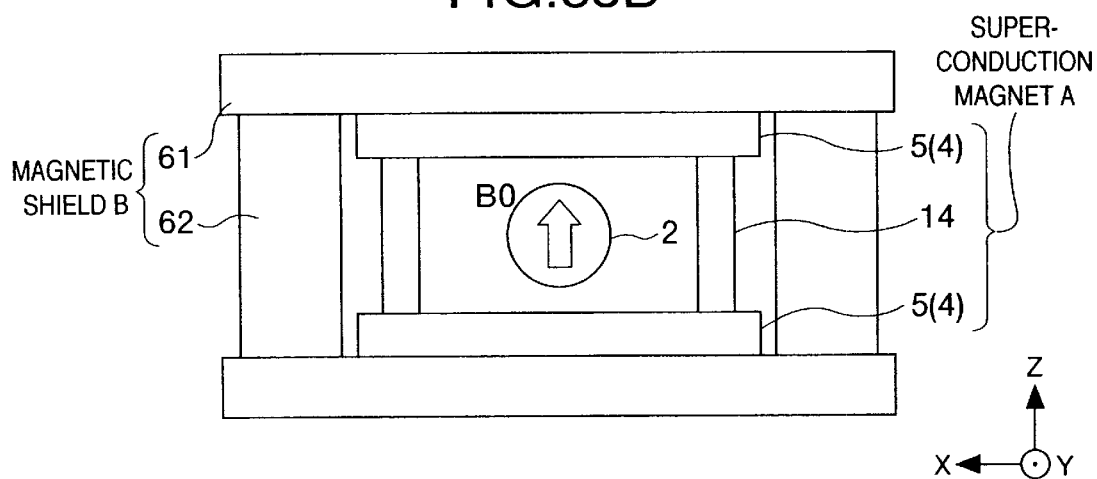
Figure 39:
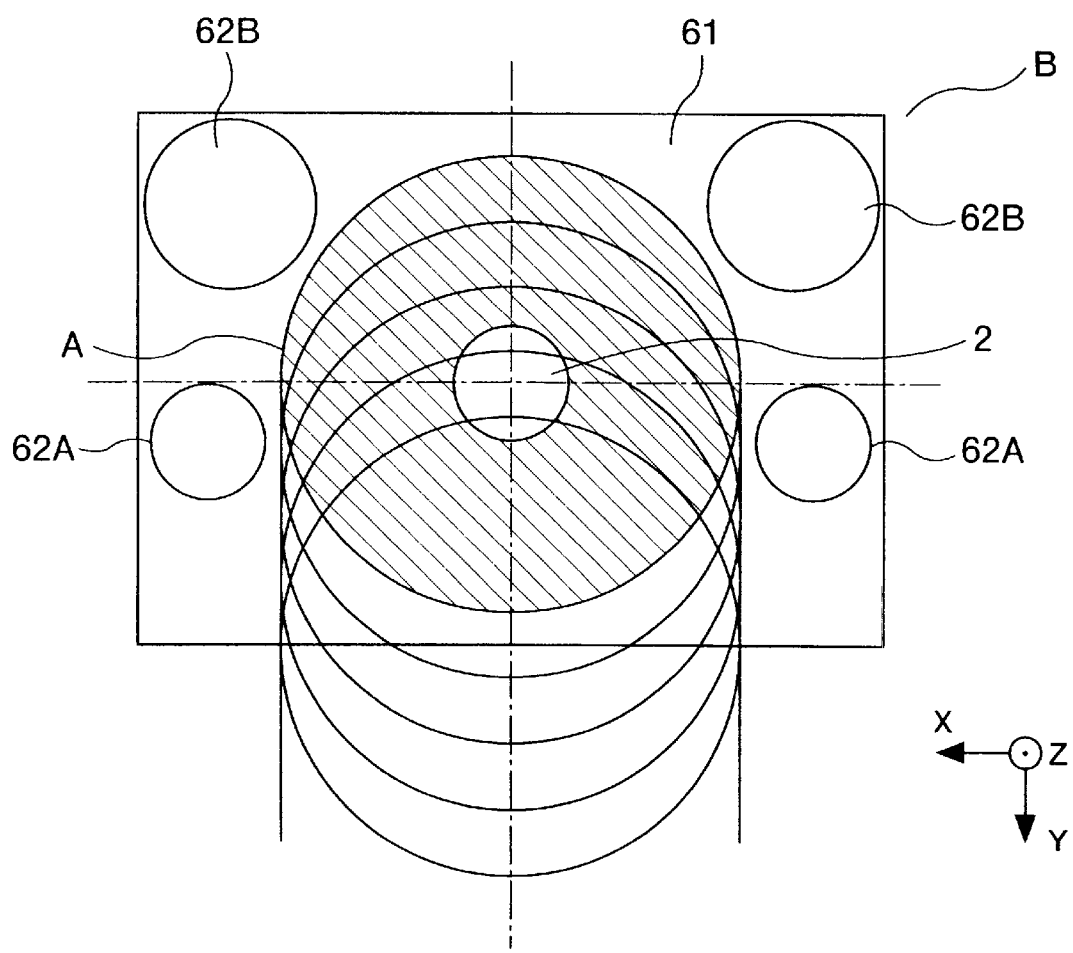
FIG. 39 is a diagram showing an example obtained by modifying a part of the embodiment of FIG. 38.

An embodiment of the present invention is shown in FIGS. 38A, 38B and 39. FIG. 38A is a top view showing how the superconducting magnets are carried in. FIG. 38B is a front view of FIG. 38A.

A superconducting magnet apparatus of the present embodiment includes a superconducting magnet A, and a magnetic shield B for suppressing the spread of the leakage magnetic field distributed outside the periphery of the superconducting magnet A. The superconducting magnet A includes some superconducting coils 4 for generating a homogeneous magnetic field in the measurement space 2 by utilizing the property of superconductivity, cooling vessels 5 for housing the superconducting coils 4 and cooling the superconducting coils 4 to such a temperature that superconducting characteristics are exhibited and maintaining the temperature, and coupling tubes 14 for supporting the cooling vessels 5. The magnetic shield B includes iron plates 61 and iron yokes 62. The magnetic shield B has such a structure that it can be disassembled and after assembling the superconducting magnet A can be inserted through a space located between two iron yokes 62.

Arrangement of the superconducting coils 4 is basically the same as that of the example of the conventional technique. The superconducting coils 4 are installed symmetrically in the vertical direction with a uniform magnetic field generation region (measurement space) 2 located in the center of the apparatus between. The upper and lower cooling vessels 5 housing the superconducting coils 4 are supported by coupling tubes 14 located between them so as to maintain a predetermined distance between them. The coupling tubes 14 function to mechanically support the upper and lower cooling vessels 5. As occasion demands, the coupling tubes 14 may be provided with a function of thermally coupling the upper and lower cooling vessels 5. By doing so, it becomes unnecessary to provide one refrigerator for each of the upper and lower cooling vessels 5, and it becomes possible to make one refrigerator per system do. Furthermore, the number of the coupling tubes 14 is not restricted to two on each side, but the number of the coupling tubes may be one on each side, or may be increased to three, four, and so on.

As for the magnetic shield B, the cooling vessels 5 housing the upper and lower superconducting coils 4 are surrounded by iron plates 61 provided above and below the upper and lower superconducting coils 4, and the upper and lower iron plates 5 are magnetically coupled by iron yokes 62. The iron yokes 62 also function to support the upper and lower iron plates 61. By thus surrounding the peripheries of the superconducting coils 4 serving as the magnetic field generating sources with a ferromagnetic substance (iron in the present embodiment), a magnetic path is formed for the magnetic flux generated outside the superconducting magnet A. It is thus possible to prevent the leakage magnetic field from spreading far away.

As for the ferromagnetic substance used here, use of iron is usually preferable by taking the magnetic characteristics, cost, and mechanical strength into consideration. In the present embodiment, therefore, the iron plates 61 and the iron yokes 62 are used as elements forming the magnetic shield B. So long as ferromagnetism is exhibited magnetically, however, a material other than iron may be selected. In the present invention, the ferromagnetic substance is not limited to iron.

For the ensuing description, a three-dimensional rectangular coordinate system having a central point in a central part of the superconducting magnet A, i.e., in a space for generating a homogeneous magnetic field (measurement space) 2 will now be defined. This coordinate system has its Z axis in the vertical direction, its X axis in the transverse direction of FIG. 38A, and its Y axis in a direction perpendicular to the above described two axes. The subject placed on a table (not illustrated) is typically inserted into the superconducting magnet apparatus along the Y axis direction.

In the present embodiment, the superconducting magnet A is inserted through a space located between two iron yokes 62 along the Y axis. FIGS. 38A and 39 are cross-sectional views of the present embodiment in the measurement space, and show the relation between the superconducting magnet A and the magnetic shield B. In the case of FIG. 38A, the iron yokes 62 of the magnetic shield B are arranged symmetrically. In the case of FIG. 39, the iron yokes 62 are arranged unsymmetrically when the front side is compared with the rear side. In other words, the iron yokes 62 are arranged in symmetric positions of four corners of the rectangular iron plate 61 in the case of FIG. 38A. In FIG. 39, however, iron yokes 62A located on the front side have a thin outside diameter and are disposed near the X axis with a widened space between them. on the other hand, iron yokes 62B located on the rear side have a thick outside diameter and are disposed at a distance from the X axis and with a little narrowed space between them. In FIGS. 38A and 39, the superconducting magnet A is inserted from the front side to the rear side along the Y axis. The locus of the insertion is represented by a chain of a plurality of circles. In the present embodiment, the shortest distance between the two front side iron yokes 62 or 62A forming the magnetic shield B is set larger than the outside diameter of the superconducting magnet A. Therefore, the superconducting magnet A can be easily inserted into the central part of the iron plates 61 through a space located between the two iron yokes 62 or 62A. Furthermore, in the configuration of FIG. 39, the iron yokes 62 are arranged unsymmetrically, and consequently a wide space is obtained on the front side which is an insertion port of the superconducting magnet A.

By disposing the iron yokes 62 of the magnetic shield B as shown in FIG. 38A or FIG. 39, it becomes possible to insert the superconducting magnet A after assembling the magnetic shield B. Therefore, it becomes possible to separately assemble the magnetic shield B and the superconducting magnet A. As for the entire assembly procedure, components obtained by dividing the magnetic shield B are first assembled in a shield room to form the magnetic shield B, and thereafter the superconducting magnet A adjusted in a factory is inserted into the magnetic shield B.

Furthermore, by making in the present embodiment contact faces between the iron plates 61 and the superconducting magnet A planes having no convex portions, it is possible to insert the superconducting magnet A from the transverse direction (Y axis direction) without sacrificing the degree of mutual close adhesion. As a result, the fixing structure of the magnetic shield B and the superconducting magnet A becomes simple, and manufacturing is facilitated. Therefore, the cost is also lowered. Furthermore, making contact faces between the iron plates 61 and the superconducting magnet A planes having no convex portions as in the present embodiment is very effective in lowering the manufacturing cost as well.

Figure 40:
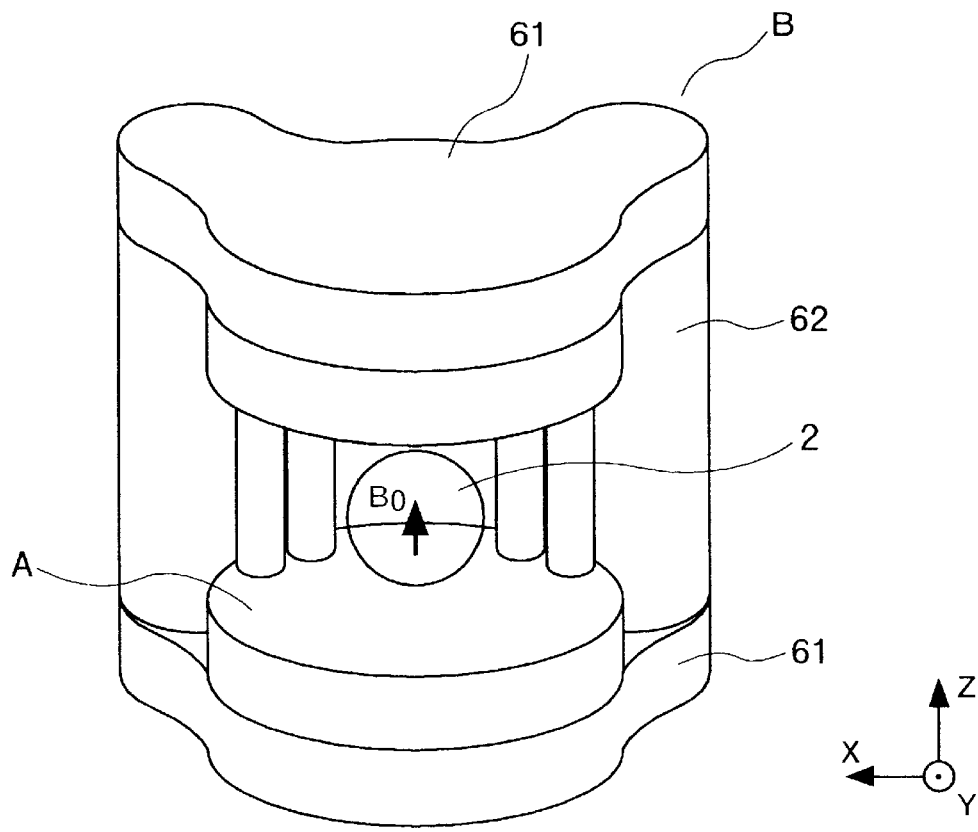
FIG. 40 is an entire oblique view of another embodiment of a static magnetic field generating apparatus according to the present invention.
Figure 41:
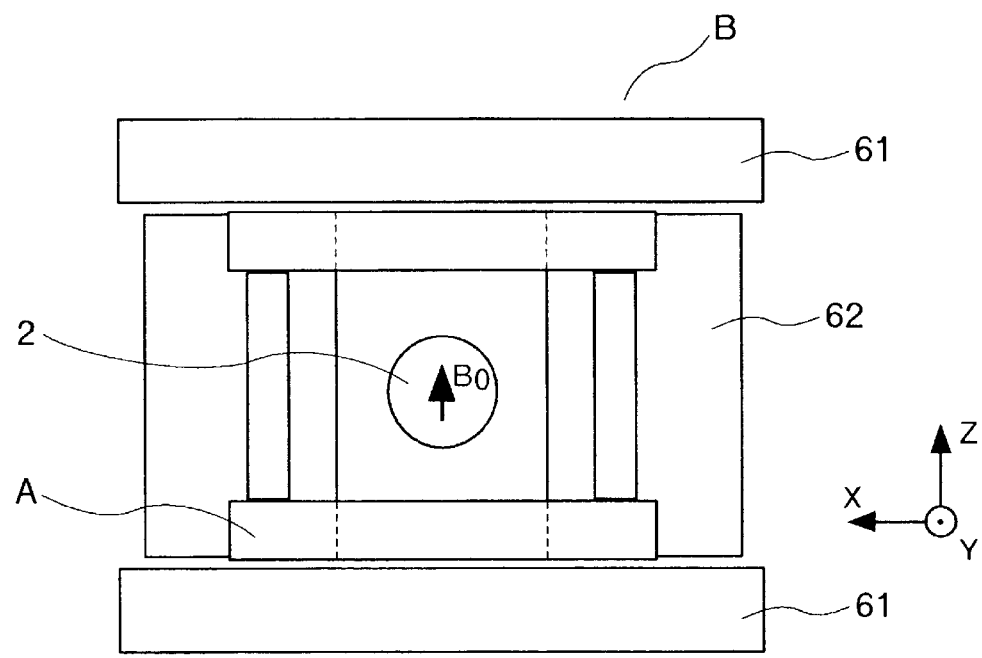
FIG. 41 is a front view of the embodiment of FIG. 40.
Figure 42:
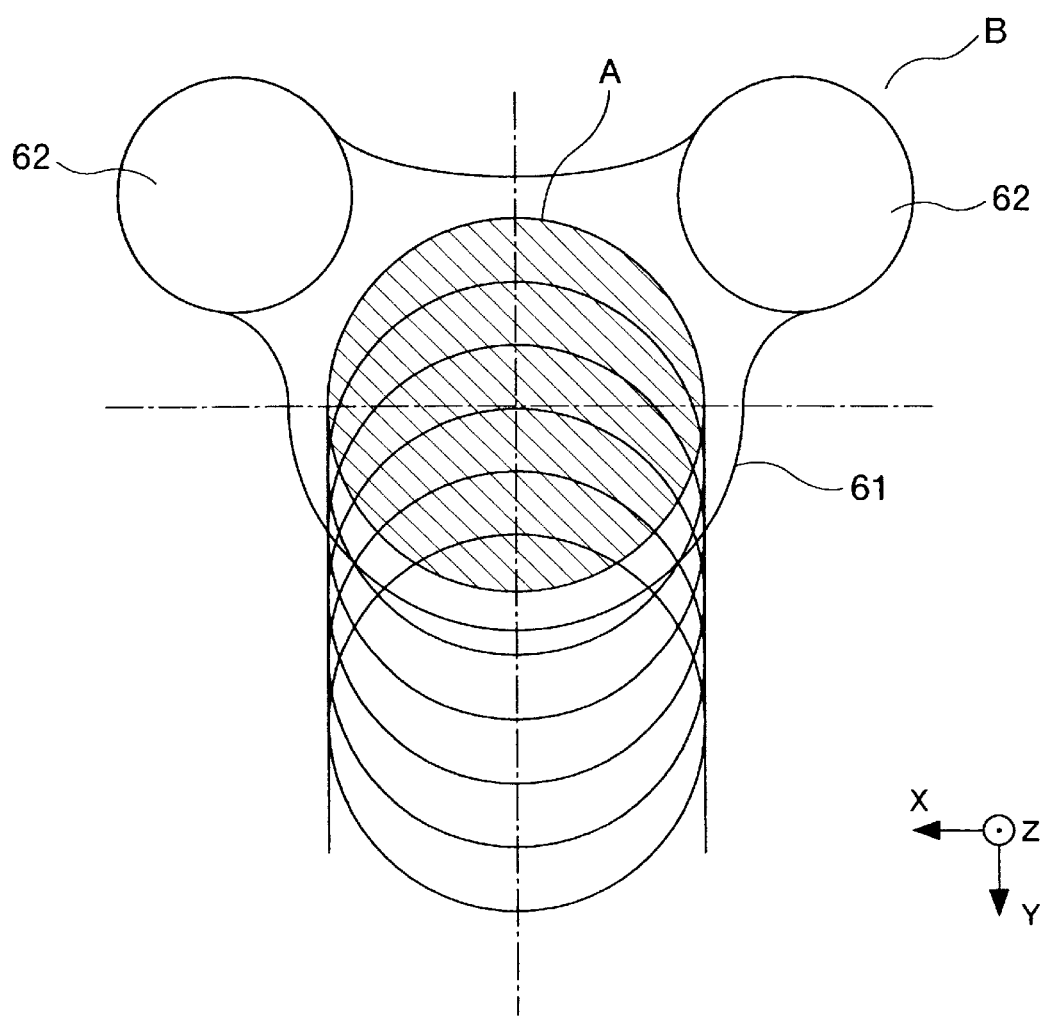
FIG. 42 is a diagram showing insertion of a superconducting magnet into a magnetic shield of the embodiment of FIG. 40.

Another embodiment of the present invention is shown in FIGS. 40 through 42. FIG. 40 is an entire oblique view. FIG. 41 is a front view. FIG. 42 is a diagram showing insertion of the superconducting magnet A into the magnetic shield B. In this embodiment, two iron yokes 62 are provided, and the two iron yokes 62 are disposed on the rear side with respect to the central axis (Z axis) of the measurement space 2 in the vertical direction. In this configuration, the shape of the iron plate 61 also becomes unsymmetrical when the front side is compared with the rear side, and the magnetic shield B is open in the front. In the present embodiment, there is no iron yoke 62 on the insertion locus serving as the passage for inserting the superconducting magnet A as shown in FIG. 42. Therefore, there are no obstacles at all to insertion of the superconducting magnet A into the magnetic shield B. Insertion of the superconducting magnet A into the magnetic shield B thus becomes very easy. Furthermore, the subject accommodated in the measurement space 2 is provided with great feeling of openness. In addition, access to the subject from the side at the time of inspection is also facilitated. At the time of the apparatus assembling on the spot, therefore, favorable work efficiency is obtained. As a result, the work of inserting the superconducting magnet A which is weak in strength into the magnetic shield B becomes safer and more sure. In other words, the efficiency in the on-the-spot work can be improved.

Figure 43:
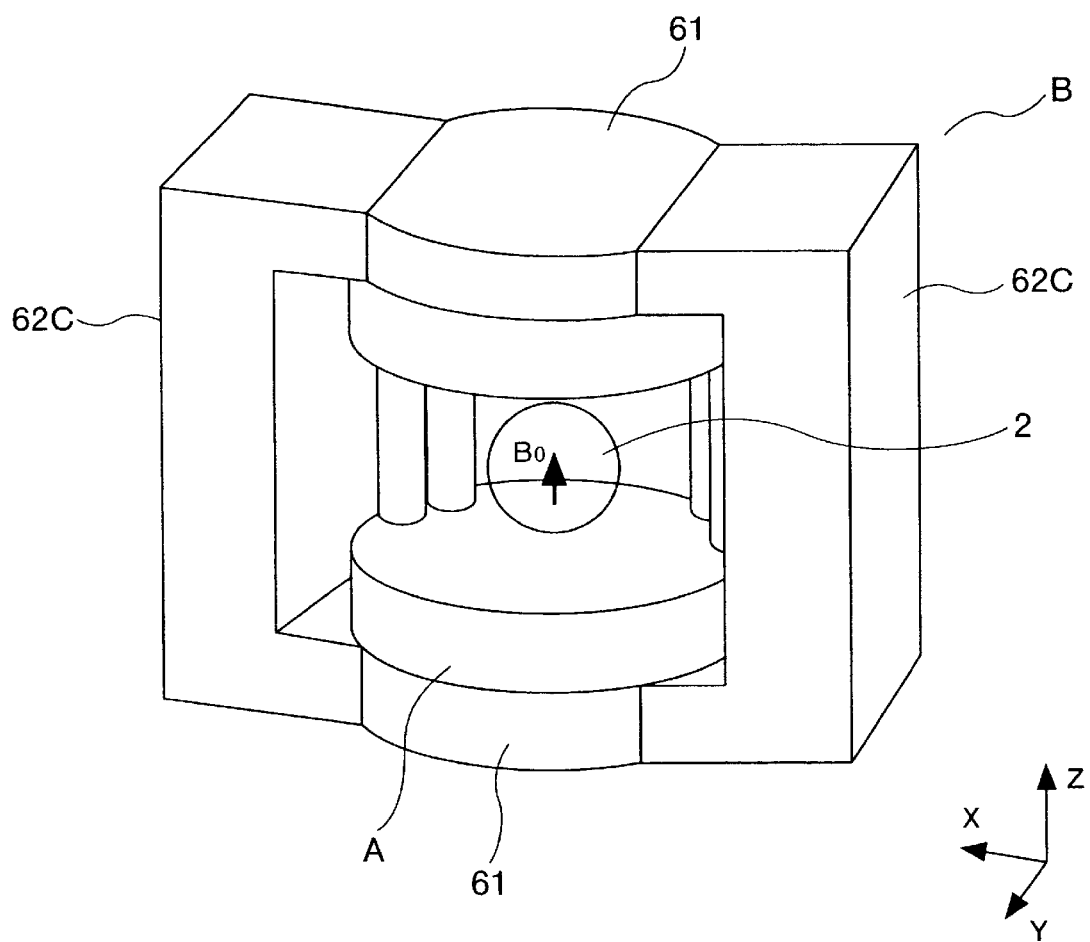
FIG. 43 is an entire oblique view of another embodiment of a static magnetic field generating apparatus according to the present invention.
Figure 44:
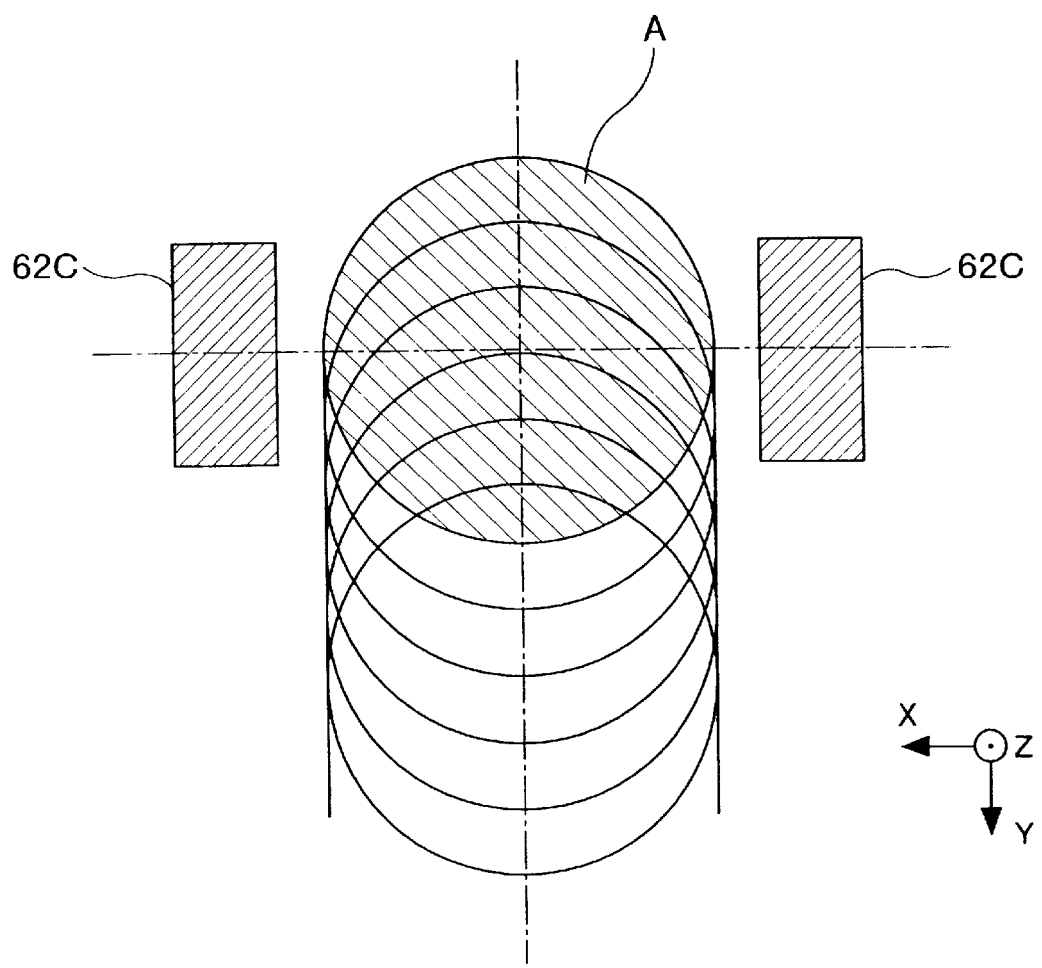
FIG. 44 is a diagram showing insertion of a superconducting magnet into a magnetic shield of the embodiment of FIG. 43.

Another embodiment of the present invention is shown in FIGS. 43 and 44. FIG. 43 is an entire oblique view. FIG. 44 is a diagram showing insertion of the superconducting magnet A into the magnetic shield B. In the present embodiment, the entire apparatus has a structure which is symmetrical when the front side is compared with the rear side. The magnetic shield B is formed by iron plates 61 disposed above and below the measurement space 2, and ⊃-shaped iron yokes 62C supporting the iron plates 61 and magnetically coupled to the iron plates 61. Each of the iron yokes 62C has a rectangular section. The space between the two iron yokes 62C has such a dimension that the superconducting magnet A can be inserted therein. By thus configuring the magnetic shield B, the superconducting magnet A can be easily inserted into the magnetic shield B from the Y axis direction. Furthermore, by disposing the iron yokes 62C so as to be symmetrical when the front side is compared with the rear side, the homogeneous magnetic field generating region corresponding to the measurement space 2 also becomes symmetrical when the front side is compared with the rear side, and consequently the magnetic field distribution can be easily corrected. Furthermore, by using the iron yokes 62C each having a section formed by a combination of straight lines, manufacturing precision can be improved. In divisional carrying in and assembling of the magnetic shield B, therefore, assembling with high precision can be conducted.

In the foregoing description of the embodiment of the present invention, cylindrical or square iron yokes 62 have been exemplified. In the present invention, however, the shape of the iron yokes is not limited to them, but it may be a rectangle, an ellipse, or a polygon. Furthermore, the sectional shape of the iron yokes 62 may be different according to the position in the Z axis direction. For example, by changing the section dimension of the corresponding portion of each of the iron yokes 62 or changing the disposition of the iron yokes 62 according to the width dimension of each portion of the superconducting magnet A, the superconducting magnet A can be easily inserted after the magnetic shield B has been assembled.

In the embodiments of FIGS. 38A, 40 and 43, the number of iron yokes 62 is two or four. In the present invention, however, the number of iron yokes 62 is not limited to this, but it may be three or five or more. In the case where there are three or more iron yokes 62, however, the shortest distance between two iron yokes 62 disposed on both sides of the portion for inserting the superconducting magnet A needs to be larger than the maximum diameter of the superconducting magnet A so that the superconducting magnet A may be inserted into the magnetic shield B. Owing to such disposition of the iron yokes 62, the superconducting magnet A can be inserted smoothly after the magnetic shield B has been assembled.

Figure 45:
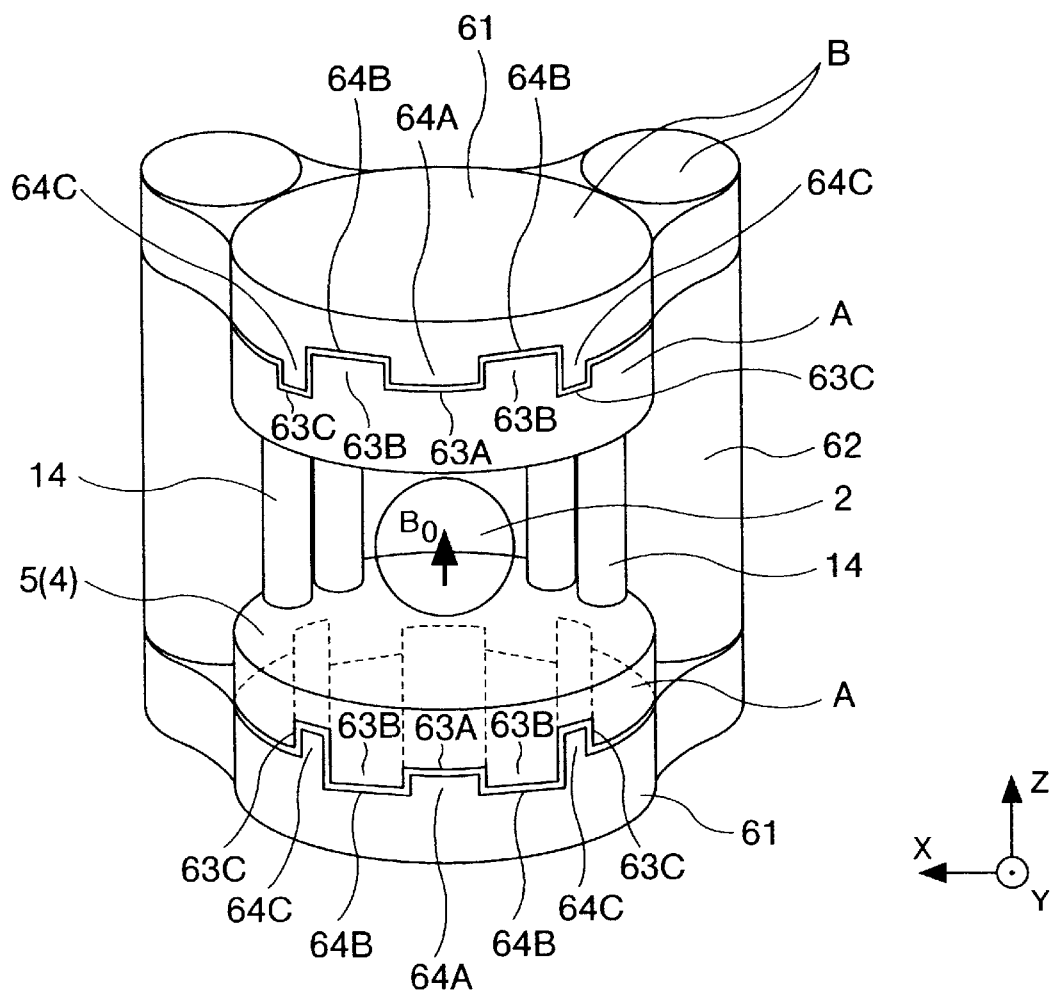
FIG. 45 is an entire oblique view of another embodiment of a static magnetic field generating apparatus according to the present invention.
Figure 46:
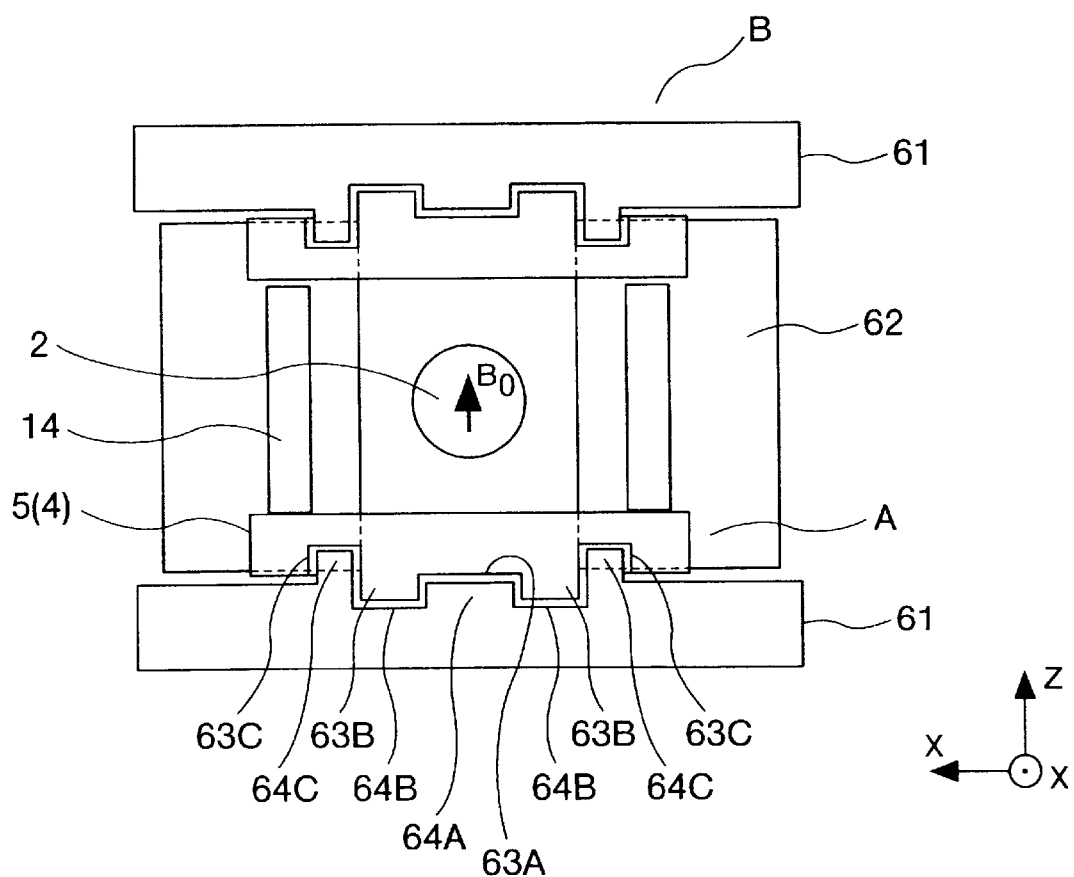
FIG. 46 is a front view of the embodiment of FIG. 45.

Another embodiment of the present invention is shown in FIGS. 45 and 46. FIG. 45 is an entire oblique view. FIG. 46 is a front view. In the present embodiment, fitting portions having such section shapes as to fit into each other are formed, in the contact faces of the superconducting magnet A and the magnetic shield B, i.e., in the top face of the superconducting magnet A and the bottom face of the upper iron plate 61 contacting each other, and in the bottom face of the superconducting magnet A and the top face of the lower iron plate 61 contacting each other. Thereby, the superconducting magnet A can be inserted into the magnetic shield B in a direction perpendicular to the above described section of fitting by using the fitting portions as a guide, while adhering the magnetic shield B and the superconducting magnet A closely to each other. In FIGS. 45 and 46, there is shown an example of the case where two iron yokes 62 are disposed so as to be unsymmetrical when the front side is compared with the rear side. However, the present embodiment can be applied to the cases of other arrangements of the iron yokes 62 as well in the same way. In FIG. 45, the superconducting magnet A can be inserted in the Y axis direction. Therefore, the sections fitting into each other are formed along the X axis direction. In faces of the cooling vessels 5 of the superconducting magnet A and the iron plates 61 of the magnetic shield B contacting each other, convex/concave faces 63A, 63B and 63C and convex/concave faces 64A, 64B and 64C are formed, respectively. And corresponding convex face portions and concave face portions are fitted. In FIG. 45, five fitting convex/concave face portions are provided for each of the upper and lower fitting. However, at least one fitting convex/concave face portion may be provided for each of the upper and lower fitting. Furthermore, the shape of the convex/concave faces is not limited to the illustrated rectangular shape, but it may be triangular or semicircular. These convex/concave faces need only fit closely in each other and function as the guide at the time of insertion of the superconducting magnet A.

By forming contacting faces of the superconducting magnet A and the magnetic shield B as heretofore described, the direction of insertion of the superconducting magnet A into the magnetic shield B is limited to one direction (the Y axis direction in FIG. 45). In other words, the superconducting magnet A can be inserted in one direction certainly, and it can be inserted in a target position located in the magnetic shield B easily and certainly.

Figure 47A:
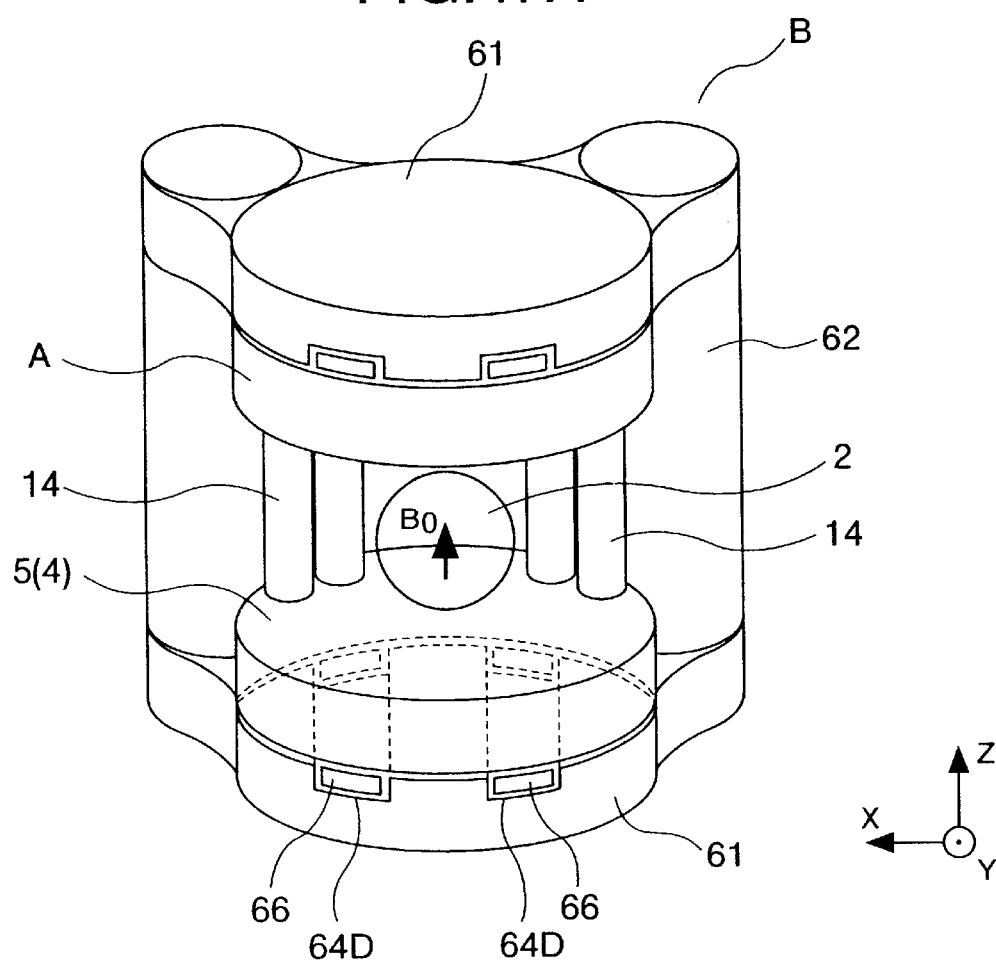
FIG. 47A is an entire oblique view of another embodiment of a static magnetic field generating apparatus according to the present invention.
Figure 47B:
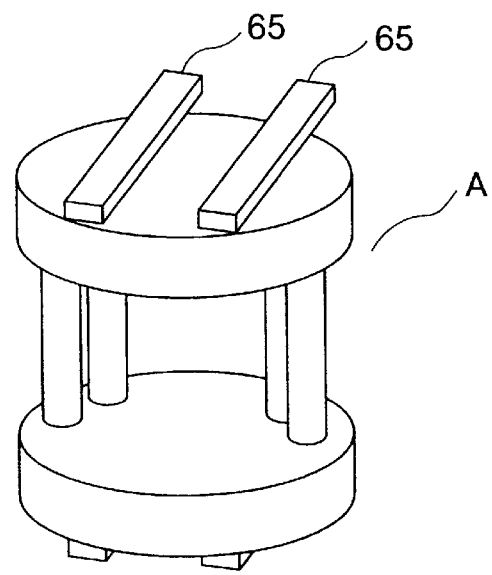
FIG. 47B is a diagram showing a guide of the embodiment of FIG. 47A.
Figure 48:
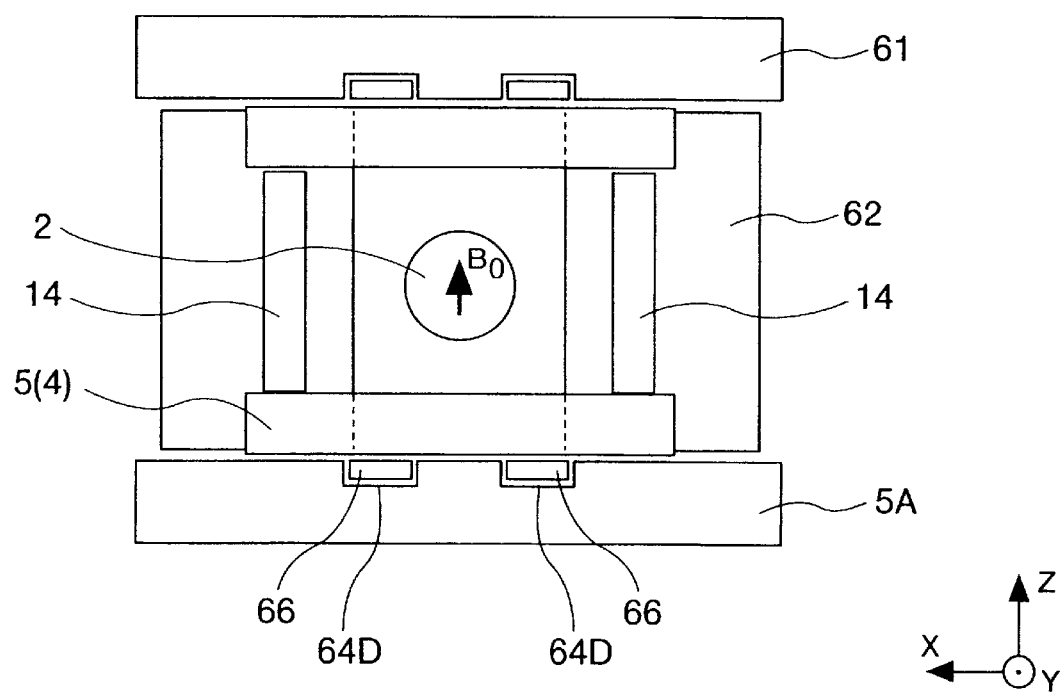
FIG. 48 is a front view of the embodiment of FIG. 47A.

Another embodiment of the present invention is shown in FIGS. 47A, 47B and 48. FIG. 47A is an entire oblique view. FIG. 48 is a front view. In the present embodiment, such gaps as to be capable of inserting square-pillar-shaped solid substances therein are provided in portions of contact faces of the superconducting magnet A and the magnetic shield B. These gaps are used as the guide when inserting the superconducting magnet A into the magnetic shield B. After the superconducting magnet A is inserted, square-pillar-shaped solid substances are inserted into the gaps to improve the close adherence between the superconducting magnet A and the magnetic shield A. In FIG. 47A, square shaped grooves 64D are provided in portions of the iron plate 61 of the magnetic shield B contacting the cooling vessel 5 of the superconducting magnet A. When inserting the superconducting magnet A into the magnetic shield B, square shaped rods 65 attached to such portions of the contact face of the cooling vessel 5 as to be opposed to the grooves 64D fit in the square shaped grooves 64D and function as the guide for insertion of the superconducting magnet A. The square shaped rods 65 are mountable and detachable. In FIG. 47A, the grooves 64D are provided only on the iron plates 61. However, the grooves may be provided only on the faces of the opposed cooling vessels 5, or may be provided on both the iron plate 31 and the cooling vessel 5. At this time, the square shaped rods 65 may be provided on the iron plate 61. After the superconducting magnet A has been inserted, the square shaped rods are removed, then square-pillar-shaped solid substances 66 are inserted into the grooves 64D and embedded to improve the close adherence between the superconducting magnet A and the magnetic shield B.

In the present embodiment, the substances filling up the gaps of the grooves 64D are not restricted to the pillar-shaped solid substances, but solid substances having a shape suitable for insertion into the gaps or a liquid substance such as a bonding agent may also be used. If at this time it is desired to make the substances inserted into the gaps a part of the magnetic shield, then the same material as the magnetic shield B, or a material exhibiting magnetic characteristics close to those of the magnetic shield B is desirable. Furthermore, by inserting a structural member obtained by a combination of a non-magnetic substance and a ferromagnetic substance into the grooves 64D, the magnetic characteristics of the magnetic shield B can be corrected. In order to increase the magnetic field homogeneity of the measurement space 2, therefore, the grooves 64D can be utilized actively.

Figure 49:
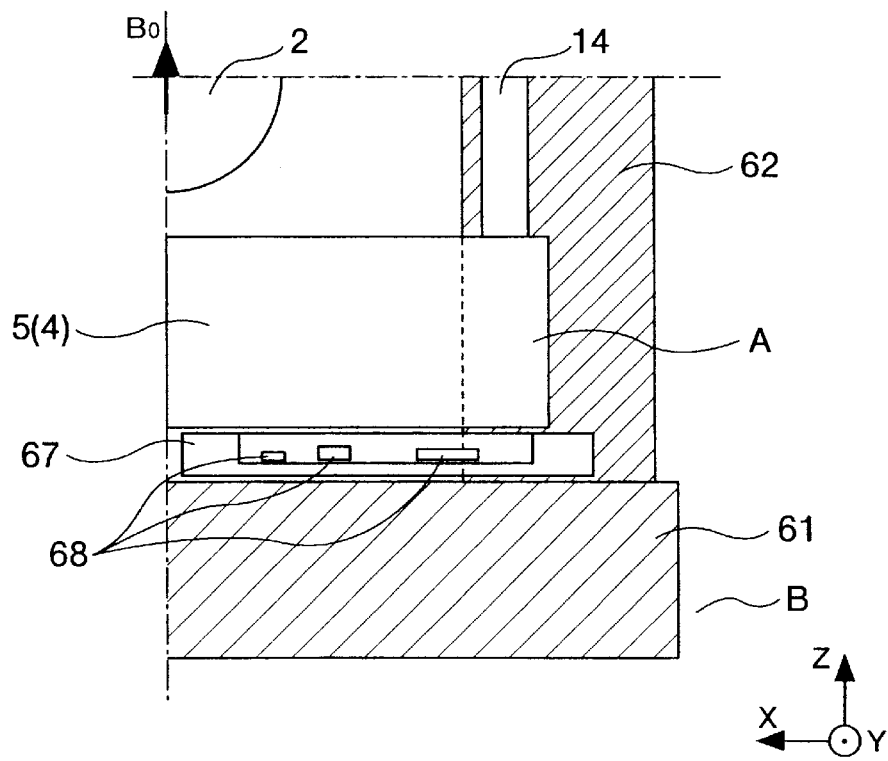
FIG. 49 is a diagram showing a lower right portion of a longitudinal section view of another embodiment of a static magnetic field generating apparatus according to the present invention.

In FIG. 49, there is shown another embodiment of the present invention using the gap provided in portions of contact faces of the superconducting magnet A and the magnetic shield B in order to correct the magnetic characteristics of the magnetic shield. FIG. 49 shows a right bottom portion of a longitudinal section view of the present embodiment. In the present embodiment, a disk shaped or cylindrical non-magnetic substance 67 is inserted into a gap portion between the superconducting magnet A and the magnetic shield B. The non-magnetic substance 67 has a thickness nearly equivalent to that of the gap portion. In the non-magnetic substance 67, some ferromagnetic substances 68 are disposed in the non-magnetic substance 67 so as to be suitably distributed. Thereby, the magnetic field homogeneity of the measurement space 2 is corrected.

In the embodiment of FIGS. 47A and 47B and the embodiment of FIG. 49, suitable gap portions are provided in contact portions of the superconducting magnet A and the magnetic shield B, and a non-magnetic substance with a ferromagnetic substance added is inserted into each of the gap portions to adjust the magnetic field homogeneity of the measurement space 2. In the embodiments respectively of FIGS. 38A, 40, and 43 as well, there might be a gap in the contact portion of the superconducting magnet A and the magnetic shield B after the superconducting magnet A has been inserted into the magnetic shield B. In such a case, a non-magnetic substance or a non-magnetic substance (a solid or liquid) with a ferromagnetic substance added can be embedded.

Figure 50:
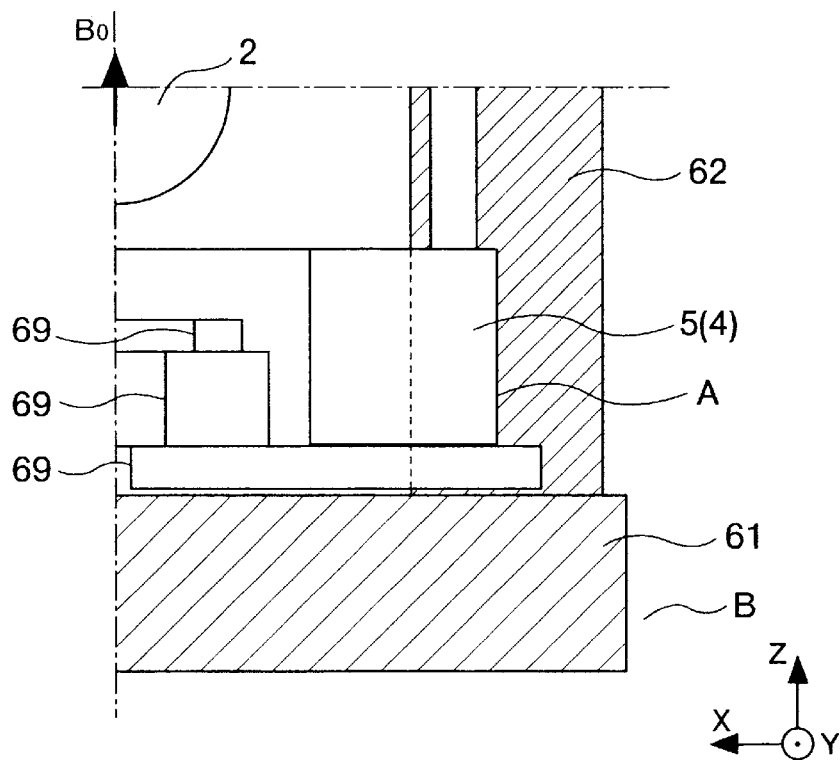
FIG. 50 is a diagram showing a lower right portion of a longitudinal section view of another embodiment of a static magnetic field generating apparatus according to the present invention.

Another embodiment of the present invention is shown in FIG. 50. FIG. 50 shows a right bottom portion of a longitudinal section view. In the present embodiment, magnetic field distribution correcting ferromagnetic pieces 69 are integrally fixed to the superconducting magnet A. Also in the case where the superconducting magnet A is inserted into the magnetic shield B, therefore, the magnetic field distribution correcting ferromagnetic pieces 69 are inserted integrally with the superconducting magnet A. As a result, the superconducting magnet A and the magnetic field distribution correcting ferromagnetic pieces 69 can be inserted into the magnetic shield B while maintaining the relative position set at the time of assembling.

By using this method, the labor for incorporating the superconducting magnet A and the magnetic field distribution correcting ferromagnetic pieces 69 can be reduced. In addition, since producing the magnetic field distribution correcting ferromagnetic pieces 69 together with the superconducting magnet A, adding the magnetic field distribution correcting ferromagnetic pieces 69 to the superconducting magnet A, and effecting their adjustment can be carried out in the factory, the on-the-spot adjustment is minimized and the labor required for the adjustment can also be reduced.

Figure 51:
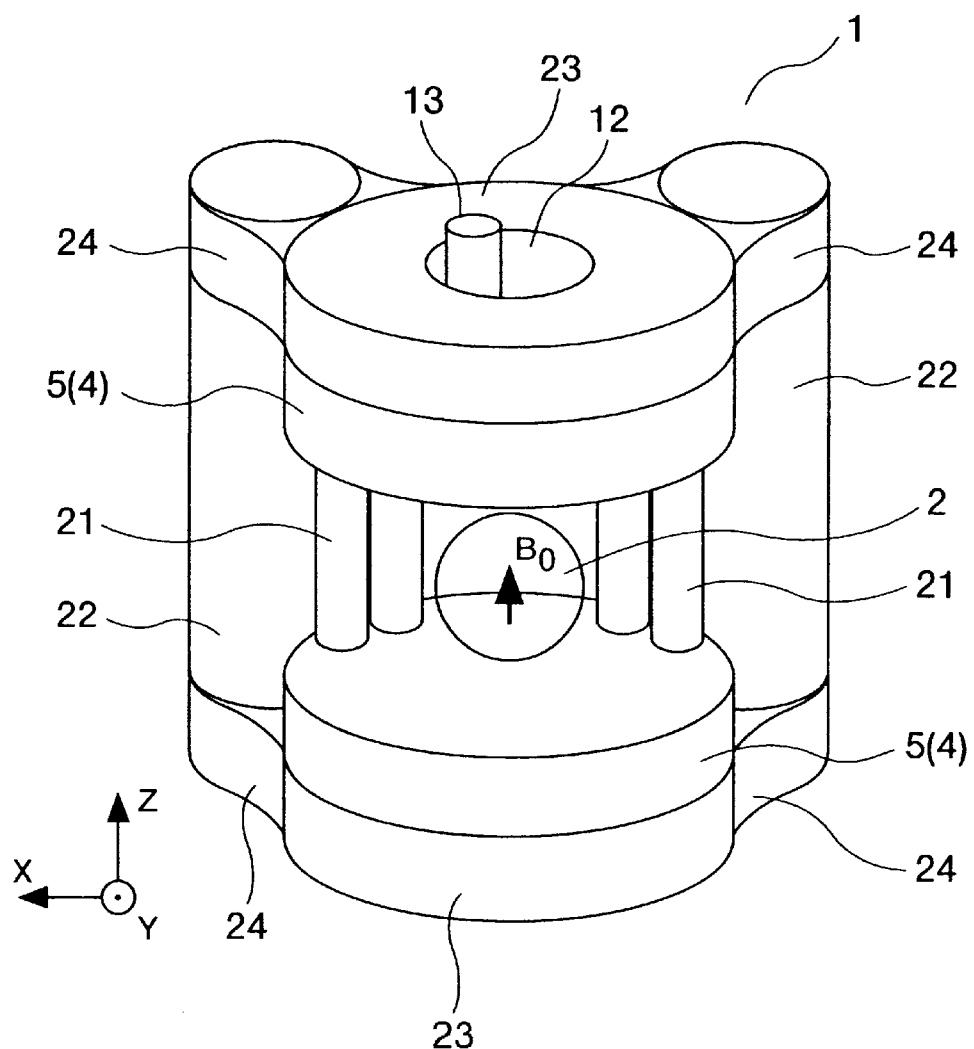
FIG. 51 is a diagram showing another embodiment of a static magnetic field generating apparatus according to the present invention.

FIG. 51 shows an embodiment obtained by combining the embodiment of FIGS. 1–20A and 20B forming one or more holes in a portion of the magnetic shield perpendicular to the static magnetic field direction in order to generate a homogeneous static magnetic field, an embodiment of FIGS. 27–37 facilitating the access to the subject, and the embodiment of FIGS. 38A and 38B–50 facilitating carrying in and installing the superconducting magnet. As a matter of course, two of these embodiments may be combined.

The present invention is not limited to the disclosed embodiments, but includes various variations incorporated in the spirit of claims.

INDUSTRIAL APPLICABILITY

As heretofore described, the present invention is capable of providing a static magnetic field generating apparatus capable of generating a homogeneous static magnetic field, facilitating the access to the subject, and facilitating carrying the apparatus into a hospital and its installation, by forming suitable holes through the magnetic shield substance. Therefore, the present invention can be applied to static magnetic field generating apparatuses of MRI apparatuses.

What is claimed is:

1. A superconducting magnet apparatus including static magnetic field generating sources for letting flow a current to generate a homogeneous magnetic field of a vertical direction in a finite region, each of said static magnetic field generating sources being formed by a material having superconducting characteristics, cooling means for cooling said static magnetic field generating sources to such a temperature that superconducting characteristics are exhibited and keeping said static magnetic field generating sources at the temperature, and support means for supporting said static magnetic field generating sources, wherein said static magnetic field generating sources are formed by two sets of magnetic field generating means having substantially a same shape disposed in positions located at substantially equal distances from a center of said homogeneous magnetic field generation region along the vertical direction with said homogeneous magnetic field generation region between, characterized in that the superconducting magnet apparatus has first and second regions separated by a first plane which extends in parallel to a direction of said static magnetic field and extends through a center of said homogeneous magnetic field, said support means being located in said first region, said first region being divided into third and fourth regions by a second plane of symmetry which extends in parallel to said direction of said static magnetic field and extends perpendicular to said first plane without passing through said support means, at least one of said support means being located in each of said third and fourth regions at positions opposite to each other with respect to said second plane, said support means in said third and fourth regions being sufficiently spaced from each other so as to delimit an open space therebetween and to enable an object to be inspected to be passed therebetween through the open space at least one of along said second plane of symmetry and at an angle with respect to said second plane of symmetry from outside of said first region to outside of said second region through said first region, the center of said homogeneous magnetic field and said second region or from outside of said second region to outside of said first region through said second region, the center of said homogeneous magnetic field and said first region.

2. A superconducting magnet apparatus according to claim 1, characterized in that a shortest distance between said support means located in said third and fourth regions respectively is at least 600 mm.

3. A magnetic resonance imaging apparatus comprising a static magnetic generating apparatus using a superconducting magnet apparatus according to claim 1 or claim 2.

4. A superconducting magnet apparatus according to claim 1, wherein said support means are in contact with at least facing planes of each of said two sets of said magnetic field generating means and support at least one of said two sets of said magnetic field generating means.

5. A superconducting magnet apparatus, including static magnetic field generating sources for letting flow a current to generate a homogeneous magnetic field of a vertical direction in a finite region, each of said static magnetic field generating sources being formed by a material having superconducting characteristics, cooling means for cooling said static magnetic field generating sources to such a temperature that superconducting characteristics are exhibited and keeping said static magnetic field generating sources at the temperature, and support means for supporting said static magnetic field generating sources, wherein said static magnetic field generating sources are formed by two sets of magnetic field generating means having substantially a same shape disposed in positions located at substantially equal distances from a center of said homogeneous magnetic field generation region along the vertical direction with said homogeneous magnetic field generation region between, characterized in that at least two members of said support means are disposed at positions opposite to each other with respect to a plane extending along a central axis of the vertical direction which extends through said center of said homogeneous magnetic field generation region, and that end portions of said at least two members of said support means are disposed at a side of facing planes of said static magnetic field generating sources which are opposite to each other and characterized in that superconducting magnet apparatus comprises first ferromagnetic substances respectively surrounding peripheries of said magnetic field generating means, and second ferromagnetic substances for magnetically connecting said first ferromagnetic substances, said second ferromagnetic substances having both ends located in substantially same positions as those of said first ferromagnetic substances, and said second ferromagnetic substances are disposed so as to be located on the rear side with respect to said central axis of the vertical direction together with said support means.

6. A superconducting magnet apparatus according to claim 5, characterized in that said support means have a nearly circular section shape, and said support means are disposed so that at least one member of said support means will be present on each of left and right sides with respect to said central axis of the vertical direction.

7. A superconducting magnet apparatus according to claim 5, characterized in that said support means are disposed so that two or more member of said support means will be located on each of left and right sides with respect to said central axis of the vertical direction, and a distance between support means included in said support means and disposed on a rear side with respect to said central axis is shorter than a distance between support means included in said support means and disposed on a front side with respect to said central axis.

8. A superconducting magnet apparatus according to claim 5, characterized in that said support means have a nearly rectangular or elliptical section shape, and said support means are disposed so that at least one member of said support means will be present on each of left and right sides with respect to said central axis of the vertical direction.

9. A superconducting magnet apparatus according to claim 5, characterized in that a viewing angle viewing said support means when viewed from said central axis of the vertical direction is smaller than a viewing angle viewing said second ferromagnetic substances when viewed from said central axis of the vertical direction.

10. A superconducting magnet apparatus according to claim 9, characterized in that a viewing angle viewing the support means located on the left side or the right side as a whole when viewed from said central axis of a vertical direction is 60 degrees or less.

11. A superconducting magnet apparatus according to claim 5, characterized in that faces of said second ferromagnetic substances opposed to said support means are formed so as to be substantially flat.

12. A superconducting magnet apparatus according to claim 11, characterized in that the flat face of each of said second ferromagnetic substances is nearly perpendicular to a line coupling said central axis of the vertical direction to a central axis of said second ferromagnetic substance.

13. A superconducting magnet apparatus according to claim 11, characterized in that at least one auxiliary iron member is added to the flat faces formed on said second ferromagnetic substances.

14. A superconducting magnet apparatus according to claim 5, characterized in that said support means and said second ferromagnetic substances are disposed so that a line touching at one point with a front face of a support means located in most front side among said support means disposed on a left side and on a right side with respect to said central axis of the vertical direction is located in a position in accordance with or more rear than a line touching at one point with a periphery of a second ferromagnetic substance located in most front side among said ferromagnetic substances disposed in a same way.

15. A superconducting magnet apparatus according to claim 5, characterized in that two faces of peripheral faces of said second ferromagnetic substances are formed so as to be nearly parallel to two tangential lines drawn from said central axis of the vertical direction to said peripheral faces of said second ferromagnetic substances.

16. A superconducting magnet apparatus according to claim 5, characterized in that covers each containing said support means and said second ferromagnetic substance are provided.

17. A superconducting magnet apparatus including static magnetic field generating sources for letting flow a current to generate a homogeneous magnetic field of a vertical direction in a finite region, each of said static magnetic field generating sources being formed by a material having superconducting characteristics, cooling means for cooling said static magnetic field generating sources to such a temperature that superconducting characteristics are exhibited and keeping said static magnetic field generating sources at the temperature, and support means for supporting said static magnetic field generating sources, wherein said static magnetic field generating sources are formed by two sets of magnetic field generating means having substantially a same shape disposed in positions located at substantially equal distances from a center of said homogeneous magnetic field generation region along the vertical direction with said homogeneous magnetic field generation region between, characterized in that at least two members of said support means are disposed at positions opposite to each other with respect to a plane extending along a central axis of the vertical direction which extends through said center of said homogeneous magnetic field generation region, and that end portions of said at least two members of said support means are disposed at a side of facing planes of said static magnetic field generating sources which are opposite to each other, characterized in that superconducting magnet apparatus comprises first ferromagnetic substances respectively surrounding peripheries of said magnetic field generating means, and second ferromagnetic substances for magnetically connecting said first ferromagnetic substances, said second ferromagnetic substances having both ends located in substantially same positions as those of said first ferromagnetic substances, and said second ferromagnetic substances are disposed so as to be located on the rear side with respect to said central axis of the vertical direction together with said support means, and characterized in that a line passing through a center of said support means in the vertical direction passes through said second ferromagnetic substances.

18. A magnetic resonance imaging apparatus using a superconducting magnet apparatus according to any one of claims 5–8 and 17.

19. A superconducting magnet apparatus comprising:
one pair of superconducting coil means disposed at a predetermined distance so as to have a measurement space between them;
magnetic shield means for converging magnetic flux generated by said superconducting coil means, said magnetic shield means including one or more holes in a portion extending substantially perpendicular to a direction of a static magnetic field generated by said superconducting coil means, said magnetic shield means having at least one opening portion wider than said superconducting coil means in a side face direction; and
means disposed on a side of said measurement space to support said superconducting coil means;
wherein a predetermined homogeneity of a magnetic field is determined by a position, size and shape of a respective hole.

20. A superconducting magnet apparatus according to claim 19, wherein said supporting means is disposed on a rear side with respect to a central axis (Z axis) of a vertical direction of said measurement space.

21. A superconducting magnet apparatus comprising:
one pair of superconducting coil means disposed at a predetermined distance so as to have a measurement space between them;
magnetic shield means for converging magnetic flux generated by said superconducting coil means, said magnetic shield means including one or more holes in a portion extending substantially perpendicular to a direction of a static magnetic field generated by said superconducting coil means; and
means disposed on a rear side with respect to a central axis (Z axis) of said measurement space of a vertical direction to support said superconducting coil means;
wherein a predetermined homogeneity of a magnetic field is determined by a position, size and shape of a respective hole.

22. A superconducting magnet apparatus according to claim 21, wherein said magnetic shield means comprises at least one opening portion wider than said superconducting coil means in a side face direction.

23. A superconducting magnetic apparatus comprising:
one pair of superconducting coil means disposed at a predetermined distance between so as to have a measurement space sandwiched between them;
magnetic shield means for converging magnetic flux generated by said superconducting coil means, said magnetic shield means having at least one opening portion wider than said superconducting coil means in a side face direction; and
at least two separate supporting means for supporting said superconducting coil means, end portions of said supporting means being disposed at a side of facing planes of said superconducting coil means which are opposite to each other, said supporting means being sufficiently spaced from one another so as to delimit an open space therebetween and to enable an object to be inspected to be passed therebetween at least one of along a plane of symmetry and at an angle with respect to said plane of symmetry which extends without passing through said supporting means through a center of said static magnetic field region from a front side outside of said static magnetic field region to a rear side outside of said static magnetic field region through the open space from the front side outside of said static magnetic field region to the rear side outside of said static magnetic field region through the center of said static magnetic field region or from the rear side outside of the static magnetic field region to the front side outside of said static magnetic field region through said center of said static magnetic field region.

24. A superconducting magnet apparatus according to claim 23, wherein said magnetic shield means comprises one or more holes in a portion nearly perpendicular to a direction of a static magnetic field generated by said superconducting means and wherein a predetermined homogeneity of a magnetic field is determined by a position, size and shape of a respective hole.

25. A superconducting magnet apparatus including static magnetic field generating sources for letting flow a current to generate a homogeneous magnetic field of a vertical direction in a finite region, each of said static magnetic field generating sources being formed by a material having superconducting characteristics, cooling means for cooling said static magnetic field generating sources to such a temperature that superconducting characteristics are exhibited and keeping said static magnetic field generating sources at the temperature, and support means for supporting said static magnetic field generating sources, wherein said static magnetic field generating sources are formed by two sets of magnetic field generating means having substantially a same shape disposed in positions located at substantially equal distances from a center of said homogeneous magnetic field generation region along the vertical direction with said homogeneous magnetic field generation region between, characterized in that the superconducting magnet apparatus has first and second regions separated by a first plane which extends in parallel to a direction of said static magnetic field and extends through a center of said homogeneous magnetic field, said support means being located in said first region, said first region being divided into third and fourth regions by a second plane which extends in parallel to said direction of said static magnetic field and extends perpendicular to said first plane, at least one of said support means being located in each of said third and fourth regions at positions opposite to each other with respect to said second plane, said support means in said third and fourth regions being sufficiently spaced from each other so as to delimit an open space therebetween and to enable an object to be inspected to be passed therebetween through the open space from outside of said first region to outside of said second region through said first region, the center of said homogeneous magnetic field and said second region or from outside of said second region to outside of said first region through said second region, the center of said homogeneous magnetic field and said first region, and first ferromagnetic substances located outside said static magnetic field generating sources and lying in planes which extend perpendicularly to said direction of said static magnetic field, and second ferromagnetic substances lying in planes parallel to said direction of said static magnetic field and spaced from said center of said homogeneous magnetic field at least one said second ferromagnetic substances being located in said third region outside said static magnetic field generating sources and at least another of said second ferromagnetic substances being located in said fourth region outside said static magnetic field generating sources.

26. A superconducting magnet apparatus according to claim 25, further comprising an auxiliary magnetic substance between said first and second ferromagnetic substances.

27. A superconducting magnet apparatus according to claim 25, wherein said second ferromagnetic substances are located on lines connecting said center of said homogeneous magnetic field and centers of gravity of each of said support means.

28. A superconducting magnet apparatus according to claim 25, wherein each of said second ferromagnetic substances has a flat plane extending parallel to said direction of said static magnetic field.

29. A superconducting magnet apparatus according to claim 28, wherein a perpendicular line which is perpendicular to said flat plane of said second ferromagnetic substances intersects said center of said homogeneous magnetic field.

30. A superconducting magnet apparatus according to claim 25, wherein in a direction perpendicular to said direction of said static magnetic field, an angle between tangential lines drawn to said second ferromagnetic substances from said center of said homogeneous magnetic field is larger than an angle between tangential lines drawn to said support means from said center of said homogeneous magnetic field.

31. A superconducting magnet apparatus according to claim 25, wherein in a direction perpendicular to said direction of said static magnetic field, said support means are located between two tangential lines connecting said second ferromagnetic substances, said tangential lines being parallel to said first plane.

* * * * *